(12) United States Patent
Nakagawa et al.

(10) Patent No.: US 10,128,529 B2
(45) Date of Patent: Nov. 13, 2018

(54) LITHIUM-ION SECONDARY BATTERY, FABRICATING METHOD THEROF, AND ELECTRONIC DEVICE

(71) Applicant: SEMICONDUCTOR ENERGY LABORATORY CO., LTD., Atsugi-shi, Kanagawa-ken (JP)

(72) Inventors: Ai Nakagawa, Kanagawa (JP); Teppei Oguni, Kanagawa (JP); Kai Kimura, Kanagawa (JP); Rika Yatabe, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 21 days.

(21) Appl. No.: 15/346,932

(22) Filed: Nov. 9, 2016

(65) Prior Publication Data

US 2017/0141428 A1 May 18, 2017

(30) Foreign Application Priority Data

Nov. 13, 2015 (JP) .................................. 2015-222748

(51) Int. Cl.
*H01M 6/04* (2006.01)
*H01M 10/0525* (2010.01)
(Continued)

(52) U.S. Cl.
CPC ........ *H01M 10/0525* (2013.01); *G01R 31/36* (2013.01); *G01R 31/44* (2013.01);
(Continued)

(58) Field of Classification Search
CPC ......... H01M 10/0525; H01M 10/0422; H01M 10/0567; H01M 10/058; H01M 10/0569;
(Continued)

(56) References Cited

U.S. PATENT DOCUMENTS

2008/0138700 A1* 6/2008 Horpel .................... H01M 2/14
429/129
2013/0164610 A1* 6/2013 Itakura ................ H01M 10/052
429/201
(Continued)

FOREIGN PATENT DOCUMENTS

JP H04-328277 A 11/1992
JP 2010-215512 A 9/2010
(Continued)

OTHER PUBLICATIONS

Shimizu.M et al., "Effect of Cation Structure of Ionic Liquids on Anode Properties of Si Electrodes for LIB", J. Electrochem. SOC. (Journal of the Electrochemical Society), 2014, vol. 161, No. 12, pp. A1765-A1771.
(Continued)

*Primary Examiner* — Jane J Rhee
(74) *Attorney, Agent, or Firm* — Nixon Peabody LLP; Jeffrey L. Costella

(57) ABSTRACT

A lithium-ion secondary battery with a high capacity retention rate is provided. In addition, a fabricating method of a lithium-ion secondary battery with a high capacity retention rate is provided. The lithium-ion secondary battery includes a positive electrode, a negative electrode, and an electrolyte solution. The negative electrode includes a negative electrode active material layer. The electrolyte solution includes at least one of lithium bis(trifluoromethanesulfonyl)amide (LiTFSA) and lithium bis(fluorosulfonyl)amide (LiFSA). The electrolyte solution includes vinylene carbonate (VC). A coating film including lithium oxide is on a surface of the negative electrode active material layer. A fabricating method of a lithium-ion secondary battery includes a first step of enclosing a positive electrode, a negative electrode, and an electrolyte solution in an exterior body, and a second step of annealing the exterior body enclosing the positive
(Continued)

electrode, the negative electrode, and the electrolyte solution for 24 hours or longer after the first step. The annealing in the second step is performed at a temperature higher than or equal to 80° C. and lower than or equal to 100° C.

15 Claims, 32 Drawing Sheets

(51) Int. Cl.
| | |
|---|---|
| H01M 4/133 | (2010.01) |
| H01M 4/136 | (2010.01) |
| H01M 4/36 | (2006.01) |
| H01M 4/58 | (2010.01) |
| H01M 4/587 | (2010.01) |
| H01M 4/66 | (2006.01) |
| H01M 10/04 | (2006.01) |
| H01M 10/0567 | (2010.01) |
| H01M 10/058 | (2010.01) |
| G01R 31/36 | (2006.01) |
| G01R 31/44 | (2006.01) |
| H01M 4/62 | (2006.01) |
| H01M 10/0568 | (2010.01) |
| H01M 10/0569 | (2010.01) |
| H02J 7/00 | (2006.01) |
| H01M 10/42 | (2006.01) |

(52) U.S. Cl.
CPC .......... *H01M 4/133* (2013.01); *H01M 4/136* (2013.01); *H01M 4/366* (2013.01); *H01M 4/587* (2013.01); *H01M 4/5825* (2013.01); *H01M 4/62* (2013.01); *H01M 4/626* (2013.01); *H01M 4/661* (2013.01); *H01M 10/0422* (2013.01); *H01M 10/058* (2013.01); *H01M 10/0567* (2013.01); *H01M 10/0568* (2013.01); *H01M 10/0569* (2013.01); *H02J 7/0014* (2013.01); *H01M 10/0463* (2013.01); *H01M 10/425* (2013.01); *H01M 2010/4271* (2013.01); *H01M 2220/30* (2013.01); *H01M 2300/0025* (2013.01); *H01M 2300/0037* (2013.01)

(58) Field of Classification Search
CPC ........... H01M 10/0463; H01M 10/425; H01M 4/133; H01M 4/136; H01M 4/366; H01M 4/5825; H01M 4/587; H01M 4/661; H01M 4/62; H01M 4/626; H01M 2220/30; H01M 2300/0025; H01M 2300/0037; H01M 2010/4271
See application file for complete search history.

(56) References Cited

U.S. PATENT DOCUMENTS

| | | | |
|---|---|---|---|
| 2015/0140449 | A1 | 5/2015 | Ishikawa et al. |
| 2015/0279577 | A1 | 10/2015 | Uchida et al. |
| 2016/0072132 | A1* | 3/2016 | Liao ................ H01M 4/131 |
| | | | 429/50 |
| 2016/0118637 | A1 | 4/2016 | Narita et al. |

FOREIGN PATENT DOCUMENTS

| | | |
|---|---|---|
| JP | 2011-012033 A | 1/2011 |
| JP | 2013-139425 A | 7/2013 |
| JP | 2013-197061 A | 9/2013 |

OTHER PUBLICATIONS

Ogumi.Z et al., "7.3.5 Additive Agent for Forming Surface Coating Film", Lithium Secondary Battery, Mar. 20, 2008, pp. 161-162, OHMSHA.

* cited by examiner

FIG. 2A
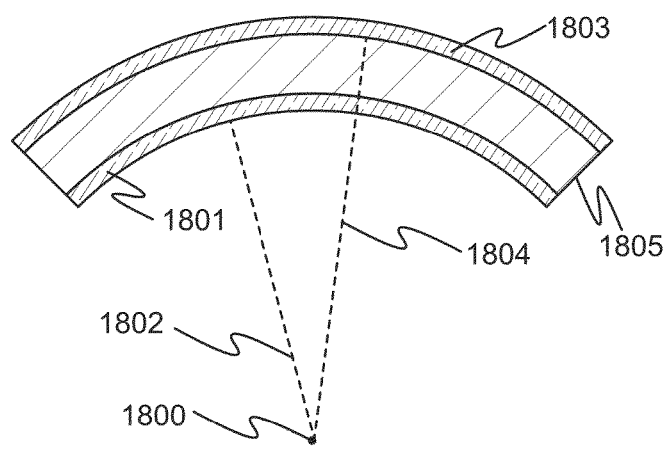
FIG. 2B
FIG. 2C
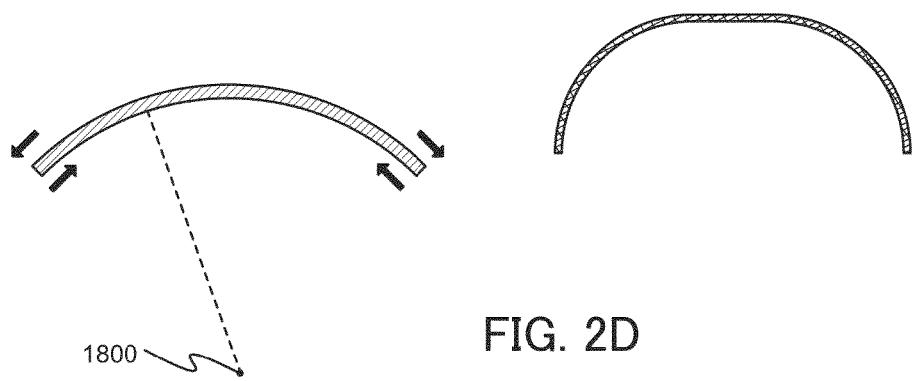
FIG. 2D
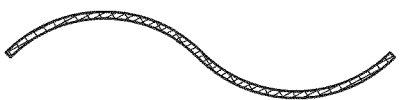

charging

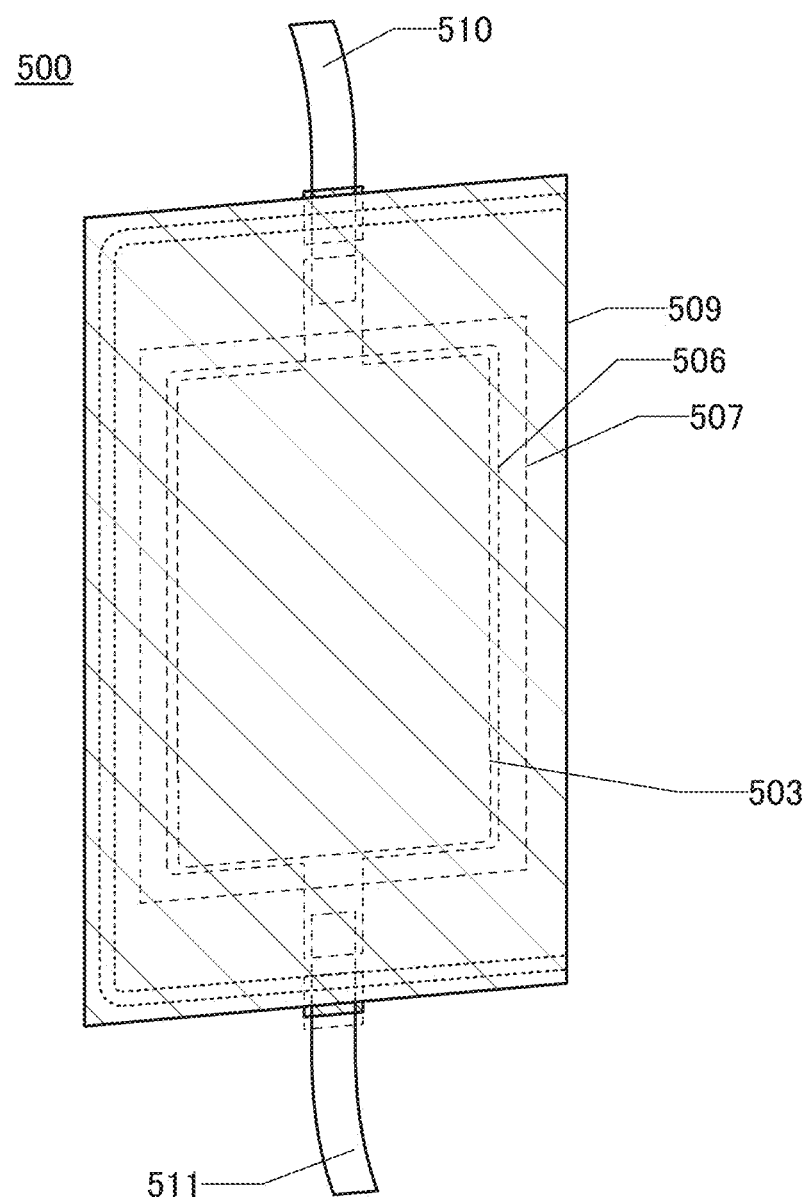

FIG. 10A
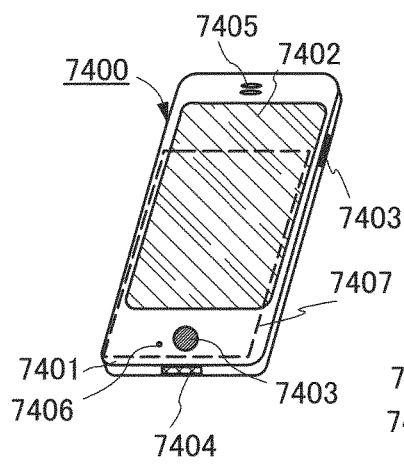
FIG. 10B FIG. 10C
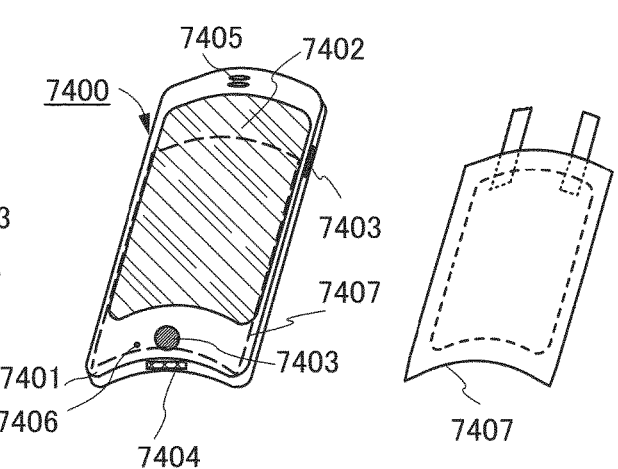
FIG. 10D FIG. 10E
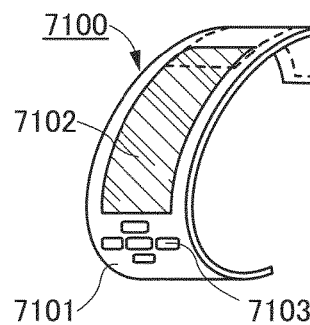
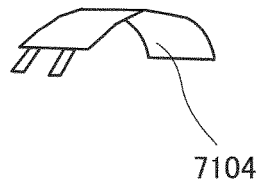

FIG. 30A
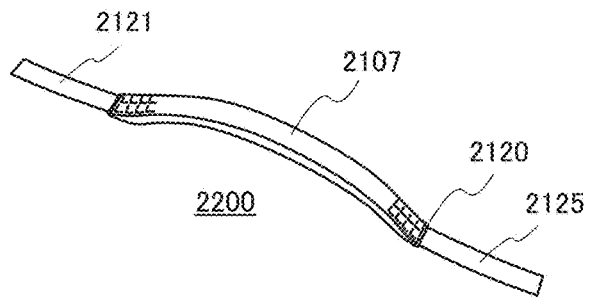
FIG. 30B
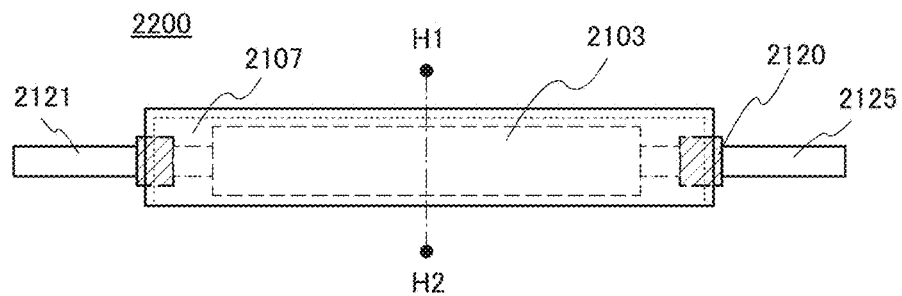
FIG. 30C1     FIG. 30C2
FIG. 30D
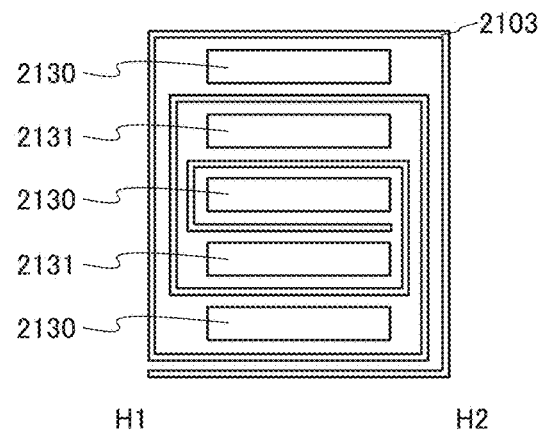

LITHIUM-ION SECONDARY BATTERY, FABRICATING METHOD THEROF, AND ELECTRONIC DEVICE

BACKGROUND OF THE INVENTION

1. Field of the Invention

One embodiment of the present invention relates to a lithium-ion secondary battery, a fabricating method thereof, and an electronic device.

Note that one embodiment of the present invention is not limited to the above technical field. The technical field of one embodiment of the invention disclosed in this specification and the like relates to an object, a method, or a fabricating method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

Examples of the secondary battery include a nickel-metal hydride battery, a lead-acid battery, and a lithium-ion secondary battery.

Such secondary batteries are used as power sources in portable information terminals typified by mobile phones. In particular, lithium-ion secondary batteries have been actively developed because the capacity thereof can be increased and the size thereof can be reduced. The performance required for the lithium-ion secondary batteries includes increased energy density, improved cycle life, safe operation under a variety of environments, and longer-term reliability.

In general, a lithium-ion secondary battery includes components such as a positive electrode, a negative electrode, an electrolyte solution, a separator, and an exterior body. The positive electrode and the negative electrode each include a current collector, and also include an active material in some cases. These components affect the performance of lithium-ion secondary batteries, and therefore have been actively developed to improve the performance. In addition, in order to improve the performance of the secondary batteries, a process for incorporating the components in the secondary batteries has also been actively developed (Patent Document 1).

REFERENCE

Patent Document

[Patent Document 1] Japanese Published Patent Application No. H04-328277

Non-Patent Document

[Non-Patent Document 1] Zempachi Ogumi, "Lithium Secondary Battery", Ohmsha, Ltd., the first impression of the first edition published on Mar. 20, 2008, pp. 161-162

SUMMARY OF THE INVENTION

A particularly important performance of the lithium-ion secondary batteries is a retention rate which is the ratio of discharge capacity after repeating charging and discharging to discharge capacity in the first cycle (hereinafter, referred to as a capacity retention rate). The capacity retention rate that is hardly changed and kept high allows the lithium-ion secondary battery to produce an almost constant output even when charging and discharging are repeated. Electronic devices receiving power from such a secondary battery can also operate stably, which reduces a load on the electronic devices.

When charging and discharging are repeated in a lithium-ion secondary battery using $LiPF_6$ as an electrolyte, diethyl carbonate (DEC) and ethylene carbonate (EC) as a solvent, and $LiPF_6$ used as an electrolyte are decomposed on a surface of a negative electrode active material by charge-discharge reactions; so that the capacity and the capacity retention rate of the secondary battery decrease. Therefore, forming a coating film on a surface of the negative electrode active material for suppressing the decomposition reaction as much as possible has been known. The coating film is required to be permeable to Li ions so as not to hinder battery reactions, and to suppress the permeation of $PF_6^-$, DEC, and EC to hinder the decomposition reaction.

As an efficient method for forming a coating film for suppressing the decomposition reaction occurring on a surface of a negative electrode active material, a method of adding vinylene carbonate (VC) to an electrolyte solution has been known. Non-Patent Document 1 suggests that when VC is added to an electrolyte solution, a coating film is efficiently formed on a surface of the negative electrode active material and irreversible capacity relating to the formation of the film can be low.

The uses of a lithium-ion secondary battery have been increasing rapidly in these days, so that further improvement of the characteristics of a lithium-ion secondary battery in which VC is added to an electrolyte solution is desired.

In view of the above, an object of one embodiment of the present invention is to provide a lithium-ion secondary battery with a high capacity retention rate. Another object is to provide a lithium-ion secondary battery with a longer lifetime. Another object of one embodiment of the present invention is to provide a fabricating method of a lithium-ion secondary battery with a high capacity retention rate. Another object is to provide a fabricating method of a lithium-ion secondary battery with a longer lifetime. Another object of one embodiment of the present invention is to provide a novel secondary battery, a novel power storage device, a novel fabricating method of a secondary battery, or a novel fabricating method of a power storage device.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a lithium-ion secondary battery including a positive electrode, a negative electrode, and an electrolyte solution. The negative electrode includes a negative electrode active material layer. The electrolyte solution includes at least one of lithium bis(trifluoromethanesulfonyl)amide (LiTFSA) and lithium bis(fluorosulfonyl)amide (LiFSA) and includes vinylene carbonate (VC). A coating film including lithium oxide is on a surface of the negative electrode active material layer.

In the lithium-ion secondary battery of one embodiment of the present invention, the positive electrode may include a positive electrode current collector and a positive electrode active material layer, the positive electrode current collector may include aluminum, and the positive electrode active material layer may include a graphene compound or LiFePO$_4$.

In the lithium-ion secondary battery of one embodiment of the present invention, the negative electrode may further include a negative electrode current collector, the negative electrode current collector may include copper, and the negative electrode active material layer may include graphite particles.

In the lithium-ion secondary battery of one embodiment of the present invention, the electrolyte solution may further include ethylene carbonate (EC) and diethyl carbonate (DEC).

Another embodiment of the present invention is an electronic device including the lithium-ion secondary battery of one embodiment of the present invention, a switch, and a display portion.

Another embodiment of the present invention is a fabricating method of a lithium-ion secondary battery which includes a first step of enclosing a positive electrode, a negative electrode, and an electrolyte solution in an exterior body, and a second step of annealing the exterior body enclosing the positive electrode, the negative electrode, and the electrolyte solution for 24 hours or longer after the first step. The annealing in the second step is performed at a temperature higher than or equal to 80° C. and lower than or equal to 100° C. The electrolyte solution includes at least one of LiTFSA and LiFSA and includes vinylene carbonate (VC).

Another embodiment of the present invention is a fabricating method of a lithium-ion secondary battery which includes a first step of enclosing a negative electrode including a negative electrode active material layer, a positive electrode, and an electrolyte solution in an exterior body, and a second step of annealing the exterior body enclosing the positive electrode, the negative electrode, and the electrolyte solution for 24 hours or longer after the first step. The annealing in the second step is performed at a temperature higher than or equal to 80° C. and lower than or equal to 100° C. The electrolyte solution includes at least one of LiTFSA and LiFSA and includes vinylene carbonate (VC). A coating film is on a surface of the negative electrode active material layer.

Another embodiment of the present invention is a fabricating method of a lithium-ion secondary battery which includes a first step of enclosing a negative electrode including a negative electrode active material layer, a positive electrode, and an electrolyte solution in an exterior body, and a second step of annealing the exterior body enclosing the positive electrode, the negative electrode, and the electrolyte solution for 24 hours or longer after the first step. The annealing in the second step is performed at a temperature higher than or equal to 80° C. and lower than or equal to 100° C. The electrolyte solution includes at least one of LiTFSA and LiFSA and includes vinylene carbonate (VC). The positive electrode includes a positive electrode current collector including aluminum. The positive electrode includes a positive electrode active material layer including a graphene compound. A coating film is on a surface of the negative electrode active material layer.

Another embodiment of the present invention is a fabricating method of a lithium-ion secondary battery which includes a first step of enclosing a negative electrode including a negative electrode active material layer, a positive electrode, and an electrolyte solution in an exterior body, and a second step of annealing the exterior body enclosing the positive electrode, the negative electrode, and the electrolyte solution for 24 hours or longer after the first step. The annealing in the second step is performed at a temperature higher than or equal to 80° C. and lower than or equal to 100° C. The electrolyte solution includes at least one of LiTFSA and LiFSA and includes vinylene carbonate (VC). The positive electrode includes a positive electrode current collector including aluminum. The positive electrode includes a positive electrode active material layer including a graphene compound. The negative electrode includes a negative electrode current collector including copper. The negative electrode active material layer includes graphite particles. A coating film is on a surface of the negative electrode active material layer.

In the fabricating method of a lithium-ion secondary battery, of one embodiment of the present invention, the coating film may change in quality in the second step.

In the fabricating method of a lithium-ion secondary battery, of one embodiment of the present invention, a third step may be further included between the first step and the second step. In the third step, the positive electrode and the negative electrode are connected to a device and charging and discharging are performed. The coating film may be formed in the third step.

One embodiment of the present invention can provide a lithium-ion secondary battery with a high capacity retention rate. A lithium-ion secondary battery with a longer lifetime can be provided. One embodiment of the present invention can provide a fabricating method of a lithium-ion secondary battery with a high capacity retention rate. A fabricating method of a lithium-ion secondary battery with a longer lifetime can be provided. One embodiment of the present invention can provide a novel secondary battery, a novel power storage device, a novel fabricating method of a secondary battery, or a novel fabricating method of a power storage device.

Note that the description of these effects does not disturb the existence of other effects. In one embodiment of the present invention, there is no need to achieve all the above effects. Other effects are apparent from and can be derived from the description of the specification, the drawings, the claims, and the like.

BRIEF DESCRIPTION OF DRAWINGS

In the accompanying drawings:

FIGS. 2A to 2D illustrate curvature radii;

FIG. 8 is an external view of a secondary battery;

FIGS. 10A to 10E illustrate flexible laminated secondary batteries;

FIGS. 30A, 30B, 30C1, 30C2, and 30D illustrate a perspective view, a top view, and cross-sectional views of an example of the structure of a secondary battery;

DETAILED DESCRIPTION OF THE INVENTION

Figure 1A:
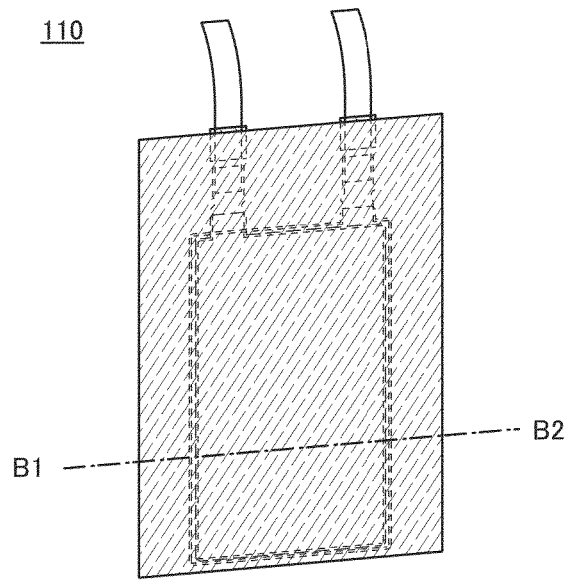
FIGS. 1A and 1B illustrate a lithium-ion secondary battery of one embodiment of the present invention.

Embodiments of the present invention will be described below. However, the present invention is not limited to the description below, and it is easily understood by those skilled in the art that modes and details disclosed herein can be modified in various ways. Therefore, the present invention is not construed as being limited to the description of the embodiments below.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Note that in each drawing described in this specification, the size, the thickness, or the like of each component such as a positive electrode, a negative electrode, an active material layer, a separator, an exterior body, and the like is exaggerated for clarity in some cases. Therefore, the sizes of the components are not limited to the sizes in the drawings and relative sizes between the components.

Note that in the structures of one embodiment of the present invention described in this specification and the like, the same portions or portions having similar functions in different drawings are denoted by the same reference numerals, and description of such portions is not repeated. Furthermore, the same hatching pattern is applied to portions having similar functions, and the portions are not especially denoted by reference numerals in some cases.

The descriptions in embodiments for the present invention can be combined with each other as appropriate.

Embodiment 1

In this embodiment, a lithium-ion secondary battery of one embodiment of the present invention and a fabricating method thereof will be described.

<<Structure and Assembly of Lithium-Ion Secondary Battery>>

A lithium-ion secondary battery 110 of one embodiment of the present invention will be described below with reference to FIGS. 1A and 1B. FIG. 1B is a cross-sectional view of the lithium-ion secondary battery 110 in FIG. 1A taken along dashed-dotted line B1-B2. FIG. 1B is a schematic cross-sectional view illustrating a positive electrode current collector 100, a positive electrode active material layer 101, a separator 104, a negative electrode active material layer 103, and a negative electrode current collector 102 overlapping with one another, which are enclosed by an exterior body 106 together with an electrolyte solution 105. Note that the active material layers can be formed on both surfaces of the current collectors. The lithium-ion secondary battery can have a stacked-layer structure of a plurality of the positive electrodes, a plurality of the negative electrodes, and a plurality of the separators.

In the lithium-ion secondary battery, the current collector 100, the positive electrode active material layer 101, the separator 104, the negative electrode active material layer 103, and the negative electrode current collector 102 are stacked and enclosed in the exterior body together with the electrolyte solution in a state where leads are connected to the positive electrode and the negative electrode.

Then, an aging step is performed. First, environmental temperature is kept at about room temperature, for example, and constant current charging is performed to a constant voltage at a low rate such as a rate lower than or equal to 0.1 C. Next, degassing is performed so that a gas generated by charging in a region inside the exterior body is released outside the exterior body, and then charging is performed at a higher rate than that of the initial charging.

After that, long-time preservation is performed at high temperatures in a charge state (hereinafter, this step is referred to as a high-temperature annealing step). In a manufacturing process of the lithium-ion secondary battery of one embodiment of the present invention, the high-temperature annealing step is performed at a temperature higher than or equal to 80° C. for 48 hours or longer. Through this step, the capacity retention rate can be prevented from decreasing even in the case of repeating charging and discharging of the secondary battery.

When vinylene carbonate (VC) is added as an additive to the electrolyte solution in advance, a dense coating film is formed on a surface of a negative electrode active material. The coating film is permeable to Li ions. Without the coating film, the capacity of the secondary battery decreases because materials in the electrolyte solution tend to reach the surface of the active material and electric charge tends to be lost by reductive decomposition during the charging and discharging of the secondary battery. Therefore, a decrease in capacity retention rate of the lithium-ion secondary battery in which the coating film is on the surface of the active material is suppressed. Note that, in some cases, a decrease in capacity retention rate is referred to as deterioration and deterioration after repeating charging and discharging is referred to as cycle deterioration. According to the above, although a dense coating film is formed only by addition of VC as an additive to the electrolyte solution, the high-temperature annealing step can change the quality of the coating film to form a film with higher quality.

By the way, it is known that a lithium-ion secondary battery deteriorates rapidly at high temperatures and charge and discharge capacity decreases significantly. In the case of a lithium-ion secondary battery using LiPF$_6$ as an electrolyte, for example, the electrolyte tends to be discomposed at high temperatures and thus, charge and discharge capacity decreases significantly. Furthermore, a lithium-ion secondary battery is not preferably kept at high temperatures because it is dangerous. For example, a gas is generated by an unexpected reaction in the secondary battery, which might lead to an increase in pressure. Furthermore, accidents leading to ignition or explosion have been reported.

In one embodiment of the present invention, addition of an additive (VC, for example) which is a base of the coating film formed on the surface of the active material, the use of an electrolyte (lithium bis(trifluoromethanesulfonyl)amide (LiTFSA), for example), and the high-temperature annealing step allow the secondary battery to be kept at high temperatures for a long time in the manufacturing process of the secondary battery, as described above. Then, a film with high quality can be formed on the surface of the active material in the manufacturing process. The film is permeable to Li ions, so that battery reactions are not hindered. Here, the film is hardly permeable to the other materials. Therefore, the decomposition reaction of materials occurring on the surface of the active material can be suppressed, so that the deterioration of the secondary battery can be reduced.

Next, the temperature in the high-temperature annealing step will be described. Properties of the film formed on the surface of the active material change depending on the temperature. The properties required for the film are as above and the temperature is desirably higher than or equal to 80° C. for forming a film with high quality. At a temperature higher than or equal to 80° C., lithium oxide in the film can be increased appropriately. Meanwhile, the temperature of the high-temperature annealing step is desirably not higher than or equal to the temperature at which the electrolyte and the other components are discomposed. The electrolyte used for the lithium-ion secondary battery of one embodiment of the present invention will be described below. In the case where LiTFSA, ethylene carbonate (EC), and diethyl carbonate (DEC) are used for the electrolyte, the decomposition reaction might occur noticeably by application of a temperature higher than or equal to 110° C. Therefore, the temperature of the high-temperature annealing step is preferably in a range higher than or equal to 80° C. and lower than or equal to 100° C., more preferably, higher than or equal to 85° C. and lower than or equal to 95° C.

Note that, in one embodiment of the present invention, a long-time preservation step at lower temperatures than that of the above step may be performed before the above step. When the environment temperature rises rapidly to high temperature, the secondary battery inside is also rapidly changed to be stressed in some cases. Therefore, a 24-hour-preservation step at 40° C. may be performed, for example. Note that the change over time inside the secondary battery is not sufficiently promoted at low temperatures in some cases; therefore, the high-temperature annealing step is performed after that.

After the high-temperature annealing step, degassing is performed again so that a gas generated in the region inside the exterior body is released. Furthermore, at room temperature, the secondary battery is discharged at a rate of 0.2 C, charged at the same rate, discharged at the same rate again, and further charged at the same rate. Then, the secondary battery is discharged at the same rate, charged at the same rate, and discharged at the same rate again, so that the aging step is completed; thus, the lithium-ion secondary battery of one embodiment of the present invention is manufactured.

Here, a charging rate and a discharging rate will be described. The charging rate (also referred to as C rate) refers to the relative ratio of constant current charging current to battery capacity (current value in charging [A]÷battery capacity [Ah]) and is expressed in a unit C. For example, the case where a battery having a capacity of 10 Ah is charged at a constant current of 2 A is rephrased as follows: charging is performed at 0.2 C. A charging rate of 1 C refers to the amount of current with which a battery is charged completely for one hour. The higher the charging rate is, the faster charging is completed. Furthermore, a discharging rate (also referred to as C rate) refers to the relative ratio of constant current discharging current to battery capacity (current value in discharging [A]÷battery capacity [Ah]) and is expressed in a unit C. For example, the case where a battery having a capacity of 10 Ah is discharged at a constant current of 2 A is rephrased as follows: discharging is performed at 0.2 C. A discharging rate of 1 C refers to the amount of current with which a battery is discharged completely for one hour. The higher the discharging rate is, the faster discharging is completed.

<<Structure of Positive Electrode>>

Next, components and materials used for the lithium-ion secondary battery of one embodiment of the present invention will be described. First, the positive electrode will be described with reference to FIG. 1B. The positive electrode includes the positive electrode active material layer 101 and the positive electrode current collector 100.

As a positive electrode active material used for the positive electrode active material layer 101, a material into and from which carrier ions such as lithium ions can be inserted and extracted can be used. Examples of the material are a lithium-containing material with an olivine crystal structure, a layered rock-salt crystal structure, and a spinel crystal structure, and the like.

Typical examples of the lithium-containing material with an olivine structure (general formula: LiMPO$_4$ (M is Fe(II), Co(II), or Ni(II))), are LiFePO$_4$, LiNiPO$_4$, LiCoPO$_4$, LiMnPO$_4$, LiFe$_a$Ni$_b$PO$_4$, LiFe$_a$Co$_b$PO$_4$, LiFe$_a$Mn$_b$PO$_4$, LiNi$_a$Co$_b$PO$_4$, LiNi$_a$Mn$_b$PO$_4$ (a+b≤1, 0<a<1, and 0<b<1), LiFe$_c$Ni$_d$Co$_e$PO$_4$, LiFe$_c$Ni$_d$Mn$_e$PO$_4$, LiNi$_c$Co$_d$Mn$_e$PO$_4$ (c+d+e≤1, 0<c<1, 0<d<1, and 0<e<1), LiFe$_f$Ni$_g$Co$_h$Mn$_i$PO$_4$ (f+g+h+i≤1, 0<f<1, 0<g<1, 0<h<1, and 0<i<1), and the like.

For example, lithium iron phosphate (LiFePO$_4$) is particularly preferable because it properly has properties necessary for the positive electrode active material, such as safety, stability, high capacity density, high potential, and the existence of lithium ions that can be extracted in initial oxidation (charging).

Examples of the lithium-containing material with a layered rock-salt crystal structure include lithium cobalt oxide (LiCoO$_2$); LiNiO$_2$; LiMnO$_2$; Li$_2$MnO$_3$; an NiCo-based lithium-containing material (general formula: LiNi$_x$Co$_{(1-x)}$O$_2$ (0<x<1)) such as LiNi$_{0.8}$CO$_{0.2}$O$_2$; an NiMn-based lithium-containing material (general formula: LiNi$_x$Mn$_{(1-x)}$O$_2$ (0<x<1)) such as LiNi$_{0.5}$Mn$_{0.5}$O$_2$; and an NiMnCo-based lithium-containing material (also referred to as NMC, and general formula: LiNi$_x$Mn$_y$Co$_{(1-x-y)}$O$_2$ (x>0, y>0, x+y<1)) such as LiNi$_{1/3}$Mn$_{1/3}$Co$_{1/3}$O$_2$. Moreover, Li(Ni$_{0.8}$CO$_{0.15}$Al$_{0.05}$)O$_2$, Li$_2$MnO$_3$—LiMO$_2$ (M is Co, Ni, or Mn), and the like can be given.

In particular, LiCoO$_2$ is preferable because it has high capacity, higher stability in the air than that of LiNiO$_2$, and higher thermal stability than that of LiNiO$_2$, for example.

Examples of the lithium-containing material with a spinel crystal structure are LiMn$_2$O$_4$, Li$_{(1+x)}$Mn$_{(2-x)}$O$_4$ (0<x<2), LiMn$_{(2-x)}$Al$_x$O$_4$ (0<x<2), LiMn$_{1.5}$Ni$_{0.5}$O$_4$, and the like.

It is preferable to add a small amount of lithium nickel oxide (LiNiO$_2$ or LiNi$_{(1-x)}$M$_x$O$_2$ (M is Co, Al, or the like, 0<x<1)) to the lithium-containing material with a spinel crystal structure which contains manganese such as LiMn$_2$O$_4$, in which case the dissolution of manganese and the decomposition of the electrolyte solution can be suppressed, for example.

A composite oxide expressed by Li$_{(2-j)}$MSiO$_4$ (general formula) (M is Fe(II), Mn(II), Co(II), or Ni(II), 0≤j≤2) can also be used as the positive electrode active material. Typical examples of the general formula Li$_{(2-j)}$MSiO$_4$ include Li$_{(2-j)}$FeSiO$_4$, Li$_{(2-j)}$NiSiO$_4$, Li$_{(2-j)}$CoSiO$_4$, Li$_{(2-j)}$MnSiO$_4$, Li$_{(2-j)}$Fe$_k$Ni$_l$SiO$_4$, Li$_{(2-j)}$Fe$_k$Co$_l$SiO$_4$, Li$_{(2-j)}$Fe$_k$Mn$_l$SiO$_4$, Li$_{(2-j)}$Ni$_k$Co$_l$SiO$_4$, Li$_{(2-j)}$Ni$_k$Mn$_l$SiO$_4$ (k+l≤1, 0<k<1, and 0<l<1), Li$_{(2-j)}$Fe$_m$Ni$_n$Co$_q$SiO$_4$, Li$_{(2-j)}$Fe$_m$Ni$_n$Mn$_q$SiO$_4$, Li$_{(2-j)}$Ni$_m$Co$_n$Mn$_q$SiO$_4$ (m+n+q≤1, 0<m<1, 0<n<1, and 0<q<1), and Li$_{(2-j)}$Fe$_r$Ni$_s$Co$_t$Mn$_u$SiO$_4$ (r+s+t+u≤1, 0<r<1, 0<s<1, 0<t<1, and 0<u<1).

Alternatively, a nasicon compound represented by a general formula A$_x$M$_2$(XO$_4$)$_3$ (A is Li, Na, or Mg, M$_2$ is Fe, Mn, Ti, V, Nb, or Al, and X is S, P, Mo, W, As, or Si) can be used as the positive electrode active material. Examples of the nasicon compound are Fe$_2$(MnO$_4$)$_3$, Fe$_2$(SO$_4$)$_3$, Li$_3$Fe$_2$(PO$_4$)$_3$, and the like. Further alternatively, a compound represented by a general formula Li$_2$MPO$_4$F, Li$_2$MP$_2$O$_7$, or Li$_5$MO$_4$ (M is Fe or Mn), a perovskite fluoride such as FeF$_3$, a metal chalcogenide (a sulfide, a selenide, or a telluride) such as TiS$_2$ or MoS$_2$, a lithium-containing material with an inverse spinel crystal structure such as LiMVO$_4$, a vanadium oxide (V$_2$O$_5$, V$_6$O$_{13}$, LiV$_3$O$_8$, or the like), a manganese oxide, organic sulfur, or the like can be used as the positive electrode active material.

In the case where carrier ions are alkali metal ions other than lithium ions, or alkaline-earth metal ions, the positive electrode active material may contain, instead of lithium in the compound and the oxide, an alkali metal (e.g., sodium or potassium), an alkaline-earth metal (e.g., calcium, strontium, barium, beryllium, or magnesium). For example, the positive electrode active material may be a layered oxide containing sodium such as NaFeO$_2$ or Na$_{2/3}$[Fe$_{1/2}$Mn$_{1/2}$]O$_2$.

Further alternatively, any of the above materials may be combined to be used as the positive electrode active material. For example, a solid solution obtained by combining two or more of the above materials can be used as the positive electrode active material. For example, a solid solution of LiCo$_{1/3}$Mn$_{1/3}$Ni$_{1/3}$O$_2$ and Li$_2$MnO$_3$ can be used as the positive electrode active material.

Further alternatively, a graphene compound described below can be used as the positive electrode active material.

The average particle diameter of the primary particle of the positive electrode active material is preferably greater than or equal to 50 nm and less than or equal to 100 μm.

The positive electrode active material and a negative electrode active material have a central role in battery reactions of a secondary battery, and occlude and release carrier ions. To increase the lifetime of a secondary battery, the substances preferably have a small amount of capacity which relates to irreversible battery reactions, and have high charge and discharge efficiency.

The active material is in contact with an electrolyte solution. When the active material reacts with the electrolyte solution, the active material is lost and deteriorates by the reaction, which decreases the capacity of the secondary battery. Therefore, it is preferable that such a reaction not be caused in the secondary battery in order to achieve a secondary battery which hardly deteriorates.

Examples of the conductive additive in the electrode include acetylene black (AB), graphite (black lead) particles, carbon nanotubes, reduced graphene oxide (RGO), and fullerene.

A network for electric conduction can be formed in the electrode by the conductive additive. The conductive additive also allows maintaining of a path for electric conduction between the particles of the positive electrode active material. The addition of the conductive additive to the positive electrode active material layer increases the electric conductivity of the positive electrode active material layer 101.

A typical example of the binder is polyvinylidene fluoride (PVDF), and other examples of the binder include polyimide, polytetrafluoroethylene, polyvinyl chloride, ethylene-propylene-diene polymer, styrene-butadiene rubber, acrylonitrile-butadiene rubber, fluorine rubber, polyvinyl acetate, polymethyl methacrylate, polyethylene, and nitrocellulose.

The content of the binder with respect to the total amount of the positive electrode active material layer 101 is preferably greater than or equal to 1 wt % and less than or equal to 10 wt %, further preferably greater than or equal to 2 wt % and less than or equal to 8 wt %, and still further preferably greater than or equal to 3 wt % and less than or equal to 5 wt %. The content of the conductive additive with respect to the total amount of the positive electrode active material layer 101 is preferably greater than or equal to 1 wt % and less than or equal to 10 wt %, further preferably greater than or equal to 1 wt % and less than or equal to 5 wt %.

In the case where the positive electrode active material layer 101 is formed by a coating method, the positive electrode active material, the binder, the conductive additive, and a dispersion medium are mixed to form an electrode slurry, and the slurry is applied to the positive electrode current collector 100 and dried.

The positive electrode current collector 100 can be formed using a material, which has high conductivity and is not alloyed with carrier ions of lithium or the like, such as stainless steel, gold, platinum, aluminum, or titanium, or an alloy thereof. Alternatively, an aluminum alloy to which an element which improves heat resistance, such as silicon, titanium, neodymium, scandium, or molybdenum, is added can be used. Still alternatively, a metal element which forms silicide by reacting with silicon can be used. Examples of the metal element which forms silicide by reacting with silicon include zirconium, titanium, hafnium, vanadium, niobium, tantalum, chromium, molybdenum, tungsten, cobalt, nickel, and the like. The positive electrode current collector can have a foil shape, a plate (sheet) shape, a net shape, a punching-metal shape, an expanded-metal shape, or the like as appropriate.

Through the above steps, the positive electrode of the lithium-ion secondary battery can be formed.

<<Structure of Negative Electrode>>

Next, the negative electrode will be described with reference to FIG. 1B. The negative electrode includes the negative electrode active material layer 103 and the negative electrode current collector 102. Steps of forming the negative electrode will be described below.

Examples of the carbon-based material as the negative electrode active material used for the negative electrode active material layer 103 include graphite, graphitizing carbon (soft carbon), non-graphitizing carbon (hard carbon), a carbon nanotube, graphene, and carbon black. Examples of graphite include artificial graphite such as meso-carbon microbeads (MCMB), coke-based artificial graphite, and pitch-based artificial graphite and natural graphite such as spherical natural graphite. In addition, the shape of the graphite is a flaky shape or a spherical shape, for example.

Other than the carbon-based material, a material which enables charge-discharge reactions by an alloying reaction and a dealloying reaction with lithium can be used as the negative electrode active material. A material containing at least one of Ga, Si, Al, Ge, Sn, Pb, Sb, Bi, Ag, Zn, Cd, In, and the like can be used, for example. Such elements have higher capacity than carbon. In particular, silicon has a significantly high theoretical capacity of 4200 mAh/g and is preferably used. Examples of an alloy-based material (compound-based material) using such elements include $Mg_2Si$, $Mg_2Ge$, $Mg_2Sn$, $SnS_2$, $V_2Sn_3$, $FeSn_2$, $CoSn_2$, $Ni_3Sn_2$, $Cu_6Sn_5$, $Ag_3Sn$, $Ag_3Sb$, $Ni_2MnSb$, $CeSb_3$, $LaSn_3$, $La_3Co_2Sn_7$, $CoSb_3$, InSb, SbSn, and the like.

Alternatively, for the negative electrode active material, an oxide such as SiO, SnO, $SnO_2$, titanium dioxide ($TiO_2$), lithium titanium oxide ($Li_4Ti_5O_{12}$), a lithium-graphite intercalation compound ($Li_xC_6$), niobium pentoxide ($Nb_2O_5$), tungsten dioxide ($WO_2$), or molybdenum dioxide ($MoO_2$) can be used.

Still alternatively, for the negative electrode active material, $Li_{(3-x)}M_xN$ (M is Co, Ni, or Cu) with a $Li_3N$ structure, which is a nitride containing lithium and a transition metal, can be used. For example, $Li_{2.6}Co_{0.4}N_3$ is preferable because of high charge and discharge capacity (900 mAh/g and 1890 mAh/cm$^3$).

When a nitride containing lithium and a transition metal is used, lithium ions are included in the negative electrode active material; thus, the negative electrode active material can be used in combination with a material for a positive electrode active material which does not contain lithium ions, such as $V_2O_5$ or $Cr_3O_8$. In the case of using a material containing lithium ions for a positive electrode active material, the nitride containing lithium and a transition metal can be used for the negative electrode active material by extracting the lithium ions contained in the positive electrode active material in advance.

Alternatively, a material which causes a conversion reaction can be used for the negative electrode active material; for example, a transition metal oxide with which an alloying reaction with lithium is not caused, such as cobalt oxide (CoO), nickel oxide (NiO), and iron oxide (FeO), may be used for the negative electrode active material. Other examples of the material which causes a conversion reaction include oxides such as $Fe_2O_3$, CuO, $Cu_2O$, $RuO_2$, and $Cr_2O_3$, sulfides such as $CoS_{0.89}$, NiS, and CuS, nitrides such as $Zn_3N_2$, $Cu_3N$, and $Ge_3N_4$, phosphides such as $NiP_2$, $FeP_2$, and $CoP_3$, and fluorides such as $FeF_3$ and $BiF_3$.

The particle diameter of the negative electrode active material is preferably greater than or equal to 50 nm and less than or equal to 100 μm, for example.

Note that it is acceptable that a plurality of materials for active materials are combined at a given proportion both for the positive electrode active material layer 101 and the negative electrode active material layer 103. The use of a plurality of materials for the active material layer makes it possible to select the performance of the active material layer in detail.

Examples of the conductive additive in the electrode include acetylene black (AB), graphite (black lead) particles, carbon nanotubes, reduced graphene oxide (RGO), and fullerene.

A network for electric conduction can be formed in the electrode by the conductive additive. The conductive additive also allows maintaining of a path for electric conduction between the particles of the negative electrode active material. The addition of the conductive additive to the negative electrode active material layer increases the electric conductivity of the negative electrode active material layer 103.

A typical example of the binder is polyvinylidene fluoride (PVDF), and other examples of the binder include polyimide, polytetrafluoroethylene, polyvinyl chloride, ethylene-propylene-diene polymer, styrene-butadiene rubber, acrylonitrile-butadiene rubber, fluorine rubber, polyvinyl acetate, polymethyl methacrylate, polyethylene, and nitrocellulose.

The content of the binder with respect to the total amount of the negative electrode active material layer 103 is preferably greater than or equal to 1 wt % and less than or equal to 10 wt %, further preferably greater than or equal to 2 wt % and less than or equal to 8 wt %, and still further preferably greater than or equal to 3 wt % and less than or equal to 5 wt %. The content of the conductive additive with respect to the total amount of the negative electrode active material layer 103 is preferably greater than or equal to 1 wt % and less than or equal to 10 wt %, further preferably greater than or equal to 1 wt % and less than or equal to 5 wt %.

Next, the negative electrode active material layer 103 is formed over the negative electrode current collector 102. In the case where the negative electrode active material layer 103 is formed by a coating method, the negative electrode active material, the binder, the conductive additive, and a dispersion medium are mixed to form a slurry, and the slurry is applied to the negative electrode current collector 102 and dried. If necessary, pressing may be performed after the drying.

The negative electrode current collector 102 can be formed using a material, which has high conductivity and is not alloyed with carrier ions of lithium or the like, such as stainless steel, gold, platinum, zinc, iron, copper, titanium, or tantalum, or an alloy thereof. Alternatively, a metal element which forms silicide by reacting with silicon can be used. Examples of the metal element which forms silicide by reacting with silicon include zirconium, titanium, hafnium, vanadium, niobium, tantalum, chromium, molybdenum, tungsten, cobalt, nickel, and the like. The negative electrode current collector 102 can have a foil shape, a plate (sheet) shape, a net shape, a cylindrical shape, a coil shape, a punching-metal shape, an expanded-metal shape, or the like as appropriate. The negative electrode current collector 102 preferably has a thickness greater than or equal to 5 μm and less than or equal to 30 μm. A part of the surface of the electrode current collector may be provided with an undercoat layer using graphite or the like.

Through the above steps, the negative electrode of the lithium-ion secondary battery can be formed.

<<Structure of Separator>>

The separator 104 will be described. The separator 104 may be formed using a material such as paper, nonwoven fabric, a glass fiber, a synthetic fiber such as nylon (polyamide), vinylon (a polyvinyl alcohol based fiber), polyester, acrylic, polyolefin, or polyurethane. However, a material that does not dissolve in the electrolyte solution described later needs to be selected.

More specifically, as a material for the separator 104, high-molecular compounds based on fluorine-based polymer, polyether such as polyethylene oxide and polypropylene oxide, polyolefin such as polyethylene and polypropylene, polyacrylonitrile, polyvinylidene chloride, polymethyl methacrylate, polymethylacrylate, polyvinyl alcohol, polymethacrylonitrile, polyvinyl acetate, polyvinylpyrrolidone, polyethyleneimine, polybutadiene, polystyrene, polyisoprene, and polyurethane, derivatives thereof, cellulose, paper, nonwoven fabric, and a glass fiber can be used either alone or in combination.

The separator 104 needs to have insulation performance that prevents connection between the electrodes, performance that holds the electrolyte solution, and ionic conductivity. As a method for forming a film having a function as a separator, a method for forming a film by stretching is given. Examples of the method include a stretching aperture method in which a melted polymer material is spread, heat is released from the material, and pores are formed by stretching the resulting film in the directions of two axes parallel to the film.

To set the separator 104 in a secondary battery, a method in which the separator is inserted between the positive electrode and the negative electrode can be used. Alternatively, a method in which the separator 104 is placed on one of the positive electrode and the negative electrode and then the other of the positive electrode and the negative electrode is placed thereon can be used. The positive electrode, the negative electrode, and the separator are stored in the exterior body, and the exterior body is filled with the electrolyte solution, whereby the secondary battery can be fabricated.

The separator 104 with a size large enough to cover both surfaces of either the positive electrode or the negative electrode, in a form of sheet or envelope, may be fabricated to form the electrode wrapped in the separator 104. In that case, the electrode can be protected from mechanical damages in the fabrication of the secondary battery and the handling of the electrode becomes easy. The electrode wrapped in the separator and the other electrode are stored in the exterior body, and the exterior body is filled with the electrolyte solution, whereby the secondary battery can be fabricated. FIG. 1B is a cross-sectional structure of a secondary battery with an envelope-like separator. Although FIG. 1B shows the cross-sectional structure of the secondary battery including a pair of the positive and negative electrodes, a secondary battery with a stacked-layer structure including plural pairs of positive and negative electrodes may be fabricated.

The separator 104 may be a plurality of layers. Although the separator 104 can be formed by the above method, the range of the thickness of the film and the size of the pore in the film of the separator is limited by a material of the separator and mechanical strength of the film. A first separator and a second separator each formed by a stretching method may be used together in a secondary battery. The first separator and the second separator can be formed using one or more kinds of material selected from the above materials or materials other than those described above. Characteristics such as the size of the pore in the film, the proportion of the volume of the pores in the film (also referred to as porosity), and the thickness of the film can be determined by film formation conditions, film stretching conditions, and the like. By using the first separator and the second separator having different characteristics, the performance of the separators of the secondary battery can be selected more variously than in the case of using one of the separators.

The secondary battery may be flexible. In the case where flow stress is applied to the flexible secondary battery, the stress can be relieved by sliding of the first separator and the second separator at the interface between the first separator and the second separator. Therefore, the structure including a plurality of separators is also suitable as a structure of a separator in a flexible secondary battery.

Through the above steps, the separator can be incorporated in the lithium-ion secondary battery.

<<Components of Electrolyte Solution>>

The electrolyte solution 105 used in the lithium-ion secondary battery of one embodiment of the present invention is preferably a nonaqueous solution (solvent) containing an electrolyte (solute).

For a solvent of the electrolyte solution 105, a material in which carrier ions can transfer is used. For example, an aprotic organic solvent is preferably used, and one of ethylene carbonate (EC), propylene carbonate (PC), butylene carbonate, chloroethylene carbonate, vinylene carbonate, γ-butyrolactone, γ-valerolactone, dimethyl carbonate (DMC), diethyl carbonate (DEC), ethyl methyl carbonate (EMC), methyl formate, methyl acetate, methyl butyrate, 1,3-dioxane, 1,4-dioxane, dimethoxyethane (DME), dimethyl sulfoxide, diethyl ether, methyl diglyme, acetonitrile, benzonitrile, tetrahydrofuran, sulfolane, and sultone can be used, or two or more of these solvents can be used in an appropriate combination in an appropriate ratio.

When a gelled polymer material is used as the solvent of the electrolyte solution 105, safety against liquid leakage and the like is improved. Furthermore, the lithium-ion secondary battery can be thinner and more lightweight. Typical examples of the gelled polymer material include a silicone gel, an acrylic gel, an acrylonitrile gel, a polyethylene oxide gel, a polypropylene oxide gel, a fluorine-based polymer gel, and the like.

Alternatively, the use of one or more of ionic liquids (room temperature molten salts) that have non-flammability and non-volatility as the solvent for the electrolyte solution can prevent a lithium-ion secondary battery from exploding or catching fire even when the lithium-ion secondary battery internally shorts out or the internal temperature increases by overcharging or the like. Thus, the lithium-ion secondary battery has improved safety.

Although the case where carrier ions are lithium ions in the above electrolyte is described, carrier ions other than lithium ions can be used. When the carrier ions other than lithium ions are alkali metal ions or alkaline-earth metal ions, instead of lithium in the lithium salts, an alkali metal (e.g., sodium or potassium) or an alkaline-earth metal (e.g., calcium, strontium, barium, beryllium, or magnesium) may be used as the electrolyte.

The electrolyte solution used for the secondary battery is preferably a highly purified one so as to contain a negligible small amount of dust particles and elements other than the constituent elements of the electrolyte solution (hereinafter, also simply referred to as impurities). Specifically, the mass ratio of impurities to the electrolyte solution is less than or equal to 1%, preferably less than or equal to 0.1%, and further preferably less than or equal to 0.01%. An additive agent such as vinylene carbonate may be added to the electrolyte solution.

In the case of using lithium ions as carrier ions, as an electrolyte dissolved in the above solvent, one of lithium salts such as $LiPF_6$, $LiClO_4$, $LiAsF_6$, $LiBF_4$, $LiAlCl_4$, LiSCN, LiBr, LiI, $Li_2SO_4$, $Li_2B_{10}Cl_{10}$, $Li_2B_{12}Cl_{12}$, $LiCF_3SO_3$, $LiC_4F_9SO_3$, $LiC(CF_3SO_2)_3$, $LiC(C_2F_5SO_2)_3$, $LiN(CF_3SO_2)_2$, $LiN(C_4F_9SO_2)(CF_3SO_2)$, and $LiN(C_2F_5SO_2)_2$ can be used, or two or more of these lithium salts can be used in an appropriate combination in an appropriate ratio.

Note that the electrolyte solution reacts with and corrodes the positive electrode current collector in some cases. In order to prevent such corrosion, several weight percent of $LiPF_6$ may be added to the electrolyte solution, in which case a passive film is formed on a surface of the positive electrode current collector and may be able to prevent reaction between the electrolyte solution and the positive electrode current collector. Note that the concentration of $LiPF_6$ is less than or equal to 10 wt %, preferably less than or equal to 5 wt %, and further preferably less than or equal to 3 wt % in order that the positive electrode active material layer is not dissolved.

<<Graphene Compound>>

Note that, in one embodiment of the present invention, a graphene compound can be included in components of a power storage device. As described later, when modification is performed, the structure and characteristics of a graphene compound can be selected from a wider range of alternatives. Thus, a preferable property can be exhibited in accordance with a component in which a graphene compound is to be used. Moreover, a graphene compound has high mechanical strength and therefore can be used in a component of a flexible power storage device. Graphene compounds will be described below.

Graphene has carbon atoms arranged in one atomic layer. A π bond exists between the carbon atoms. Graphene including two or more and one hundred or less layers is referred to as multilayer graphene in some cases. The length in the longitudinal direction or the length of the major axis in a plane in each of graphene and multilayer graphene is greater than or equal to 50 nm and less than or equal to 100 µm, or greater than or equal to 800 nm and less than or equal to 50 µm.

In this specification and the like, a compound including graphene or multilayer graphene as a basic skeleton is referred to as a graphene compound. Graphene compounds include graphene and multilayer graphene.

Graphene compounds will be detailed below.

A graphene compound is a compound where graphene or multilayer graphene is modified with an atom other than carbon or an atomic group with an atom other than carbon. A graphene compound may be a compound where graphene or multilayer graphene is modified with an atomic group composed mainly of carbon, such as an alkyl group or an alkylene group. An atomic group that modifies graphene or multilayer graphene is referred to as a substituent, a functional group, a characteristic group, or the like in some cases. Modification in this specification and the like refers to introduction of an atom other than carbon, an atomic group with an atom other than carbon, or an atomic group mainly containing carbon to graphene, multilayer graphene, a graphene compound, or graphene oxide (described later) by a substitution reaction, an addition reaction, or other reactions.

Note that the surface side and the rear surface side of graphene may be modified with different atoms or atomic groups. In multilayer graphene, multiple layers may be modified with different atoms or atomic groups.

An example of the above graphene modified with an atom or an atomic group is graphene or multilayer graphene that is modified with oxygen or a functional group containing oxygen. Examples of a functional group containing oxygen include an epoxy group, a carbonyl group such as a carboxyl group, and a hydroxyl group. A graphene compound modified with oxygen or a functional group containing oxygen is referred to as graphene oxide in some cases. In this specification, graphene oxides include multilayer graphene oxides.

As an example of modification of graphene oxide, silylation of graphene oxide will be described. First, in a nitrogen atmosphere, graphene oxide is put in a container, n-butylamine ($C_4H_9NH_2$) is added to the container, and stirring is performed for one hour with the temperature kept at 60° C. Then, toluene is added to the container, alkyltrichlorosilane is added thereto as a silylating agent, and stirring is performed in a nitrogen atmosphere for five hours with the temperature kept at 60° C. Then, toluene is further added to the container, and the resulting solution is suction-filtrated to give a solid powder. The powder is dispersed in ethanol, and the resulting solution is suction-filtered to give a solid powder. The powder is dispersed in acetone, and the resulting solution is suction-filtered to give a solid powder. A liquid of the solid powder is vaporized to give silylated graphene oxide.

The modification is not limited to silylation, and silylation is not limited to the above method. The modification is not limited to introduction of an atom or an atomic group of one kind, and the modification of two or more types may be performed to introduce atoms or atomic groups of two or more kinds. By introducing a given atomic group to a graphene compound, the physical property of the graphene compound can be changed. Therefore, by performing desirable modification in accordance with the application of a graphene compound, a desired property of the graphene compound can be exhibited intentionally.

A formation method example of graphene oxide will be described below. Graphene oxide can be obtained by oxidizing the above graphene or multilayer graphene. Alternatively, graphene oxide can be obtained by being separated from graphite oxide. Graphite oxide can be obtained by oxidizing graphite. The graphene oxide may be further modified with the above atom or atomic group.

In RGO, which is a compound that can be obtained by reducing graphene oxide, all oxygen atoms contained in the graphene oxide are not extracted and part of them remains in a state where oxygen or atomic group containing oxygen is bonded to carbon in some cases. In some cases, RGO includes a functional group, e.g., an epoxy group, a carbonyl group such as a carboxyl group, or a hydroxyl group.

A graphene compound may have a sheet-like shape where a plurality of graphene compounds overlap with each other. Such a graphene compound is referred to as a graphene compound sheet in some cases. The graphene compound sheet has, for example, an area with a thickness greater than or equal to 0.33 nm and less than or equal to 10 mm, preferably greater than 0.34 nm and less than or equal to 10 µm. The graphene compound sheet may be modified with an atom other than carbon, an atomic group containing an atom other than carbon, an atomic group composed mainly of carbon such as an alkyl group, or the like. A plurality of layers in the graphene compound sheet may be modified with different atoms or atomic groups.

A graphene compound may have a five-membered ring composed of carbon atoms or a poly-membered ring that is a seven- or more-membered ring composed of carbon atoms, in addition to a six-membered ring composed of carbon atoms. In the neighborhood of a poly-membered ring which is a seven- or more-membered ring, a region through which a lithium ion can pass may be generated.

A plurality of graphene compounds may be gathered to form a sheet-like shape.

A graphene compound has a planar shape, thereby enabling surface contact.

In some cases, a graphene compound has high conductivity even when it is thin. The contact area between graphene compounds or between a graphene compound and an active material can be increased by surface contact. Thus, even with a small amount of a graphene compound per volume, a conductive path can be formed efficiently.

In contrast, a graphene compound may also be used as an insulator. For example, a graphene compound sheet may be used as a sheet-like insulator. Graphene oxide, for example, has a higher insulation property than a graphene compound that is not oxidized, in some cases. A graphene compound modified with an atomic group may have an improved insulation property, depending on the type of the modifying atomic group.

A graphene compound in this specification and the like may include a precursor of graphene. The precursor of graphene refers to a substance used for forming graphene. The precursor of graphene may contain the above graphene oxide, graphite oxide, or the like.

Graphene containing an alkali metal or an element other than carbon, such as oxygen, is referred to as a graphene analog in some cases. In this specification and the like, graphene compounds include graphene analogs.

A graphene compound in this specification and the like may include an atom, an atomic group, and ions thereof between the layers. The physical properties, such as electric conductivity and ion conductivity, of a graphene compound sometimes change when an atom, an atomic group, and ions thereof exist between layers of the compound. In addition, a distance between the layers is increased in some cases.

A graphene compound has excellent electrical characteristics of high conductivity and excellent physical properties of high flexibility and high mechanical strength in some cases. A modified graphene compound can have extremely low conductivity and serve as an insulator depending on the type of the modification. A graphene compound has a planar shape. A graphene compound enables low-resistance surface contact.

<<Structure of Exterior Body>>

Next, the exterior body 106 will be described. As the exterior body 106, a film having a three-layer structure can be used, for example. In the three-layer structure, a highly flexible metal thin film of, for example, aluminum, stainless steel, copper, and nickel is provided over a film formed of a material such as polyethylene, polypropylene, polycarbonate, ionomer, and polyamide, and an insulating synthetic resin film of, for example, a polyamide-based resin or a polyester-based resin is provided as the outer surface of the exterior body over the metal thin film. With such a three-layer structure, permeation of an electrolyte solution and a gas can be blocked and an insulating property and resistance to the electrolyte solution can be provided. The exterior body is folded inside in two, or two exterior bodies are stacked with the inner surfaces facing each other, in which case application of heat melts the materials on the overlapping inner surfaces to cause fusion bonding between the two exterior bodies. In this manner, a sealing structure can be formed.

A portion where the sealing structure is formed by fusion bonding or the like of the exterior body is referred to as a sealing portion. In the case where the exterior body is folded inside in two, the sealing portion is formed in the place other than the fold, and a first region of the exterior body and a second region of the exterior body that overlaps with the first region are fusion-bonded, for example. In the case where two exterior bodies are stacked, the sealing portion is formed along the entire circumference by heat fusion bonding or the like.

<<Flexible Secondary Battery>>

When a flexible material is selected from materials of the components described in this embodiment and used, a flexible lithium-ion secondary battery can be fabricated. Deformable devices are currently under active research and development. For such devices, flexible secondary batteries are demanded.

In the case of bending a secondary battery in which a battery material 1805 including electrodes and an electrolyte solution is sandwiched between two films as exterior bodies, a radius 1802 of curvature of a film 1801 on the side closer to a center 1800 of curvature of the secondary battery is smaller than a radius 1804 of curvature of a film 1803 on the side farther from the center 1800 of curvature (FIG. 2A). When the secondary battery is curved and has an arc-shaped cross section, compressive stress is applied to a surface of the film closer to the center 1800 of curvature and tensile stress is applied to a surface of the film farther from the center 1800 of curvature (FIG. 2B).

When a flexible lithium-ion secondary battery is deformed, strong stress is applied to the exterior bodies. However, even with the compressive stress and tensile stress due to the deformation of the secondary battery, the influence of a strain can be reduced by forming a pattern including projections or depressions on surfaces of the exterior bodies. For this reason, the secondary battery can change its form in such a range that the exterior body on the side closer to the center of curvature has a curvature radius of 30 mm, preferably 10 mm.

Figure 3A:
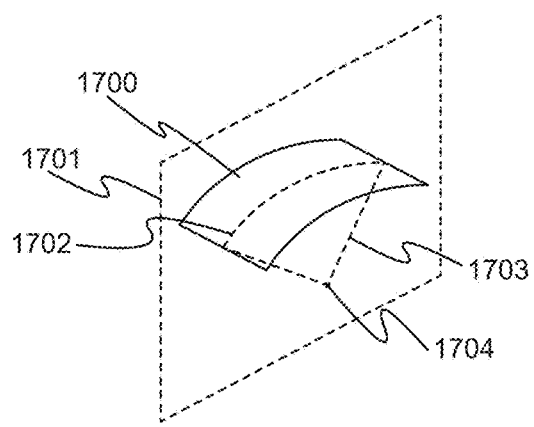
FIGS. 3A to 3C illustrate a curvature radius.
Figure 3B:
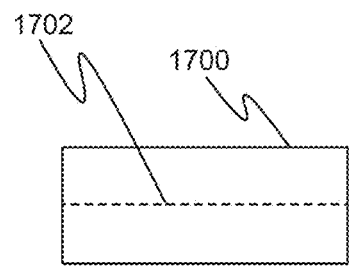
Figure 3C:
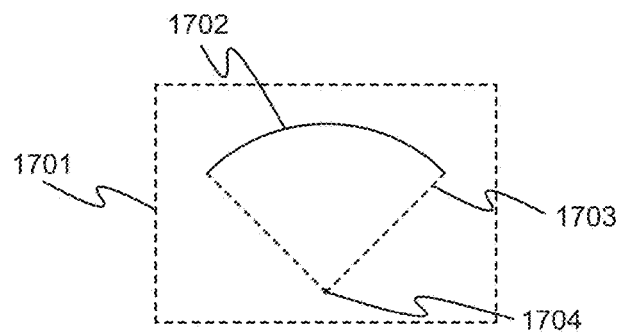

The radius of curvature of a surface will be described with reference to FIGS. 3A to 3C. In FIG. 3A, on a plane 1701 along which a curved surface 1700 is cut, part of a curve 1702 forming the curved surface 1700 is approximate to an arc of a circle; the radius of the circle is referred to as a radius of curvature 1703 and the center of the circle is referred to as a center of curvature 1704. FIG. 3B is a top view of the curved surface 1700. FIG. 3C is a cross-sectional view of the curved surface 1700 taken along the plane 1701. When a curved surface is cut by a plane, the radius of curvature of a curve in a cross section differs depending on the angle between the curved surface and the plane or on the cut position, and the smallest radius of curvature is defined as the radius of curvature of a surface in this specification and the like.

Note that the cross-sectional shape of the secondary battery is not limited to a simple arc shape, and the cross section can be partly arc-shaped; for example, a shape illustrated in FIG. 2C, a wavy shape illustrated in FIG. 2D, or an S shape can be used. When the curved surface of the secondary battery has a shape with a plurality of centers of curvature, the secondary battery can change its form in such a range that a curved surface with the smallest radius of curvature among radii of curvature with respect to the plurality of centers of curvature, which is a surface of the exterior body on the side closer to the center of curvature, has a curvature radius of 30 mm, preferably 10 mm.

<<Assembly of Secondary Battery and Aging>>

Figure 1B:
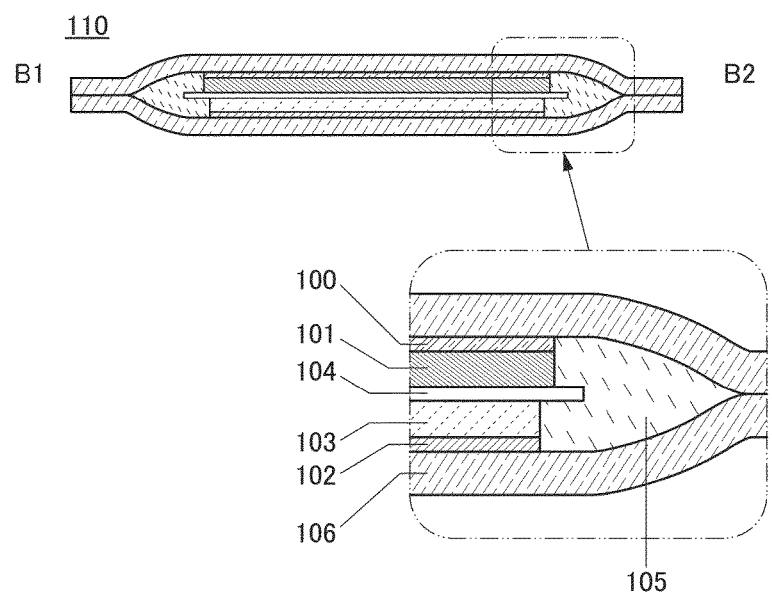

Next, the above components are combined and enclosed in the exterior body 106, so that the positive electrode current collector 100, the positive electrode active material layer 101, the separator 104, the negative electrode active material layer 103, and the negative electrode current collector 102 are stacked and enclosed in the exterior body 106 together with the electrolyte solution 105 as shown in FIGS. 1A and 1B.

Then, an aging step is performed. First, environmental temperature is kept at about room temperature, for example, and constant current charging is performed to a predetermined voltage at a low rate such as a rate lower than or equal to 0.1 C. Next, a gas generated by charging in a region inside the exterior body is released outside the exterior body, and then charging is performed at a higher rate than that of the initial charging.

After that, long-time preservation is performed at high temperatures. In the manufacturing process of the lithium-ion secondary battery of one embodiment of the present invention, the secondary battery is kept at a temperature higher than or equal to 80° C. for 48 hours or longer. When long-time preservation at high temperatures is performed, a dense coating film can be formed on the surface of the negative electrode active material. The film is permeable to Li but not permeable to the other materials; therefore, the capacity retention rate can be prevented from decreasing because the decomposition of the electrolyte solution or the like can be suppressed even in the case of repeating charging and discharging of the secondary battery.

Note that, in one embodiment of the present invention, a long-time preservation step at lower temperatures than that of the above step may be performed before the above step. When the environment temperature rises rapidly to high temperatures, the secondary battery inside is also rapidly changed to be stressed in some cases. Therefore, a 24-hour-preservation step at 40° C. may be performed, for example. Note that the change over time inside the secondary battery is not sufficiently promoted at low temperatures in some cases; therefore, the above high-temperature step is performed after that.

When the secondary battery which has been repeatedly charged and discharged is disassembled and analyzed, a coating film is found on the surface of the negative electrode. In the lithium-ion secondary battery of one embodiment of the present invention, after the long-time preservation step at high temperatures in the fabrication, such a coating film is observed on the surface of the negative electrode. The coating film is thicker and contains a large amount of oxygen bonded with lithium.

In the fabrication of the lithium-ion secondary battery of one embodiment of the present invention, a dense film can be formed on the surface of the negative electrode active material in the long-time preservation step at high temperatures. The film is permeable to Li but not permeable to the other materials; therefore, the capacity retention rate can be prevented from decreasing because the decomposition of the electrolyte solution or the like can be suppressed even in the case of repeating charging and discharging of the secondary battery.

After the long-time preservation at high temperatures, a gas generated in the region inside the exterior body is released again. Furthermore, at room temperature, the secondary battery is discharged at a rate of 0.2 C, charged at the same rate, discharged at the same rate, further charged at the same rate, discharged at the same rate again, and charged at the same rate. Then, discharging is performed at the same rate, which is the end of the aging step.

In this embodiment, one embodiment of the present invention has been described. Other embodiments of the present invention are described in other embodiments. Note that one embodiment of the present invention is not limited thereto. In other words, various embodiments of the invention are described in this embodiment and the other embodiments, and one embodiment of the present invention is not limited to a particular embodiment. For example, although an example of use in a lithium-ion secondary battery is described in this embodiment, one embodiment of the present invention is not limited thereto. Depending on circumstances or conditions, application of one embodiment of the present invention to a variety of secondary batteries such as a lead secondary battery, a lithium-ion polymer secondary battery, a nickel-hydrogen battery, a nickel-cadmium storage battery, a nickel-iron battery, a nickel-zinc battery, a silver oxide-zinc battery, a solid-state battery, and an air battery is also possible. Application to a variety of power storage devices such as a primary battery, a capacitor, and a lithium-ion capacitor is also possible. Depending on circumstances or conditions, one embodiment of the present invention is not necessarily applied to a lithium-ion secondary battery, for example. The case where lithium oxide is provided on a surface of a negative electrode is described; however, one embodiment of the present invention is not limited to this. Depending on circumstances or conditions, it is acceptable that a variety of materials are provided on the surface of the negative electrode of one embodiment of the present invention. Depending on circumstances or conditions, lithium oxide is not necessarily provided on the surface of the negative electrode of one embodiment of the present invention.

This embodiment can be implemented in appropriate combination with any of the other embodiments and examples.

Embodiment 2

In this embodiment, structures of a lithium-ion secondary battery of one embodiment of the present invention will be described with reference to FIGS. 4A to 4C, FIGS. 5A and 5B, and FIGS. 6A and 6B.

[Coin-Type Secondary Battery]

Figure 4A:
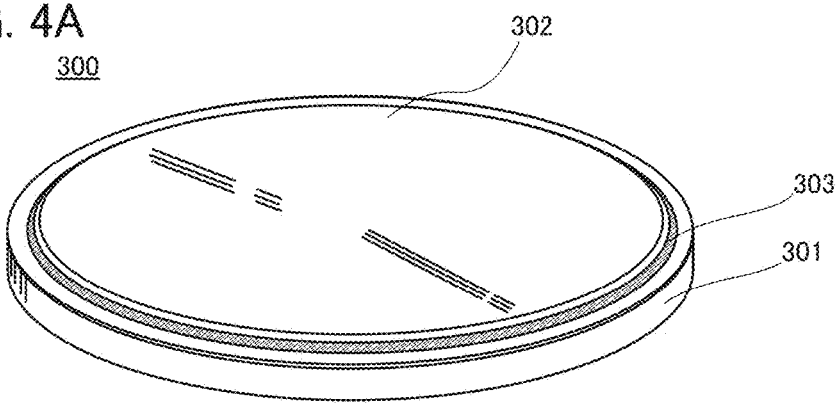
FIGS. 4A to 4C illustrate a coin-type secondary battery.
Figure 4B:
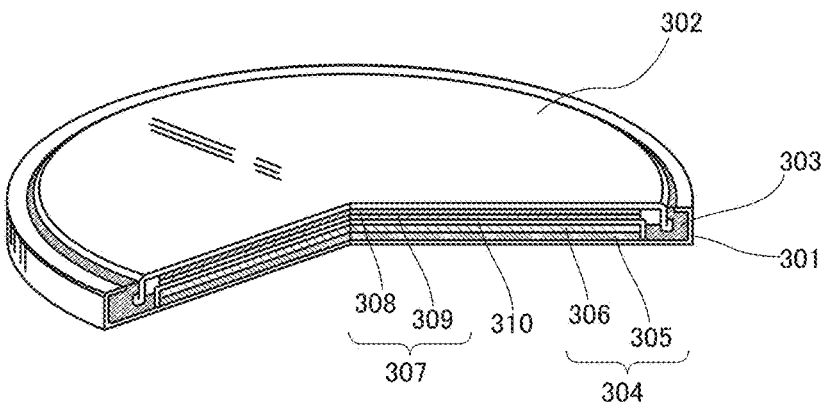

FIG. 4A is an external view of a coin-type (single-layer flat type) secondary battery, and FIG. 4B is a cross-sectional view thereof.

In a coin-type secondary battery 300, a positive electrode can 301 doubling as a positive electrode terminal and a negative electrode can 302 doubling as a negative electrode terminal are insulated from each other and sealed by a gasket 303 made of polypropylene or the like. A positive electrode 304 includes a positive electrode current collector 305 and a positive electrode active material layer 306 provided in contact with the positive electrode current collector 305. The positive electrode active material layer 306 may further include a binder for increasing adhesion of positive electrode active materials, a conductive additive for increasing the conductivity of the positive electrode active material layer, and the like in addition to the positive electrode active materials.

A negative electrode 307 includes a negative electrode current collector 308 and a negative electrode active material layer 309 provided in contact with the negative electrode current collector 308. The negative electrode active material layer 309 may further include a binder for increasing adhesion of negative electrode active materials, a conductive additive for increasing the conductivity of the negative electrode active material layer, and the like in addition to the negative electrode active materials. A separator 310 and an electrolyte solution (not illustrated) are provided between the positive electrode active material layer 306 and the negative electrode active material layer 309.

The materials described in Embodiment 1 can be used for the components.

For the positive electrode can 301 and the negative electrode can 302, a metal having a corrosion-resistant property to an electrolyte solution, such as nickel, aluminum, or titanium, an alloy of such a metal, or an alloy of such a metal and another metal (e.g., stainless steel or the like) can be used. Alternatively, the positive electrode can 301 and the negative electrode can 302 are preferably covered with nickel, aluminum, or the like in order to prevent corrosion due to the electrolyte solution. The positive electrode can 301 and the negative electrode can 302 are electrically connected to the positive electrode 304 and the negative electrode 307, respectively.

The negative electrode 307, the positive electrode 304, and the separator 310 are immersed in the electrolyte solution. Then, as illustrated in FIG. 4B, the positive electrode 304, the separator 310, the negative electrode 307, and the negative electrode can 302 are stacked in this order with the positive electrode can 301 positioned at the bottom, and the positive electrode can 301 and the negative electrode can 302 are subjected to pressure bonding with the gasket 303 interposed therebetween. In such a manner, the coin-type secondary battery 300 can be fabricated.

Here, a current flow in charging a secondary battery will be described with reference to FIG. 4C. When a secondary battery using lithium is regarded as a closed circuit, lithium ions transfer and a current flows in the same direction. Note that in the secondary battery using lithium, an anode and a cathode change places in charging and discharging, and an oxidation reaction and a reduction reaction occur on the corresponding sides; hence, an electrode with a high reaction potential is called a positive electrode and an electrode with a low reaction potential is called a negative electrode. For this reason, in this specification, the positive electrode is referred to as a "positive electrode" or a "plus electrode" and the negative electrode is referred to as a "negative electrode" or a "minus electrode" in all the cases where charging is performed, discharging is performed, a reverse pulse current is supplied, and a charging current is supplied. The use of the terms "anode" and "cathode" related to an oxidation reaction and a reduction reaction might cause confusion because the anode and the cathode change places at the time of charging and discharging. Thus, the terms "anode" and "cathode" are not used in this specification. If the term "anode" or "cathode" is used, it should be mentioned that the anode or the cathode is which of the one at the time of charging or the one at the time of discharging and corresponds to which of a positive electrode or a negative electrode.

Figure 4C:
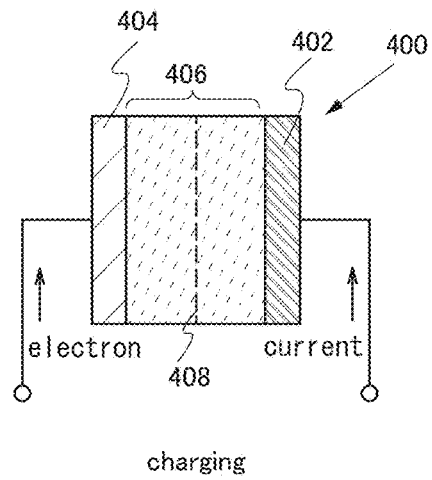

A secondary battery 400 in FIG. 4C includes a positive electrode 402, a negative electrode 404, an electrolyte solution 406, and a separator 408. Two terminals shown in FIG. 4C are connected to a charger, and the secondary battery 400 is charged. As the charging of the secondary battery 400 proceeds, a potential difference between electrodes increases. The positive direction in FIG. 4C is the direction in which a current flows from one terminal outside the secondary battery 400 to the positive electrode 402, flows from the positive electrode 402 to the negative electrode 404 in the secondary battery 400, and flows from the negative electrode 404 to the other terminal outside the secondary battery 400. In other words, the direction of a charging current is the direction of a flow of a current.

[Cylindrical Secondary Battery]

Figure 5A:
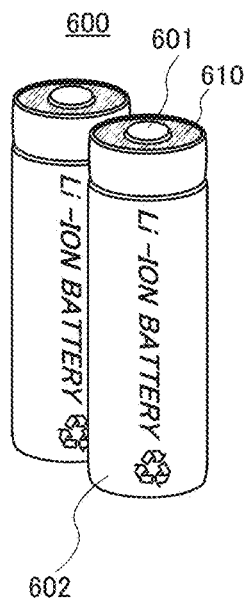
FIGS. 5A and 5B illustrate a cylindrical secondary battery.

Next, an example of a cylindrical secondary battery will be described with reference to FIGS. 5A and 5B. As illustrated in FIG. 5A, a cylindrical secondary battery 600 includes a positive electrode cap (battery cap) 601 on the top surface and a battery can (outer can) 602 on the side surface and bottom surface. The positive electrode cap 601 and the battery can 602 are insulated from each other by a gasket (insulating gasket) 610.

Figure 5B:
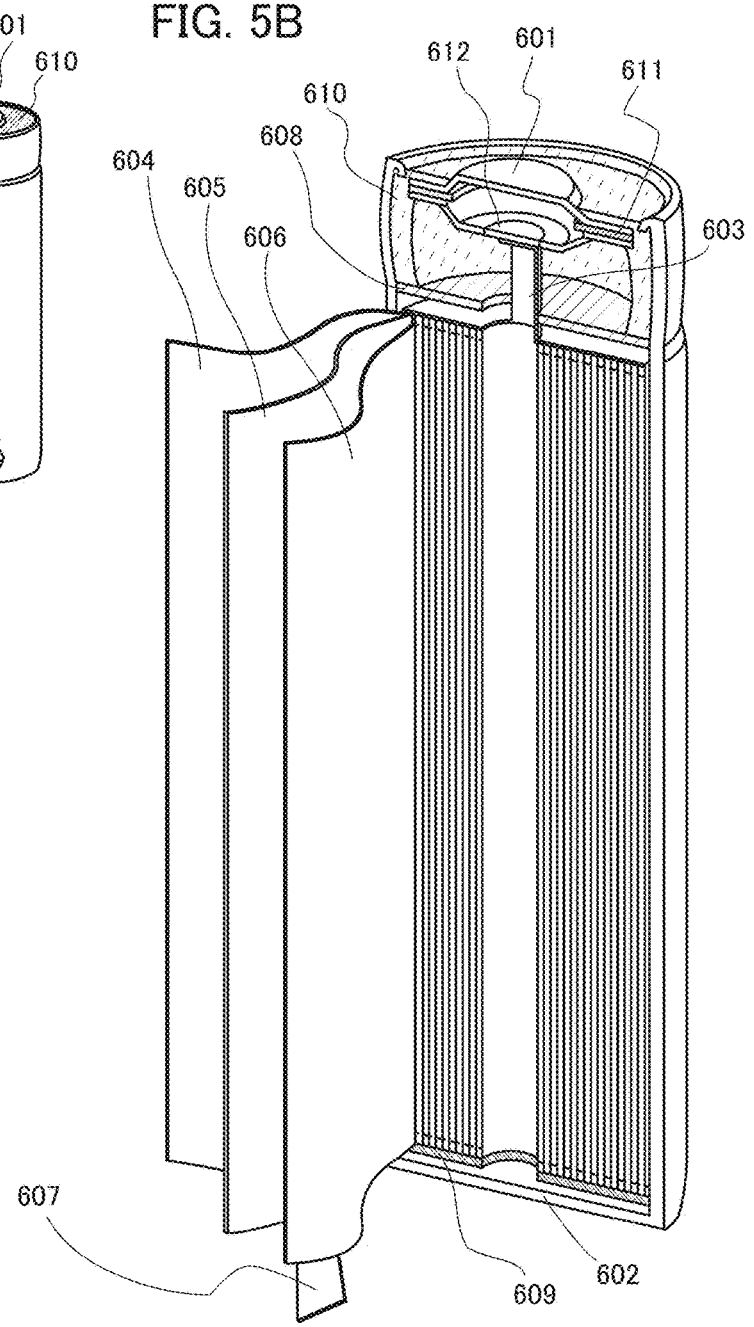

FIG. 5B is a diagram schematically illustrating a cross section of the cylindrical secondary battery. Inside the battery can 602 having a hollow cylindrical shape, a battery element in which a strip-like positive electrode 604 and a strip-like negative electrode 606 are wound with a strip-like separator 605 interposed therebetween is provided. Although not illustrated, the battery element is wound around a center pin. One end of the battery can 602 is close and the other end thereof is open. For the battery can 602, a metal having a corrosion-resistant property to an electrolyte solution, such as nickel, aluminum, or titanium, an alloy of such a metal, or an alloy of such a metal and another metal (e.g., stainless steel or the like) can be used. Alternatively, the battery can 602 is preferably covered with nickel, aluminum, or the like in order to prevent corrosion due to the electrolyte solution. Inside the battery can 602, the battery element in which the positive electrode, the negative electrode, and the separator are wound is provided between a pair of insulating plates 608 and 609 which face each other. Furthermore, a nonaqueous electrolyte solution (not illustrated) is injected inside the battery can 602 provided with the battery element. As the nonaqueous electrolyte solution, a nonaqueous electrolyte solution that is similar to that of the coin-type secondary battery can be used.

Although the positive electrode 604 and the negative electrode 606 can be formed in a manner similar to that of the positive electrode and the negative electrode of the coin-type secondary battery described above, the difference lies in that, since the positive electrode and the negative electrode of the cylindrical secondary battery are wound, active materials are formed on both sides of the current collectors. A positive electrode terminal (positive electrode current collecting lead) 603 is connected to the positive electrode 604, and a negative electrode terminal (negative electrode current collecting lead) 607 is connected to the negative electrode 606. Both the positive electrode terminal 603 and the negative electrode terminal 607 can be formed using a metal material such as aluminum. The positive electrode terminal 603 and the negative electrode terminal 607 are resistance-welded to a safety valve mechanism 612 and the bottom of the battery can 602, respectively. The safety valve mechanism 612 is electrically connected to the positive electrode cap 601 through a positive temperature coefficient (PTC) element 611. The safety valve mechanism 612 cuts off electrical connection between the positive electrode cap 601 and the positive electrode 604 when the internal pressure of the battery exceeds a predetermined threshold value. The PTC element 611, which serves as a thermally sensitive resistor whose resistance increases as temperature rises, limits the amount of current by increasing the resistance, in order to prevent abnormal heat generation. Note that barium titanate ($BaTiO_3$)-based semiconductor ceramic can be used for the PTC element.

[Laminated Secondary Battery]

Next, an example of a laminated secondary battery will be described with reference to FIG. 6A. When a flexible laminated secondary battery is used in an electronic device at least part of which is flexible, the secondary battery can be bent as the electronic device is bent.

Figure 6A:
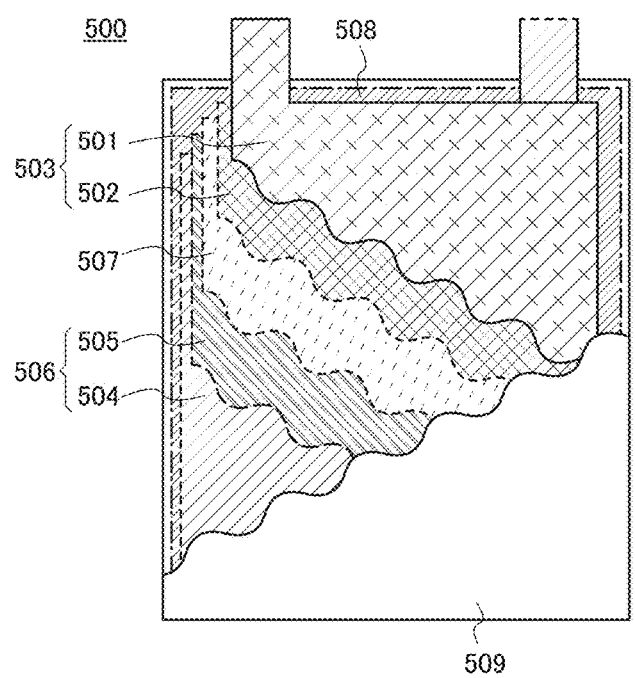
FIGS. 6A and 6B illustrate a laminated secondary battery.

A laminated secondary battery 500 illustrated in FIG. 6A includes a positive electrode 503 including a positive electrode current collector 501 and a positive electrode active material layer 502, a negative electrode 506 including a negative electrode current collector 504 and a negative electrode active material layer 505, a separator 507, an electrolyte solution 508, and an exterior body 509. The separator 507 is provided between the positive electrode 503 and the negative electrode 506 in the exterior body 509. The exterior body 509 is filled with the electrolyte solution 508. The electrolyte solution described in Embodiment 1 can be used for the electrolyte solution 508.

In the laminated secondary battery 500 illustrated in FIG. 6A, the positive electrode current collector 501 and the negative electrode current collector 504 also serve as terminals for an electrical contact with an external portion. For this reason, each of the positive electrode current collector 501 and the negative electrode current collector 504 may be arranged so that part of the positive electrode current collector 501 and part of the negative electrode current collector 504 are exposed to the outside of the exterior body 509. Alternatively, a lead and the positive electrode current collector 501 or the negative electrode current collector 504 may be bonded to each other by ultrasonic welding, and instead of the positive electrode current collector 501 and the negative electrode current collector 504, the lead may be exposed to the outside of the exterior body 509.

As the exterior body 509 in the laminated secondary battery 500, for example, a laminate film having a three-layer structure in which a highly flexible metal thin film of aluminum, stainless steel, copper, nickel, or the like is provided over a film formed of a material such as polyethylene, polypropylene, polycarbonate, ionomer, or polyamide, and an insulating synthetic resin film of a polyamide-based resin, a polyester-based resin, or the like is provided as the outer surface of the exterior body over the metal thin film can be used.

Figure 6B:
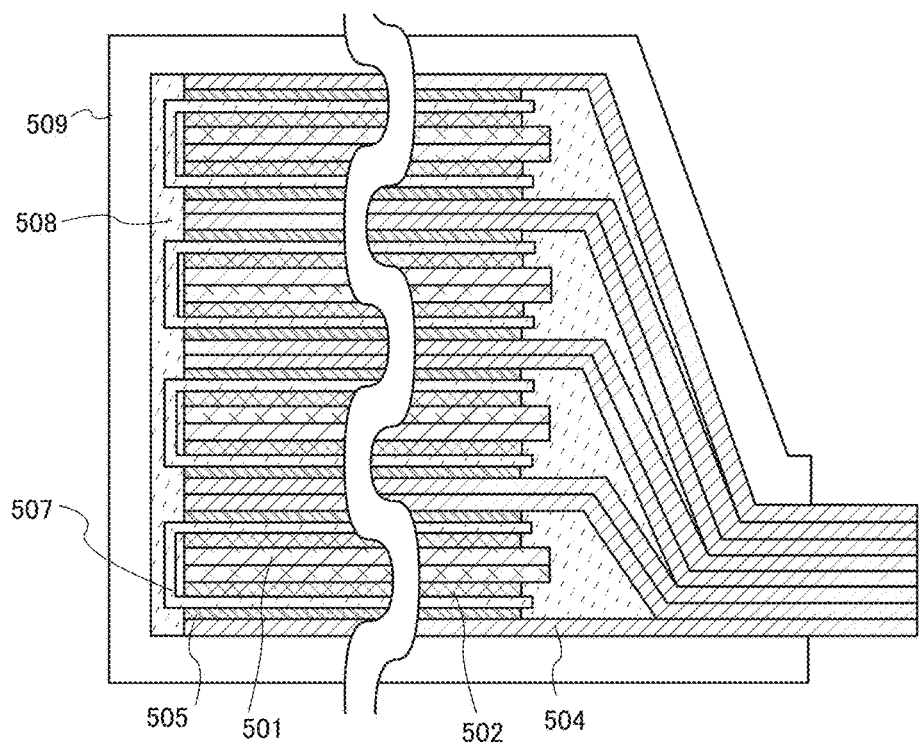

FIG. 6B illustrates an example of a cross-sectional structure of the laminated secondary battery 500. FIG. 6A illustrates an example of including only two current collectors for simplicity, and the actual battery includes a plurality of electrode layers.

The example in FIG. 6B includes 16 electrode layers. The laminated secondary battery 500 has flexibility even though including 16 electrode layers. In FIG. 6B, 8 negative electrode current collectors 504 and 8 positive electrode current collectors 501 are included. Note that FIG. 6B illustrates a cross section of the lead portion of the negative electrode, and 8 negative electrode current collectors 504 are bonded to each other by ultrasonic welding. It is needless to say that the number of electrode layers is not limited to 16, and may be more than 16 or less than 16. In the case of using a large number of electrode layers, the secondary battery can have high capacity. In contrast, in the case of using a small number of electrode layers, the secondary battery can have a small thickness and high flexibility.

Figure 7:
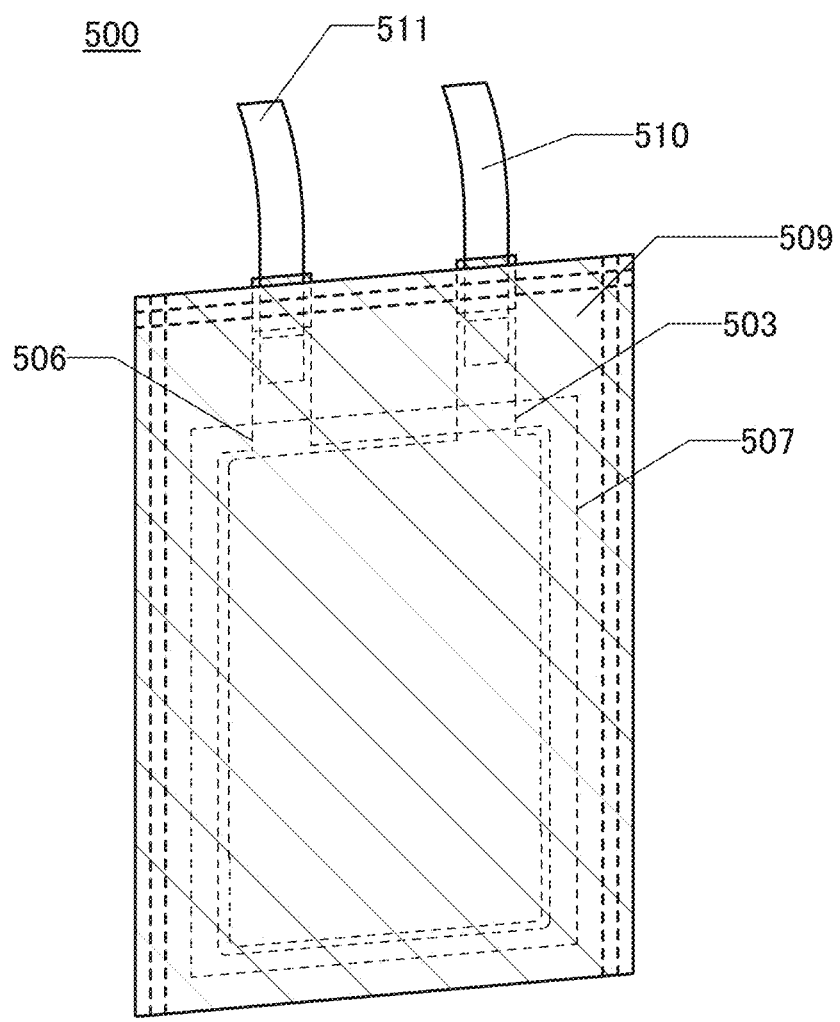
FIG. 7 is an external view of a secondary battery.

FIGS. 7 and 8 each illustrate an example of the external view of the laminated secondary battery 500. In FIGS. 7 and 8, the positive electrode 503, the negative electrode 506, the separator 507, the exterior body 509, a positive electrode lead 510, and a negative electrode lead 511 are included.

Figure 9A:
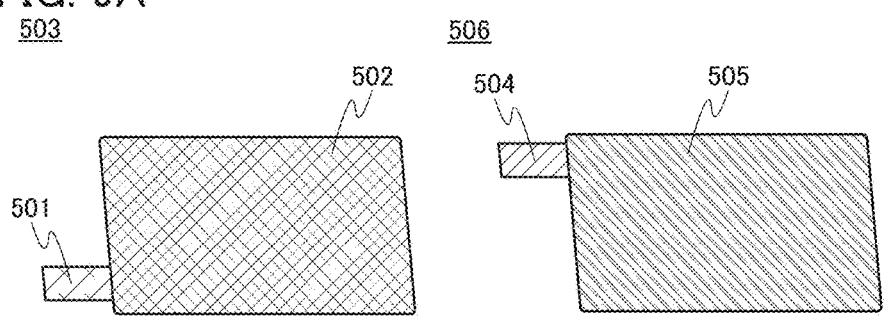
FIGS. 9A to 9C illustrate a fabricating method of a secondary battery.

FIG. 9A illustrates the external views of the positive electrode 503 and the negative electrode 506. The positive electrode 503 includes the positive electrode current collector 501, and the positive electrode active material layer 502 is formed on a surface of the positive electrode current collector 501. The positive electrode 503 also includes a region where the positive electrode current collector 501 is partly exposed (hereinafter also referred to as a tab region). The negative electrode 506 includes the negative electrode current collector 504, and the negative electrode active material layer 505 is formed on a surface of the negative electrode current collector 504. The negative electrode 506 also includes a region where the negative electrode current collector 504 is partly exposed, that is, a tab region. The areas and shapes of the tab regions included in the positive electrode and negative electrode are not limited to those illustrated in FIG. 9A.

[Fabricating Method of Laminated Secondary Battery]

Figure 9B:
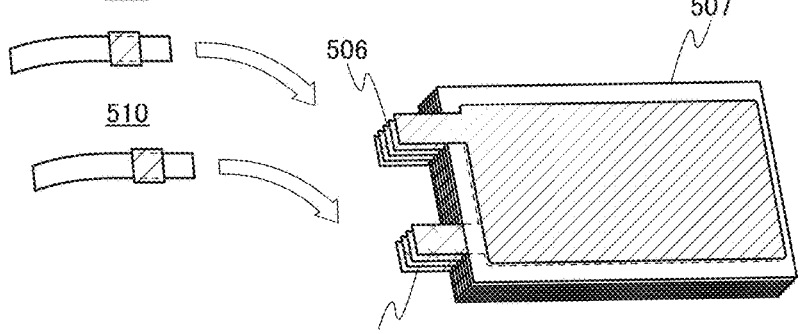

Here, an example of a fabricating method of the laminated secondary battery whose external view is illustrated in FIG. 7 will be described with reference to FIGS. 9B and 9C.

First, the negative electrode 506, the separator 507, and the positive electrode 503 are stacked. FIG. 9B illustrates a stack including the negative electrode 506, the separator 507, and the positive electrode 503. The battery described here as an example includes 5 negative electrodes and 4 positive electrodes. Next, the tab regions of the positive electrodes 503 are bonded to each other, and the tab region of the positive electrode of the outermost surface and the positive electrode lead 510 are bonded to each other. The bonding can be performed by ultrasonic welding, for example. In a similar manner, the tab regions of the negative electrodes 506 are bonded to each other, and the tab region of the negative electrode of the outermost surface and the negative electrode lead 511 are bonded to each other.

After that, the negative electrode 506, the separator 507, and the positive electrode 503 are placed over the exterior body 509.

Figure 9C:
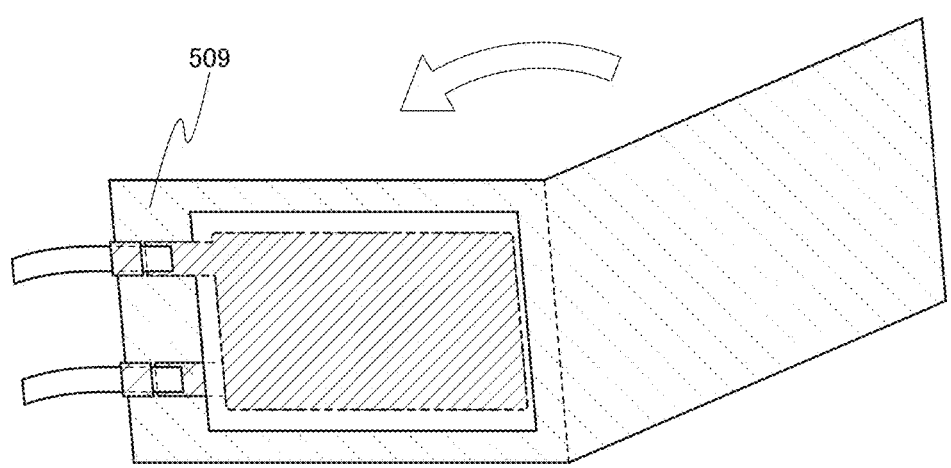

Subsequently, the exterior body 509 is folded along a dashed line as illustrated in FIG. 9C. Then, the outer edge of the exterior body 509 is bonded. The bonding can be performed by thermocompression, for example. At this time, a part (or one side) of the exterior body 509 is left unbonded (to provide an inlet) so that the electrolyte solution 508 can be introduced later.

Next, the electrolyte solution 508 is introduced into the exterior body 509 from the inlet of the exterior body 509. The electrolyte solution 508 is preferably introduced in a reduced pressure atmosphere or in an inert gas atmosphere. Lastly, the inlet is bonded. In the above manner, the laminated secondary battery 500 can be fabricated.

Note that, in this embodiment, the coin-type secondary battery, the laminated secondary battery, and the cylindrical secondary battery are given as examples of the secondary battery; however, any of secondary batteries with a variety of shapes, such as a sealed secondary battery and a square-type secondary battery, can be used. Furthermore, a structure in which a plurality of positive electrodes, a plurality of negative electrodes, and a plurality of separators are stacked or wound may be employed.

For each of the positive electrode active material layers and the electrolytes of the secondary batteries 300, 500, and 600, which are described in this embodiment, the positive electrode active material layer and the electrolyte of one embodiment of the present invention are used. Thus, the cycle life of the secondary batteries 300, 500, and 600 can be increased.

FIGS. 10A to 10E illustrate examples of electronic devices including flexible laminated secondary batteries. Examples of electronic devices each including a flexible power storage device include television devices (also referred to as televisions or television receivers), monitors of computers or the like, cameras such as digital cameras and digital video cameras, digital photo frames, mobile phones (also referred to as cellular phones or mobile phone devices), portable game machines, portable information terminals, audio reproducing devices, and large game machines such as pachinko machines.

In addition, a flexible power storage device can be incorporated along a curved inside/outside wall surface of a house or a building or a curved interior/exterior surface of an automobile.

FIG. 10A illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 includes a power storage device 7407.

FIG. 10B illustrates the mobile phone 7400 that is bent. When the whole mobile phone 7400 is bent by the external force, the power storage device 7407 included in the mobile phone 7400 is also bent. FIG. 10C illustrates the bent power storage device 7407. The power storage device 7407 is a laminated secondary battery.

FIG. 10D illustrates an example of a bangle display device. A portable display device 7100 includes a housing 7101, a display portion 7102, an operation button 7103, and a power storage device 7104. FIG. 10E illustrates the bent power storage device 7104.

[Structural Example of Power Storage Device]

Structural examples of power storage devices will be described with reference to FIGS. 11A and 11B, FIGS. 12A1, 12A2, 12B1, and 12B2, FIGS. 13A and 13B, FIGS. 14A and 14B, and FIG. 15.

Figure 11A:
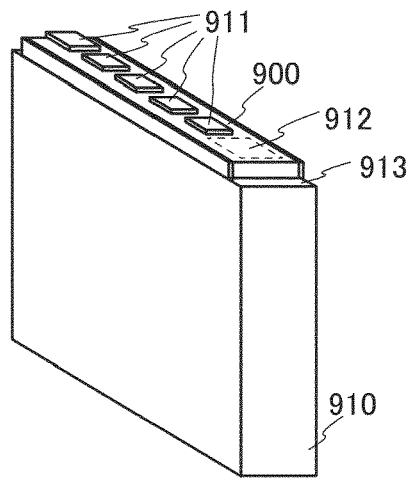
FIGS. 11A and 11B illustrate examples of power storage devices.
Figure 11B:
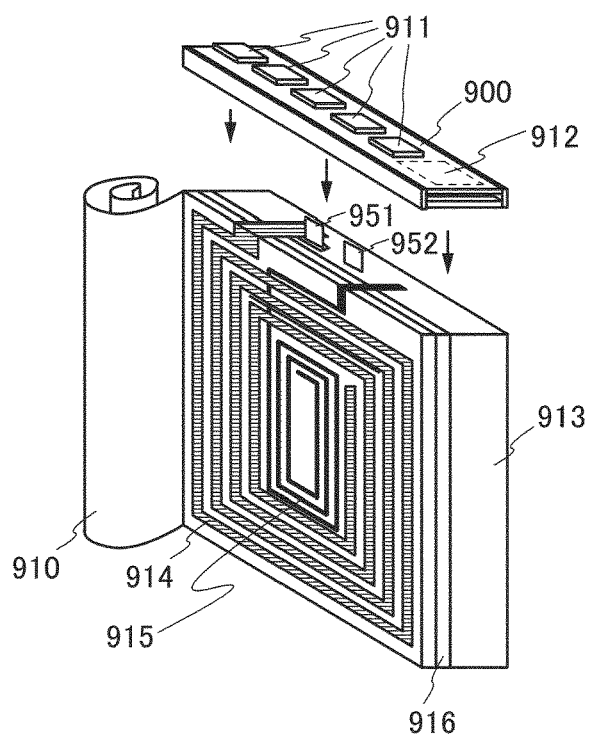

FIGS. 11A and 11B are external views of a power storage device. The power storage device includes a circuit board 900 and a secondary battery 913. A label 910 is attached to the secondary battery 913. As shown in FIG. 11B, the power storage device further includes a terminal 951, a terminal 952, an antenna 914, and an antenna 915.

The circuit board 900 includes terminals 911 and a circuit 912. The terminals 911 are connected to the terminals 951 and 952, the antennas 914 and 915, and the circuit 912. Note that a plurality of terminals 911 serving as a control signal input terminal, a power supply terminal, and the like may be provided.

The circuit 912 may be provided on the rear surface of the circuit board 900. The shape of each of the antennas 914 and 915 is not limited to a coil shape and may be a linear shape or a plate shape. Furthermore, a planar antenna, an aperture antenna, a traveling-wave antenna, an EH antenna, a magnetic-field antenna, a dielectric antenna, or the like may be used. Alternatively, the antenna 914 or the antenna 915 may be a flat-plate conductor. The flat-plate conductor can serve as one of conductors for electric field coupling. That is, the antenna 914 or the antenna 915 can serve as one of two conductors of a capacitor. Thus, electric power can be transmitted and received not only by an electromagnetic field or a magnetic field but also by an electric field.

The line width of the antenna 914 is preferably larger than that of the antenna 915. This makes it possible to increase the amount of electric power received by the antenna 914.

The power storage device includes a layer 916 between the secondary battery 913 and the antennas 914 and 915. The layer 916 may have a function of preventing an adverse effect on an electromagnetic field by the secondary battery 913. As the layer 916, for example, a magnetic body can be used.

Note that the structure of the power storage device is not limited to that shown in FIGS. 11A and 11B.

Figures 1, 12A:
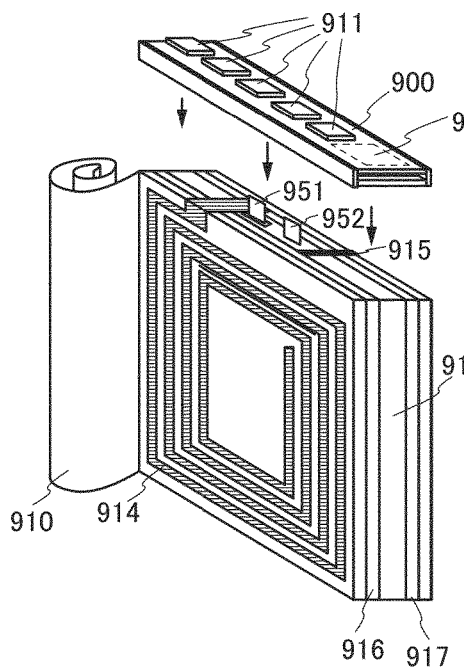
FIGS. 12A1, 12A2, 12B1, and 12B2 illustrate examples of power storage devices.
Figures 2, 12A:
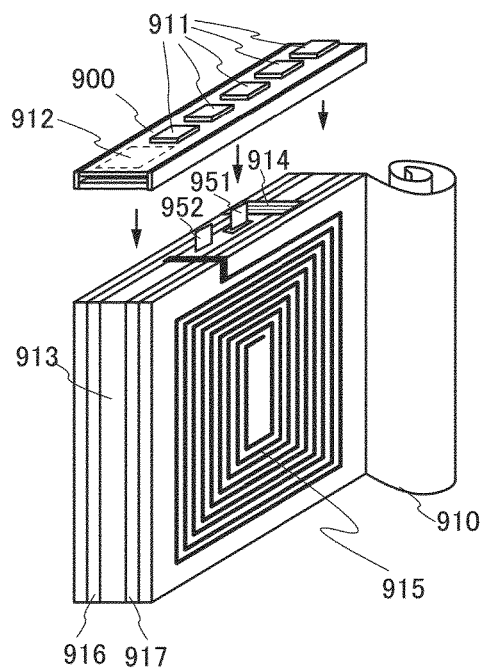

For example, as shown in FIGS. 12A1 and 12A2, two opposite surfaces of the secondary battery 913 in FIGS. 11A and 11B may be provided with respective antennas. FIG. 12A1 is an external view showing one side of the opposite surfaces, and FIG. 12A2 is an external view showing the other side of the opposite surfaces. For portions similar to those in FIGS. 11A and 11B, a description of the power storage device illustrated in FIGS. 11A and 11B can be referred to as appropriate.

As illustrated in FIG. 12A1, the antenna 914 is provided on one of the opposite surfaces of the secondary battery 913 with the layer 916 interposed therebetween, and as illustrated in FIG. 12A2, the antenna 915 is provided on the other of the opposite surfaces of the secondary battery 913 with a layer 917 interposed therebetween. The layer 917 may have a function of preventing an adverse effect on an electromagnetic field by the secondary battery 913, for example. As the layer 917, for example, a magnetic body can be used.

With the above structure, both of the antennas 914 and 915 can be increased in size.

Figures 1, 12B:
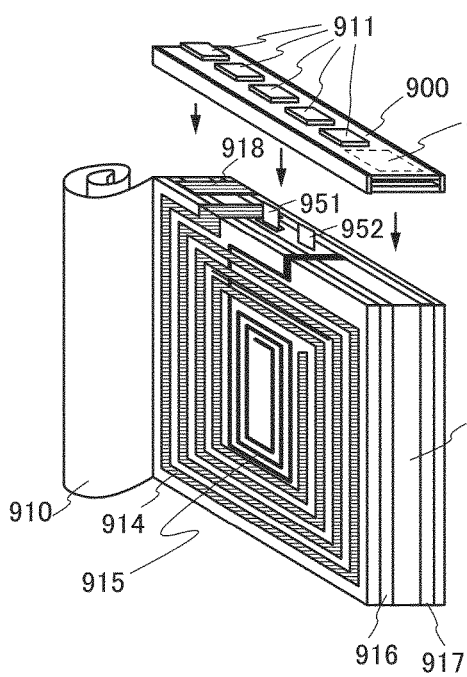
Figures 2, 12B:
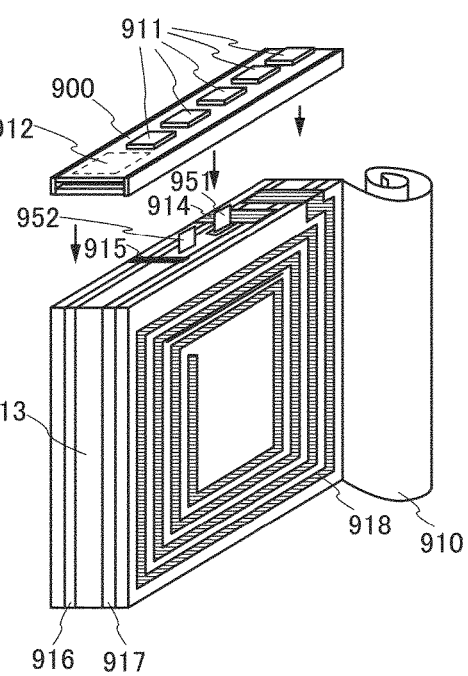

Alternatively, as illustrated in FIGS. 12B1 and 12B2, two opposite surfaces of the secondary battery 913 in FIGS. 11A and 11B may be provided with different types of antennas. FIG. 12B1 is an external view showing one side of the opposite surfaces, and FIG. 12B2 is an external view showing the other side of the opposite surfaces. For portions similar to those in FIGS. 11A and 11B, a description of the power storage device illustrated in FIGS. 11A and 11B can be referred to as appropriate.

As illustrated in FIG. 12B1, the antennas 914 and 915 are provided on one of the opposite surfaces of the secondary battery 913 with the layer 916 interposed therebetween, and as illustrated in FIG. 12B2, an antenna 918 is provided on the other of the opposite surfaces of the secondary battery 913 with the layer 917 interposed therebetween. The antenna 918 has a function of communicating data with an external device, for example. An antenna with a shape that can be applied to the antennas 914 and 915, for example, can be used as the antenna 918. As a system for communication using the antenna 918 between the power storage device and another device, a response method that can be used between the power storage device and another device, such as NFC, can be employed.

Figure 13A:
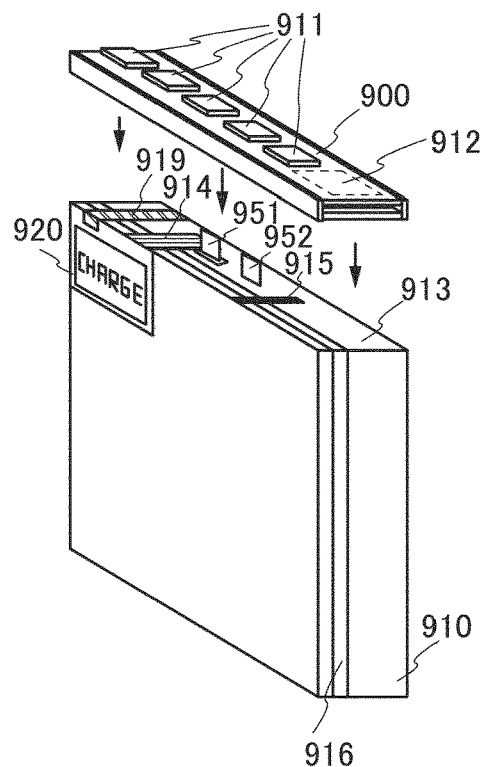
FIGS. 13A and 13B illustrate examples of power storage devices.

Alternatively, as illustrated in FIG. 13A, the secondary battery 913 in FIGS. 11A and 11B may be provided with a display device 920. The display device 920 is electrically connected to the terminal 911 via a terminal 919. It is possible that the label 910 is not provided in a portion where the display device 920 is provided. For portions similar to those in FIGS. 11A and 11B, a description of the power storage device illustrated in FIGS. 11A and 11B can be referred to as appropriate.

The display device 920 can display, for example, an image showing whether charging is being carried out, an image showing the amount of stored power, or the like. As the display device 920, electronic paper, a liquid crystal display device, an electroluminescent (EL) display device, or the like can be used. For example, the use of electronic paper can reduce power consumption of the display device 920.

Figure 13B:
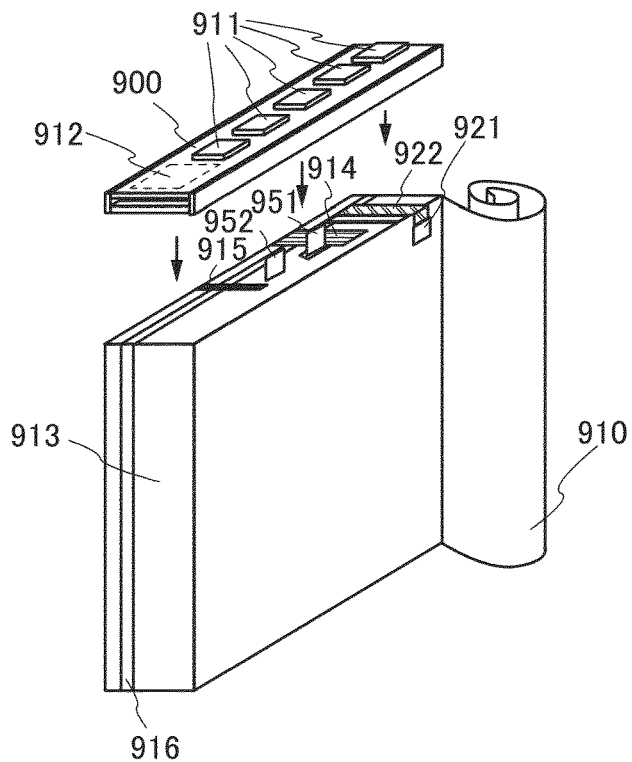

Alternatively, as illustrated in FIG. 13B, the secondary battery 913 illustrated in FIGS. 11A and 11B may be provided with a sensor 921. The sensor 921 is electrically connected to the terminal 911 via a terminal 922. For portions similar to those in FIGS. 11A and 11B, a description of the power storage device illustrated in FIGS. 11A and 11B can be referred to as appropriate.

The sensor 921 has a function of measuring, for example, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays. With the sensor 921, for example, data on an environment (e.g., temperature) where the power storage device is placed can be determined and stored in a memory inside the circuit 912.

Furthermore, structural examples of the secondary battery 913 will be described with reference to FIGS. 14A and 14B and FIG. 15.

Figure 14A:
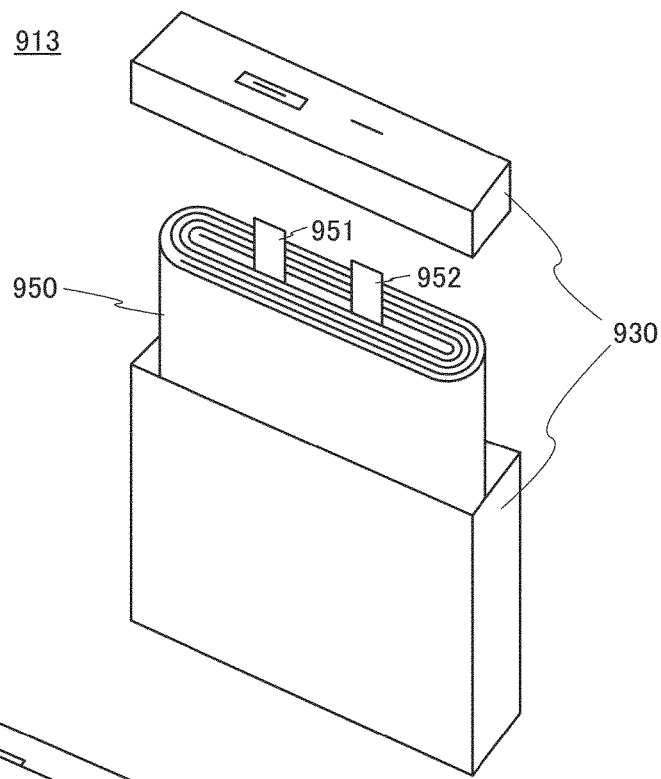
FIGS. 14A and 14B illustrate examples of power storage devices.

The secondary battery 913 illustrated in FIG. 14A includes a wound body 950 provided with the terminals 951 and 952 inside a housing 930. The wound body 950 is soaked in an electrolyte solution inside the housing 930. The terminal 952 is in contact with the housing 930. An insulator or the like prevents contact between the terminal 951 and the housing 930. Note that in FIG. 14A, the housing 930 divided into two pieces is illustrated for convenience; however, in the actual structure, the wound body 950 is covered with the housing 930 and the terminals 951 and 952 extend to the outside of the housing 930. For the housing 930, a metal material (e.g., aluminum) or a resin material can be used.

Figure 14B:
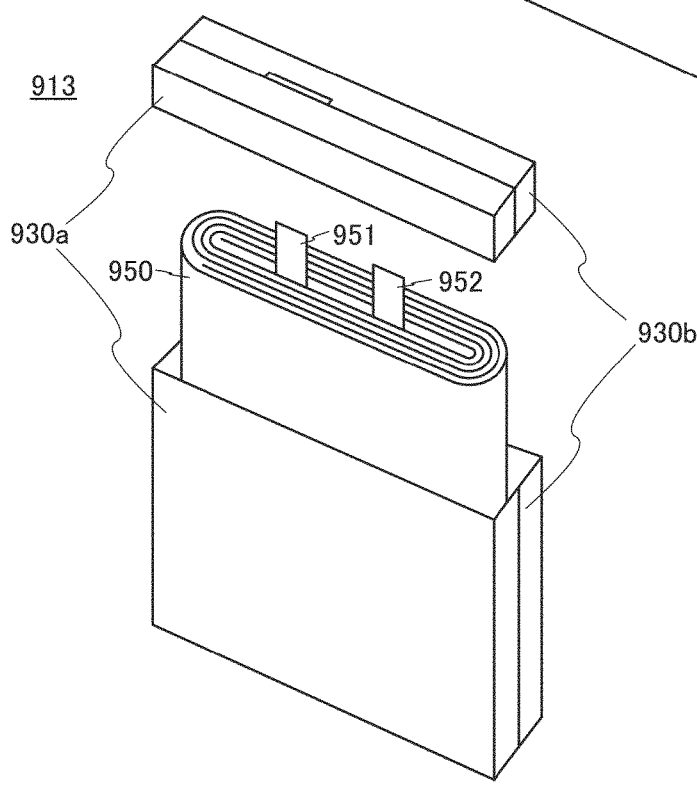

Note that as illustrated in FIG. 14B, the housing 930 in FIG. 14A may be formed using a plurality of materials. For example, in the secondary battery 913 in FIG. 14B, a housing 930a and a housing 930b are bonded to each other and the wound body 950 is provided in a region surrounded by the housing 930a and the housing 930b.

For the housing 930a, an insulating material such as an organic resin can be used. In particular, when a material such as an organic resin is used for the side on which an antenna is formed, blocking of an electric field by the secondary battery 913 can be prevented. When an electric field is not significantly blocked by the housing 930a, an antenna such as the antennas 914 and 915 may be provided inside the housing 930a. For the housing 930b, a metal material can be used, for example.

Figure 15:
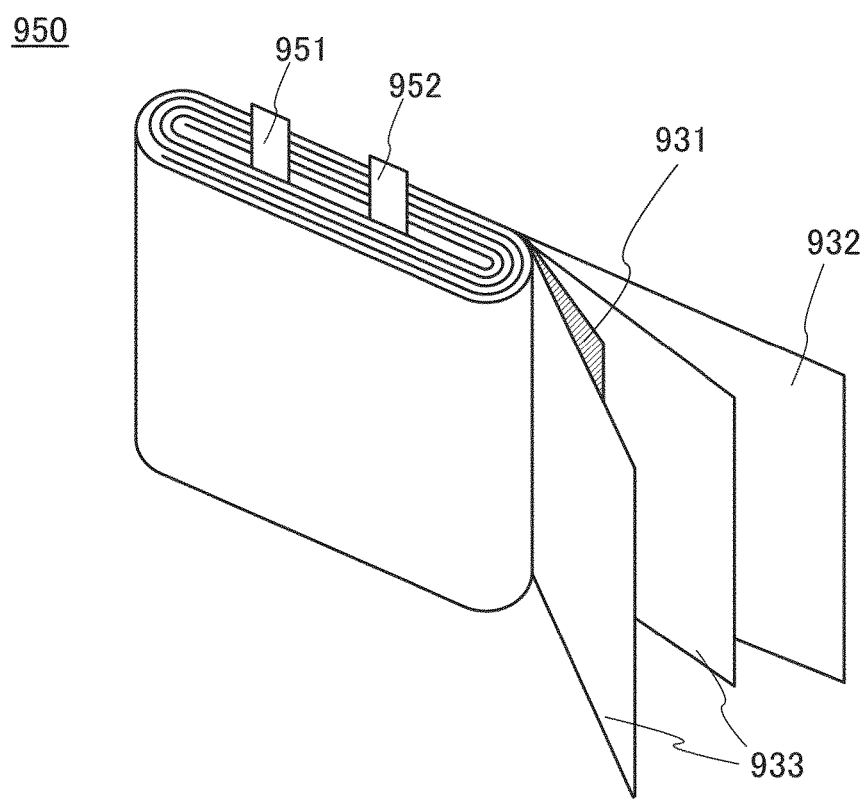
FIG. 15 illustrates an example of a power storage device.

FIG. 15 illustrates the structure of the wound body 950. The wound body 950 includes a negative electrode 931, a positive electrode 932, and separators 933. The wound body 950 is obtained by winding a sheet of a stack in which the negative electrode 931 overlaps with the positive electrode 932 with the separator 933 provided therebetween. Note that a plurality of stacks of the negative electrode 931, the positive electrode 932, and the separator 933 may be stacked.

The negative electrode 931 is connected to the terminal 911 in FIGS. 11A and 11B via one of the terminals 951 and 952. The positive electrode 932 is connected to the terminal 911 in FIGS. 11A and 11B via the other of the terminals 951 and 952.

[Examples of Electrical Devices: Vehicles]

Next, examples where a secondary battery is used in a vehicle will be described. The use of secondary batteries in vehicles enables production of next-generation clean energy vehicles such as hybrid electric vehicles (HEV), electric vehicles (EV), and plug-in hybrid electric vehicles (PHEV).

Figure 16A:
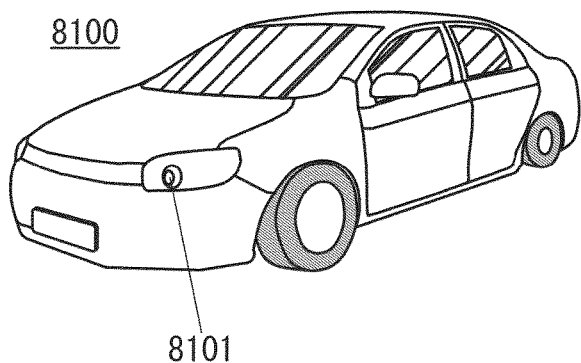
FIGS. 16A and 16B illustrate application examples of power storage devices.
Figure 16B:
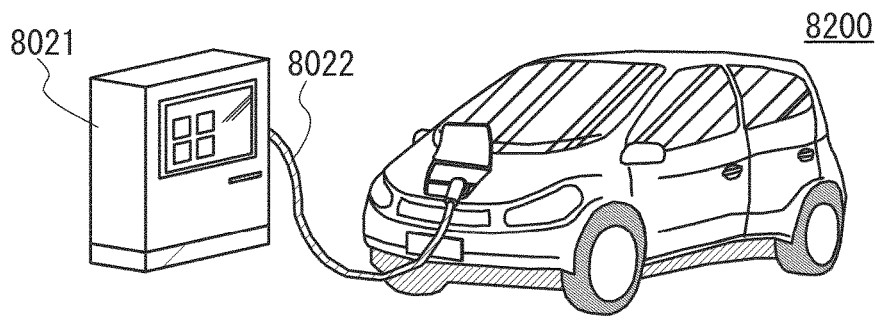

FIGS. 16A and 16B each illustrate an example of a vehicle using one embodiment of the present invention. An automobile 8100 illustrated in FIG. 16A is an electric vehicle that runs on the power of an electric motor. Alternatively, the automobile 8100 is a hybrid electric vehicle capable of driving appropriately using either the electric motor or the engine. One embodiment of the present invention can provide a vehicle which can be repeatedly charged and discharged. The automobile 8100 includes the power storage device. The power storage device is used not only for driving the electric motor, but also for supplying electric power to a light-emitting device such as a headlight 8101 or an interior light (not illustrated).

The power storage device can also supply electric power to a display device of a speedometer, a tachometer, or the like included in the automobile 8100. Furthermore, the power storage device can supply electric power to a semiconductor device included in the automobile 8100, such as a navigation system.

FIG. 16B illustrates an automobile 8200 including the power storage device. The automobile 8200 can be charged when the power storage device is supplied with electric power through external charging equipment by a plug-in system, a contactless power feeding system, or the like. In FIG. 16B, the power storage device included in the automobile 8200 is charged with the use of a ground-based charging apparatus 8021 through a cable 8022. The charging apparatus 8021 may be a charging station provided in a commerce facility or a power source in a house. For example, with the use of a plug-in technique, the power storage device included in the automobile 8200 can be charged by being supplied with electric power from outside. The charging can be performed by converting AC electric power into DC electric power through a converter such as an AC-DC converter.

Furthermore, although not illustrated, the vehicle may include a power receiving device so that it can be charged by being supplied with electric power from an above-ground power transmitting device in a contactless manner. In the case of the contactless power feeding system, by fitting a power transmitting device in a road or an exterior wall, charging can be performed not only when the electric vehicle is stopped but also when driven. In addition, the contactless power feeding system may be utilized to perform transmission and reception of electric power between vehicles. Furthermore, a solar cell may be provided in the exterior of the automobile to charge the power storage device when the automobile stops or moves. To supply electric power in such a contactless manner, an electromagnetic induction method or a magnetic resonance method can be used.

Of one embodiment of the present invention, the power storage device can have improved cycle life and reliability. Furthermore, of one embodiment of the present invention, the power storage device itself can be made more compact and lightweight as a result of improved characteristics of the power storage device. The compact and lightweight power storage device contributes to a reduction in the weight of a vehicle, and thus increases the mileage. Furthermore, the power storage device included in the vehicle can be used as a power source for supplying electric power to products other than the vehicle. In such a case, the use of a commercial power source can be avoided at peak time of electric power demand.

This embodiment can be implemented in appropriate combination with any of the other embodiments.

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

Embodiment 3

A battery management unit (BMU) which can be combined with a battery cell including the materials described in the above embodiment, and a transistor suitable for a circuit included in the battery management unit will be described with reference to FIG. 17, FIGS. 18A to 18C, FIG. 19, FIG. 20, FIGS. 21A to 21C, FIG. 22, and FIG. 23. In this embodiment, a battery management unit of a power storage device including battery cells that are connected in series will be particularly described.

When a plurality of battery cells connected in series are charged and discharged repeatedly, each battery cell has different capacity (and output voltage depending on the capacity) from one another because of the variation in performance among the battery cells. The discharge capacity of all of the battery cells connected in series depends on a battery cell with low capacity. The variation in capacities reduces the capacity of the battery cells at the time of discharging. Charging based on a battery cell with low capacity may cause insufficient charging. Charging based on a battery cell with high capacity may cause overcharge.

Thus, the battery management unit of the power storage device including battery cells connected in series has a function of reducing variation in capacities among the battery cells which causes insufficient charging or overcharge. Although circuit structures for reducing variation in capacities among the battery cells include a resistive type, a capacitor type, and an inductor type, a circuit structure which can reduce variation in capacities among the battery cells using transistors with a low off-state current is explained here as an example.

A transistor including an oxide semiconductor in its channel formation region (an OS transistor) is preferably used as the transistor with a low off-state current. When an OS transistor with a low off-state current is used in the circuit of the battery management unit of the power storage device, the amount of electric charge leaking from a battery can be reduced, and reduction in capacity over time can be suppressed.

As the oxide semiconductor used in the channel formation region, an In-M-Zn oxide (M is Ga, Sn, Y, Zr, La, Ce, or Nd) is used. In the case where the atomic ratio of the metal elements of a target for forming an oxide semiconductor film is In:M:Zn=$x_1$:$y_1$:$z_1$, $x_1$/$y_1$ is preferably greater than or equal to ⅓ and less than or equal to 6, further preferably greater than or equal to 1 and less than or equal to 6, and $z_1$/$y_1$ is preferably greater than or equal to ⅓ and less than or equal to 6, further preferably greater than or equal to 1 and less than or equal to 6. Note that when $z_1$/$y_1$ is greater than or equal to 1 and less than or equal to 6, a CAAC-OS film as the oxide semiconductor film is easily formed.

Here, the details of the CAAC-OS film will be described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary cannot be clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface over which the CAAC-OS film is formed (hereinafter, a surface over which the CAAC-OS film is formed is referred to as a formation surface) or of a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film including an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Since the OS transistor has a wider band gap than a transistor including silicon in its channel formation region (a Si transistor), dielectric breakdown is unlikely to occur when a high voltage is applied. Although a voltage of several hundreds of volts is generated when battery cells are connected in series, the above OS transistor is suitable for a circuit of a battery management unit which is used for such battery cells in the power storage device.

Figure 17:
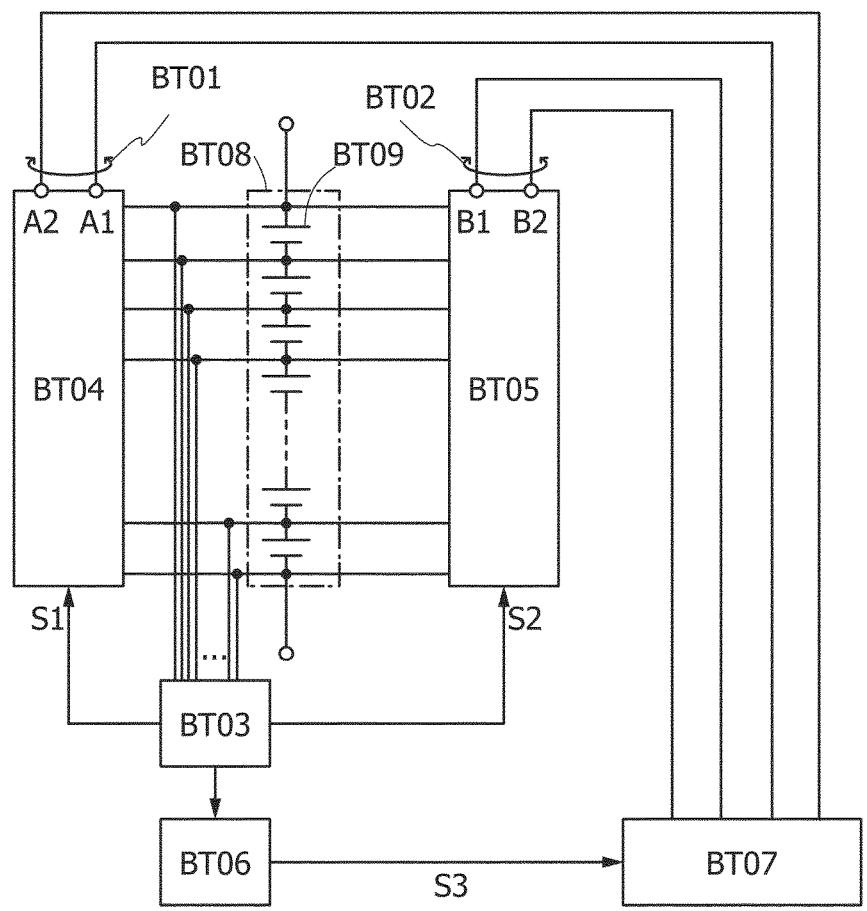
FIG. 17 is a block diagram illustrating one embodiment of the present invention.

FIG. 17 is an example of a block diagram of the power storage device. A power storage device BT00 illustrated in FIG. 17 includes a terminal pair BT01, a terminal pair BT02, a switching control circuit BT03, a switching circuit BT04, a switching circuit BT05, a voltage transformation control circuit BT06, a voltage transformer circuit BT07, and a battery portion BT08 including a plurality of battery cells BT09 connected in series.

In the power storage device BT00 illustrated in FIG. 17, a portion including the terminal pair BT01, the terminal pair BT02, the switching control circuit BT03, the switching circuit BT04, the switching circuit BT05, the voltage transformation control circuit BT06, and the voltage transformer circuit BT07 can be referred to as a battery management unit.

The switching control circuit BT03 controls operations of the switching circuits BT04 and BT05. Specifically, the switching control circuit BT03 selects battery cells to be discharged (a discharge battery cell group) and battery cells to be charged (a charge battery cell group) in accordance with voltage measured for every battery cell BT09.

Furthermore, the switching control circuit BT03 outputs a control signal S1 and a control signal S2 on the basis of the selected discharge battery cell group and the selected charge battery cell group. The control signal S1 is output to the switching circuit BT04. The control signal S1 controls the switching circuit BT04 so that the terminal pair BT01 and the discharge battery cell group are connected. In addition, the control signal S2 is output to the switching circuit BT05.

The control signal S2 controls the switching circuit BT05 so that the terminal pair BT02 and the charge battery cell group are connected.

The switching control circuit BT03 generates the control signal S1 and the control signal S2 on the basis of connection relation of the switching circuit BT04, the switching circuit BT05, and the voltage transformer circuit BT07 so that terminals having the same polarity of the terminal pair BT01 and the discharge battery cell group are connected with each other, or terminals having the same polarity of the terminal pair BT02 and the charge battery cell group are connected with each other.

An operation of the switching control circuit BT03 is described in detail.

First, the switching control circuit BT03 measures the voltage of each of the plurality of battery cells BT09. Then, the switching control circuit BT03 determines that the battery cell BT09 having a voltage higher than a predetermined threshold value is a high-voltage battery cell (high-voltage cell) and that the battery cell BT09 having a voltage lower than the predetermined threshold value is a low-voltage battery cell (low-voltage cell), for example.

As a method to determine whether a battery cell is a high-voltage cell or a low-voltage cell, any of various methods can be employed. For example, the switching control circuit BT03 may determine whether each battery cell BT09 is a high-voltage cell or a low-voltage cell on the basis of the voltage of a battery cell BT09 having a highest voltage or a lowest voltage among the plurality of battery cells BT09. In this case, the switching control circuit BT03 can determine whether each battery cell BT09 is a high-voltage cell or a low-voltage cell by determining whether or not a ratio of a voltage of each battery cell BT09 to the reference voltage is the predetermined value or more. Then, the switching control circuit BT03 determines a charge battery cell group and a discharge battery cell group on the basis of the determination result.

Note that high-voltage cells and low-voltage cells are mixed in various states in the plurality of battery cells BT09. For example, the switching control circuit BT03 selects a portion having the largest number of high-voltage cells connected in series as the discharge battery cell group of mixed high-voltage cells and low-voltage cells. Furthermore, the switching control circuit BT03 selects a portion having the largest number of low-voltage cells connected in series as the charge battery cell group. In addition, the switching control circuit BT03 may preferentially select battery cells BT09 which are near overcharged or overdischarged as the discharge battery cell group or the charge battery cell group.

Figure 18A:
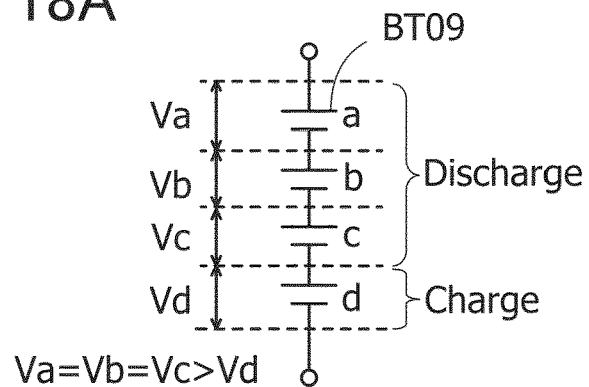
FIGS. 18A to 18C are schematic views illustrating one embodiment of the present invention.
Figure 18B:
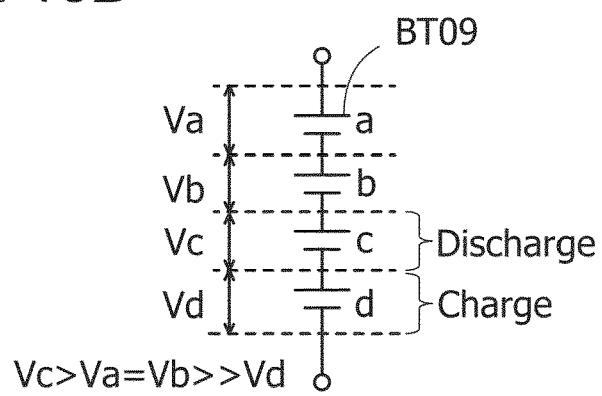
Figure 18C:
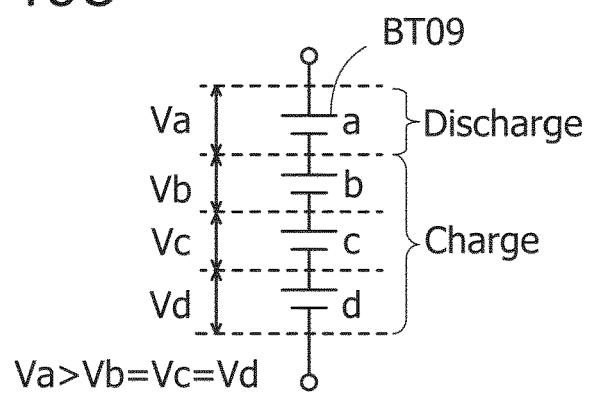

Here, operation examples of the switching control circuit BT03 in this embodiment are described with reference to FIGS. 18A to 18C. FIGS. 18A to 18C illustrate operation examples of the switching control circuit BT03. Note that FIGS. 18A to 18C each illustrate the case where four battery cells BT09 are connected in series as an example for convenience of explanation.

FIG. 18A shows the case where the relation of voltages Va, Vb, Vc, and Vd is Va=Vb=Vc>Vd where the voltages Va, Vb, Vc, and Vd are voltages of a battery cell a, a battery cell b, a battery cell c, and a battery cell d, respectively. That is, a series of three high-voltage cells a to c and one low-voltage cell d are connected in series. In that case, the switching control circuit BT03 selects the series of three high-voltage cells a to c as the discharge battery cell group. In addition, the switching control circuit BT03 selects the low-voltage cell d as the charge battery cell group.

Next, FIG. 18B shows the case where the relation of the voltages is Vc>Va=Vb>>Vd. That is, a series of two low-voltage cells a and b, one high-voltage cell c, and one low-voltage cell d which is close to overdischarge are connected in series. In that case, the switching control circuit BT03 selects the high-voltage cell c as the discharge battery cell group. Since the low-voltage cell d is close to overdischarge, the switching control circuit BT03 preferentially selects the low-voltage cell d as the charge battery cell group instead of the series of two low-voltage cells a and b.

Lastly, FIG. 18C shows the case where the relation of the voltages is Va>Vb=Vc=Vd. That is, one high-voltage cell a and a series of three low-voltage cells b to d are connected in series. In that case, the switching control circuit BT03 selects the high-voltage cell a as the discharge battery cell group. In addition, the switching control circuit BT03 selects the series of three low-voltage cells b to d as the charge battery cell group.

On the basis of the determination result shown in the examples of FIGS. 18A to 18C, the switching control circuit BT03 outputs the control signal S1 and the control signal S2 to the switching circuit BT04 and the switching circuit BT05, respectively. Information showing the discharge battery cell group being the connection destination of the switching circuit BT04 is set in the control signal S1. Information showing the charge battery cell group being a connection destination of the switching circuit BT05 is set in the control signal S2.

The above is the detailed description of the operation of the switching control circuit BT03.

The switching circuit BT04 sets the discharge battery cell group selected by the switching control circuit BT03 as the connection destination of the terminal pair BT01 in response to the control signal S1 output from the switching control circuit BT03.

The terminal pair BT01 includes a pair of terminals A1 and A2. The switching circuit BT04 sets the connection destination of the terminal pair BT01 by connecting one of the pair of terminals A1 and A2 to a positive electrode terminal of a battery cell BT09 positioned on the most upstream side (on the high potential side) of the discharge battery cell group, and the other to a negative electrode terminal of a battery cell BT09 positioned on the most downstream side (on the low potential side) of the discharge battery cell group. Note that the switching circuit BT04 can recognize the position of the discharge battery cell group on the basis of the information set in the control signal S1.

The switching circuit BT05 sets the charge battery cell group selected by the switching control circuit BT03 as the connection destination of the terminal pair BT02 in response to the control signal S2 output from the switching control circuit BT03.

The terminal pair BT02 includes a pair of terminals B1 and B2. The switching circuit BT05 sets the connection destination of the terminal pair BT02 by connecting one of the pair of terminals B1 and B2 to a positive electrode terminal of a battery cell BT09 positioned on the most upstream side (on the high potential side) of the charge battery cell group, and the other to a negative electrode terminal of a battery cell BT09 positioned on the most downstream side (on the low potential side) of the charge battery cell group. Note that the switching circuit BT05 can recognize the position of the charge battery cell group on the basis of the information set in the control signal S2.

Figure 19:
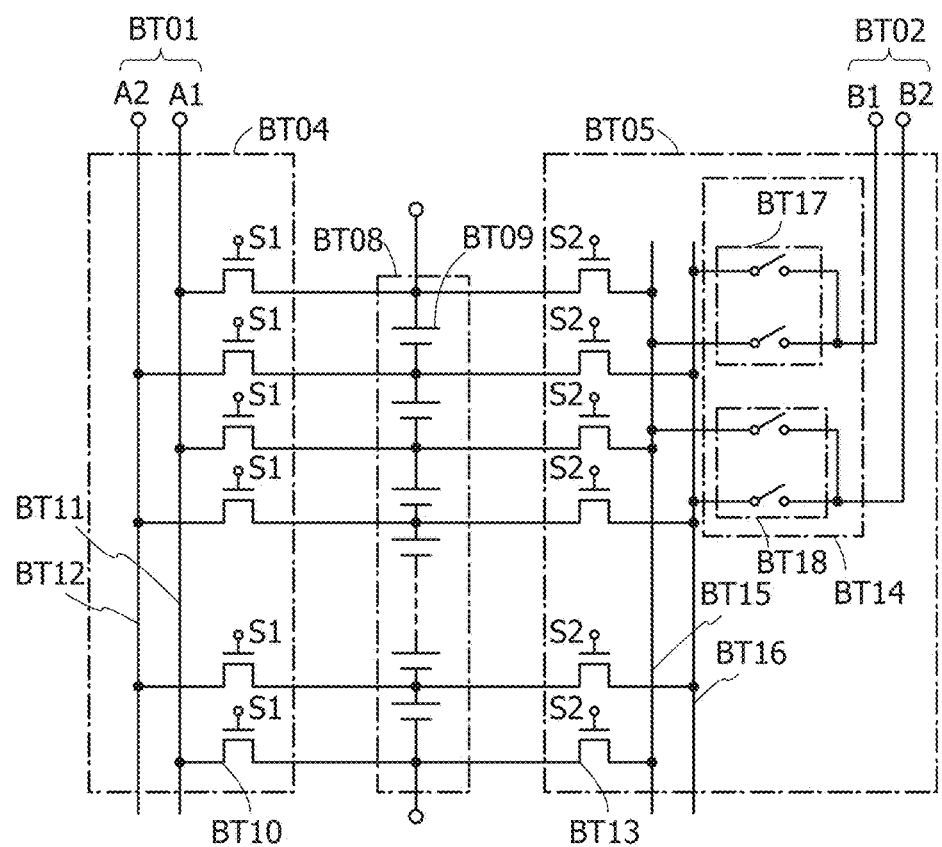
FIG. 19 is a circuit diagram illustrating one embodiment of the present invention.
Figure 20:
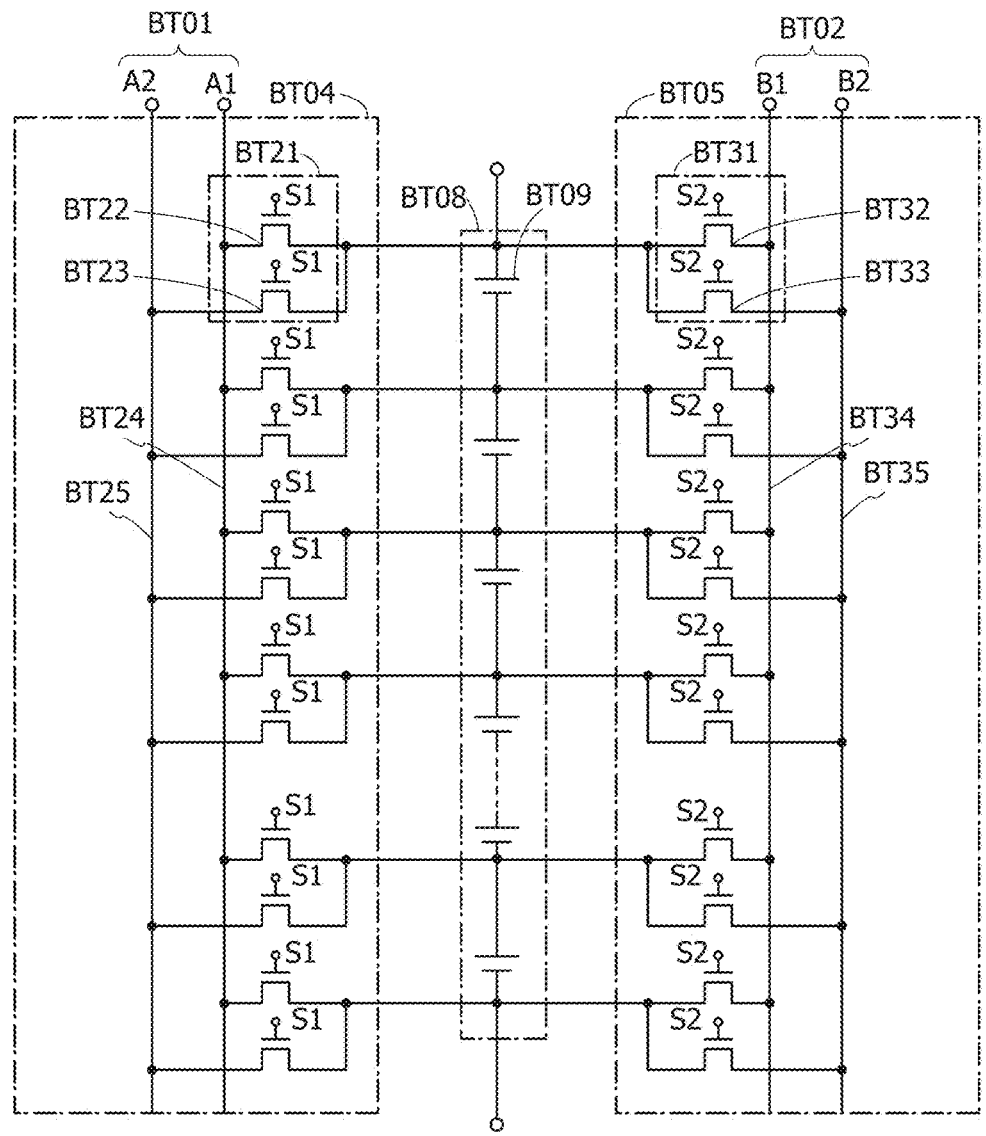
FIG. 20 is a circuit diagram illustrating one embodiment of the present invention.

FIGS. 19 and 20 are circuit diagrams showing configuration examples of the switching circuits BT04 and BT05.

In FIG. 19, the switching circuit BT04 includes a plurality of transistors BT10, a bus BT11, and a bus BT12. The bus BT11 is connected to the terminal A1. The bus BT12 is connected to the terminal A2. Sources or drains of the plurality of transistors BT10 are connected alternately to the bus BT11 and the bus BT12. Sources or drains which are not connected to the bus BT11 and the bus BT12 of the plurality of transistors BT10 are each connected between two adjacent battery cells BT09.

A source or a drain of the transistor BT10 which is not connected to the bus BT11 on the most upstream side of the plurality of transistors BT10 is connected to a positive electrode terminal of a battery cell BT09 on the most upstream side of the battery portion BT08. A source or a drain of a transistor BT10 which is not connected to the bus BT11 of the transistor BT10 on the most downstream side of the plurality of transistors BT10 is connected to a negative electrode terminal of a battery cell BT09 on the most downstream side of the battery portion BT08.

The switching circuit BT04 connects the discharge battery cell group to the terminal pair BT01 by bringing one of the plurality of the transistors BT10 which are connected to the bus BT11 and one of the plurality of transistors BT10 which are connected to the bus BT12 into an on state in response to the control signal S1 supplied to gates of the plurality of transistors BT10. Accordingly, the positive electrode terminal of the battery cell BT09 on the most upstream side of the discharge battery cell group is connected to one of the pair of terminals A1 and A2. In addition, the negative electrode terminal of the battery cell BT09 on the most downstream side of the discharge battery cell group is connected to the other of the pair of terminals A1 and A2 (i.e., a terminal which is not connected to the positive electrode terminal).

An OS transistor is preferably used as the transistor BT10. Since the off-state current of the OS transistor is low, the amount of electric charge leaking from battery cells which do not belong to the discharge battery cell group can be reduced, and reduction in capacity over time can be suppressed. In addition, dielectric breakdown is unlikely to occur in the OS transistor when a high voltage is applied. Therefore, the battery cell BT09 and the terminal pair BT01, which are connected to the transistor BT10 in an off state, can be insulated from each other even when an output voltage of the discharge battery cell group is high.

In FIG. 19, the switching circuit BT05 includes a plurality of transistors BT13, a current control switch BT14, a bus BT15, and a bus BT16. The bus BT15 and the bus BT16 are provided between the plurality of transistors BT13 and the current control switch BT14. Sources or drains of the plurality of transistors BT13 are connected alternately to the bus BT15 and the bus BT16. Sources or drains which are not connected to the bus BT15 and the bus BT16 of the plurality of transistors BT13 are each connected between two adjacent battery cells BT09.

A source or a drain of the transistor BT13 which is not connected to the bus BT15 on the most upstream side of the plurality of transistors BT13 is connected to a positive electrode terminal of the battery cell BT09 on the most upstream side of the battery portion BT08. A source or a drain of the transistor BT13 which is not connected to the bus BT15 on the most downstream side of the plurality of transistors BT13 is connected to a negative electrode terminal of the battery cell BT09 on the most downstream side of the battery portion BT08.

OS transistors are preferably used as the transistors BT13 like the transistors BT10. Since the off-state current of the OS transistor is low, the amount of electric charge leaking from the battery cells which do not belong to the charge battery cell group can be reduced, and reduction in capacity over time can be suppressed. In addition, dielectric breakdown is unlikely to occur in the OS transistor when a high voltage is applied. Therefore, the battery cell BT09 and the terminal pair BT02, which are connected to the transistor BT13 in an off state, can be insulated from each other even when a voltage for charging the charge battery cell group is high.

The current control switch BT14 includes a switch pair BT17 and a switch pair BT18. One end of the switch pair BT17 is connected to the terminal B1. The other ends of the switch pair BT17 extend from respective switches of the switch pair BT17. One switch is connected to the bus BT15, and the other switch is connected to the bus BT16. One end of the switch pair BT18 is connected to the terminal B2. The other ends of the switch pair BT18 extend from respective switches of the switch pair BT18. One switch is connected to the bus BT15, and the other switch is connected to the bus BT16.

OS transistors are preferably used for the switches included in the switch pair BT17 and the switch pair BT18 like the transistors BT10 and BT13.

The switching circuit BT05 connects the charge battery cell group and the terminal pair BT02 in response to the control signal S2 by controlling the combination of on and off states of the transistors BT13 and the current control switch BT14.

For example, the switching circuit BT05 connects the charge battery cell group and the terminal pair BT02 in the following manner.

The switching circuit BT05 brings a transistor BT13 connected to a positive electrode terminal of a battery cell BT09 on the most upstream side of the charge battery cell group into an on state in response to the control signal S2 supplied to gates of the plurality of the transistors BT13. In addition, the switching circuit BT05 brings a transistor BT13 connected to a negative electrode terminal of a battery cell BT09 on the most downstream side of the charge battery cell group into an on state in response to the control signal S2 supplied to gates of the plurality of the transistors BT13.

The polarities of voltages applied to the terminal pair BT02 can vary in accordance with the connection structures of the discharge battery cell group connected to the terminal pair BT01 and the voltage transformer circuit BT07. In order to supply current in a direction for charging the charge battery cell group, terminals with the same polarity of the terminal pair BT02 and the charge battery cell group are required to be connected. In view of this, the current control switch BT14 is controlled by the control signal S2 so that the connection destination of the switch pair BT17 and that of the switch pair BT18 are changed in accordance with the polarities of the voltages applied to the terminal pair BT02.

The state where voltages are applied to the terminal pair BT02 so as to make the terminal B1 a positive electrode and the terminal B2 a negative electrode is described as an example. Here, in the case where the battery cell BT09 positioned on the most downstream side of the battery portion BT08 is in the charge battery cell group, the switch pair BT17 is controlled to be connected to the positive electrode terminal of the battery cell BT09 in response to the control signal S2. That is, the switch of the switch pair BT17 connected to the bus BT16 is turned on, and the switch of the switch pair BT17 connected to the bus BT15 is turned off. In contrast, the switch pair BT18 is controlled to be connected to the negative electrode terminal of the battery cell BT09 positioned on the most downstream side of the battery portion BT08 in response to the control signal S2. That is, the switch of the switch pair BT18 connected to the bus BT15 is turned on, and the switch of the switch pair BT18 connected to the bus BT16 is turned off. In this manner, terminals with the same polarity of the terminal pair BT02 and the charge battery cell group are connected to each other. In addition, the current which flows from the terminal pair BT02 is controlled to be supplied in a direction so as to charge the charge battery cell group.

In addition, instead of the switching circuit BT05, the switching circuit BT04 may include the current control switch BT14.

FIG. 20 is a circuit diagram illustrating structure examples of the switching circuit BT04 and the switching circuit BT05 which are different from those of FIG. 19.

In FIG. 20, the switching circuit BT04 includes a plurality of transistor pairs BT21, a bus BT24, and a bus BT25. The bus BT24 is connected to the terminal A1. The bus BT25 is connected to the terminal A2. One ends of the transistor pair BT21 extend from the transistor BT22 and transistor BT23. Source or drain of the transistor BT22 is connected to the bus BT24. Source or drain of the transistor BT23 is connected to the bus BT25. In addition, the other end of the transistor pair BT21 is connected between two adjacent battery cells BT09. The other end of the transistor pair BT21 on the most upstream side of the plurality of transistor pairs BT21 is connected to the positive electrode terminal of the battery cell BT09 on the most upstream side of the battery portion BT08. The other end of the transistor pair BT21 on the most downstream side of the plurality of transistor pairs BT21 is connected to the negative electrode terminal of the battery cell BT09 on the most downstream side of the battery portion BT08.

The switching circuit BT04 switches the connection destination of the transistor pair BT21 to one of the terminal A1 and the terminal A2 by turning on or off the transistors BT22 and BT23 in response to the control signal S1. Specifically, when the transistor BT22 is turned on, the transistor BT23 is turned off, so that the connection destination of the transistor pair BT21 is the terminal A1. On the other hand, when the transistor BT23 is turned on, the transistor BT22 is turned off, so that the connection destination of the transistor pair BT21 is the terminal A2. Which of the transistors BT22 and BT23 is turned on is determined by the control signal S1.

Two transistor pairs BT21 are used to connect the terminal pair BT01 and the discharge battery cell group. Specifically, the connection destinations of the two transistor pairs BT21 are determined on the basis of the control signal S1, and the discharge battery cell group and the terminal pair BT01 are connected. The connection destinations of the two transistor pairs BT21 are controlled by the control signal S1 so that one of the connection destinations is the terminal A1 and the other is the terminal A2.

The switching circuit BT05 includes a plurality of transistor pairs BT31, a bus BT34 and a bus BT35. The bus BT34 is connected to the terminal B1. The bus BT35 is connected to the terminal B2. One ends of transistor pair BT31 extend from transistor BT32 and transistor BT33. One end extending from the transistor BT32 is connected to the bus BT34. One end extending from the transistor BT33 is connected to the bus BT35. The other end of plurality of the transistor pair BT31 is connected between two adjacent battery cells BT09. The other end of the transistor pair BT31 on the most upstream side of the plurality of transistor pairs BT31 is connected to the positive electrode terminal of the battery cell BT09 on the most upstream side of the battery portion BT08. The other end of the transistor pair BT31 on the most downstream side of the plurality of transistor pairs BT31 is connected to the negative electrode terminal of the battery cell BT09 on the most downstream side of the battery portion BT08.

The switching circuit BT05 switches the connection destination of the transistor pair BT31 to one of the terminal B1 and the terminal B2 by turning on or off the transistors BT32 and BT33 in response to the control signal S2. Specifically, when the transistor BT32 is turned on, the transistor BT33 is turned off, so that the connection destination of the transistor pair BT31 is the terminal B1. On the other hand, when the transistor BT33 is turned on, the transistor BT32 is turned off, so that the connection destination of the transistor pair BT31 is the terminal B2. Which of the transistors BT32 and BT33 is turned on is determined by the control signal S2.

Two transistor pairs BT31 are used to connect the terminal pair BT02 and the charge battery cell group. Specifically, the connection destinations of the two transistor pairs BT31 are determined on the basis of the control signal S2, and the charge battery cell group and the terminal pair BT02 are connected. The connection destinations of the two transistor pairs BT31 are controlled by the control signal S2 so that one of the connection destinations is the terminal B1 and the other is the terminal B2.

The connection destinations of the two transistor pairs BT31 are determined by the polarities of the voltages applied to the terminal pair BT02. Specifically, in the case where voltages which make the terminal B1 a positive electrode and the terminal B2 a negative electrode are applied to the terminal pair BT02, the transistor pair BT31 on the upstream side is controlled by the control signal S2 so that the transistor BT32 is turned on and the transistor BT33 is turned off. In contrast, the transistor pair BT31 on the downstream side is controlled by the control signal S2 so that the transistor BT33 is turned on and the transistor BT32 is turned off. In the case where voltages which make the terminal B1 a negative electrode and the terminal B2 a positive electrode is applied to the terminal pair BT02, the transistor pair BT31 on the upstream side is controlled by the control signal S2 so that the transistor BT33 is turned on and the transistor BT32 is turned off. In contrast, the transistor pair BT31 on the downstream side is controlled by the control signal S2 so that the transistor BT32 is turned on and the transistor BT33 is turned off. In this manner, terminals with the same polarity of the terminal pair BT02 and the charge battery cell group are connected to each other. In addition, the current which flows from the terminal pair BT02 is controlled to be supplied in a direction for charging the charge battery cell group.

The voltage transformation control circuit BT06 controls operation of the voltage transformer circuit BT07. The voltage transformation control circuit BT06 generates a voltage transformation signal S3 for controlling the operation of the voltage transformer circuit BT07 on the basis of the number of battery cells BT09 included in the discharge battery cell group and the number of the battery cells BT09 included in the charge battery cell group and outputs the voltage transformation signal S3 to the voltage transformer circuit BT07.

In the case where the number of the battery cells BT09 included in the discharge battery cell group is larger than that included in the charge battery cell group, it is necessary to prevent a charging voltage which is too high from being applied to the charge battery cell group. Thus, the voltage transformation control circuit BT06 outputs the voltage transformation signal S3 for controlling the voltage transformer circuit BT07 so that a discharging voltage (Vdis) is lowered within a range where the charge battery cell group can be charged.

In the case where the number of the battery cells BT09 included in the discharge battery cell group is less than or equal to that included in the charge battery cell group, a voltage necessary for charging the charge battery cell group needs to be secured. Therefore, the voltage transformation control circuit BT06 outputs the voltage transformation signal S3 for controlling the voltage transformer circuit BT07 so that the discharging voltage (Vdis) is raised within a range where a charging voltage which is too high is not applied to the charge battery cell group.

The voltage value of the charging voltage which is too high is determined in the light of product specifications and the like of the battery cell BT09 used in the battery portion BT08. The voltage which is raised or lowered by the voltage transformer circuit BT07 is applied as a charging voltage (Vcha) to the terminal pair BT02.

Figure 21A:
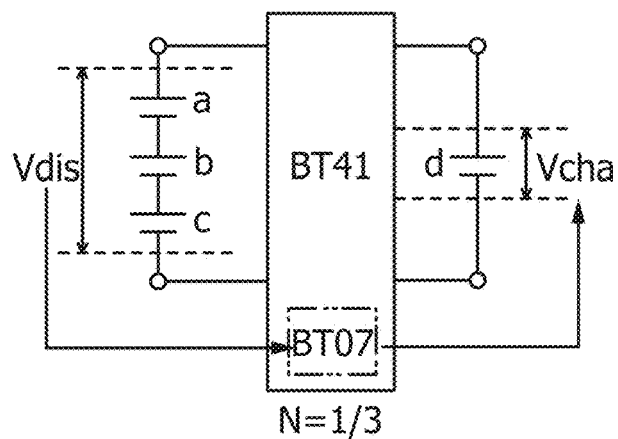
FIGS. 21A to 21C are schematic views illustrating one embodiment of the present invention.
Figure 21B:
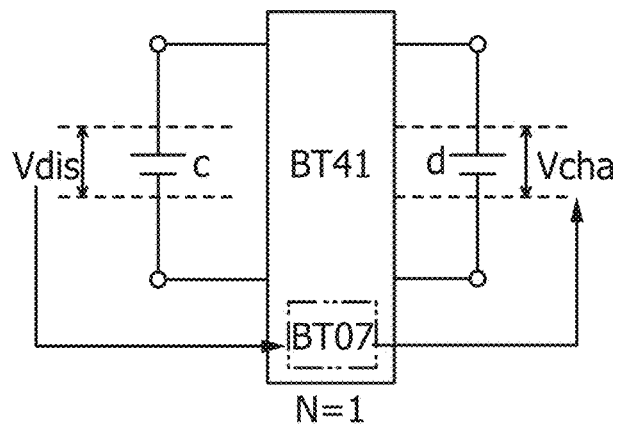
Figure 21C:
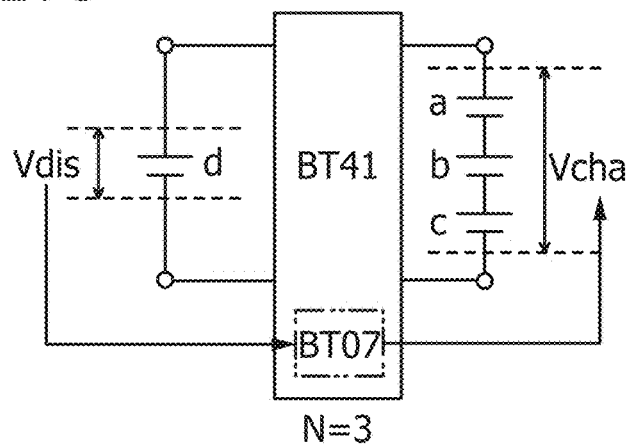

Here, operation examples of the voltage transformation control circuit BT06 in this embodiment are described with reference to FIGS. 21A to 21C. FIGS. 21A to 21C are conceptual diagrams for explaining the operation examples of the voltage transformation control circuit BT06 for the discharge battery cell group and the charge battery cell group described with reference to FIGS. 18A to 18C. FIGS. 21A to 21C each illustrate a battery management unit BT41. The battery management unit BT41 includes the terminal pair BT01, the terminal pair BT02, the switching control circuit BT03, the switching circuit BT04, the switching circuit BT05, the voltage transformation control circuit BT06, and the voltage transformer circuit BT07.

In an example illustrated in FIG. 21A, the series of three high-voltage cells a to c and one low-voltage cell d are connected in series with reference to FIG. 18A. In that case, as described with reference to FIG. 18A, the switching control circuit BT03 selects the high-voltage cells a to c as the discharge battery cell group, and selects the low-voltage cell d as the charge battery cell group. The voltage transformation control circuit BT06 calculates a conversion ratio N for converting the discharging voltage (Vdis) to the charging voltage (Vcha) on the basis of the ratio of the number of the battery cells BT09 included in the charge battery cell group to the number of the battery cells BT09 included in the discharge battery cell group.

In the case where the number of the battery cells BT09 included in the discharge battery cell group is larger than that included in the charge battery cell group, when a discharging voltage is applied to the terminal pair BT02 without transforming the voltage, overvoltage may be applied to the battery cells BT09 included in the charge battery cell group through the terminal pair BT02. Thus, in the case of FIG. 21A, it is necessary that a charging voltage (Vcha) applied to the terminal pair BT02 be lowered than the discharging voltage. In addition, in order to charge the charge battery cell group, it is necessary that the charging voltage be higher than the total voltage of the battery cells BT09 included in the charge battery cell group. Thus, the transformation control circuit BT06 sets the conversion ratio N larger than the ratio of the number of the battery cells BT09 included in the charge battery cell group to the number of the battery cells BT09 included in the discharge battery cell group.

Thus, the voltage transformation control circuit BT06 preferably sets the conversion ratio N larger than the ratio of the number of the battery cells BT09 included in the charge battery cell group to the number of the battery cells BT09 included in the discharge battery cell group by about 1% to 10%. Here, the charging voltage is made larger than the voltage of the charge battery cell group, but the charging voltage is equal to the voltage of the charge battery cell group in reality. Note that the voltage transformation control circuit BT06 feeds a current for charging the charge battery cell group in accordance with the conversion ratio N in order to make the voltage of the charge battery cell group equal to the charging voltage. The value of the current is set by the voltage transformation control circuit BT06.

In the example illustrated in FIG. 21A, since the number of the battery cells BT09 included in the discharge battery cell group is three and the number of the battery cells BT09 included in the charge battery cell group is one, the voltage transformation control circuit BT06 calculates a value which is slightly larger than ⅓ as the conversion ratio N. Then, the voltage transformation control circuit BT06 outputs the voltage transformation signal S3, which lowers the discharging voltage in accordance with the conversion ratio N and converts the voltage into a charging voltage, to the voltage transformer circuit BT07. The voltage transformer circuit BT07 applies the charging voltage which is transformed in response to the voltage transformation signal S3 to the terminal pair BT02. Then, the battery cells BT09 included in the charge battery cell group are charged with the charging voltage applied to the terminal pair BT02.

In each of examples illustrated in FIGS. 21B and 21C, the conversion ratio N is calculated in a manner similar to that of FIG. 21A. In each of the examples illustrated in FIGS. 21B and 21C, since the number of the battery cells BT09 included in the discharge battery cell group is less than or equal to the number of the battery cells BT09 included in the charge battery cell group, the conversion ratio N is 1 or more. Therefore, in this case, the voltage transformation control circuit BT06 outputs the voltage transformation signal S3 for raising the discharging voltage and converting the voltage into the charging voltage.

The voltage transformer circuit BT07 converts the discharging voltage applied to the terminal pair BT01 into a charging voltage on the basis of the voltage transformation signal S3. The voltage transformer circuit BT07 applies the converted charging voltage to the terminal pair BT02. Here, the voltage transformer circuit BT07 electrically insulates the terminal pair BT01 from the terminal pair BT02. Accordingly, the voltage transformer circuit BT07 prevents a short circuit due to a difference between the absolute voltage of the negative electrode terminal of the battery cell BT09 on the most downstream side of the discharge battery cell group and the absolute voltage of the negative electrode terminal of the battery cell BT09 on the most downstream side of the charge battery cell group. Furthermore, the voltage transformer circuit BT07 converts the discharging voltage, which is the total voltage of the discharge battery cell group, into the charging voltage on the basis of the voltage transformation signal S3 as described above.

An insulated direct current (DC)-DC converter or the like can be used in the voltage transformer circuit BT07. In that case, the voltage transformation control circuit BT06 controls the charging voltage converted by the voltage transformer circuit BT07 by outputting a signal for controlling the on/off ratio (the duty ratio) of the insulated DC-DC converter as the voltage transformation signal S3.

Examples of the insulated DC-DC converter include a flyback converter, a forward converter, a ringing choke converter (RCC), a push-pull converter, a half-bridge converter, and a full-bridge converter, and a suitable converter is selected in accordance with the value of the intended output voltage.

Figure 22:
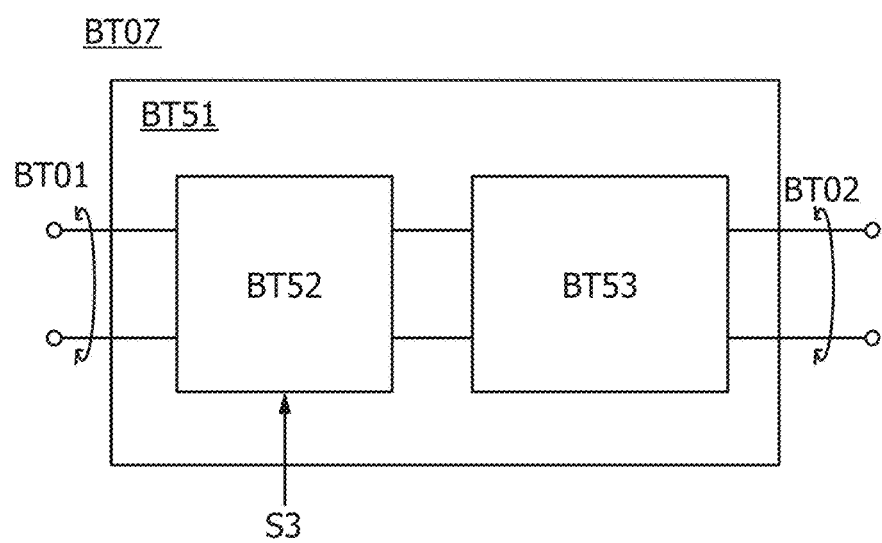
FIG. 22 is a block diagram illustrating one embodiment of the present invention.

The structure of the voltage transformer circuit BT07 including the insulated DC-DC converter is illustrated in FIG. 22. An insulated DC-DC converter BT51 includes a switch portion BT52 and a transformer BT53. The switch portion BT52 is a switch for switching the on/off state of the operation of the insulated DC-DC converter, and a metal oxide semiconductor field-effect transistor (MOSFET), a bipolar transistor, or the like is used as the switch portion BT52. The switch portion BT52 periodically turns on and off the insulated DC-DC converter BT51 in accordance with the voltage transformation signal S3 controlling the on/off ratio which is output from the voltage transformation control circuit BT06. The switch portion BT52 can have any of various structures in accordance with the type of the insulated DC-DC converter which is used. The transformer BT53 converts the discharging voltage applied from the terminal pair BT01 into the charging voltage. In detail, the transformer BT53 operates in conjunction with the on/off state of the switch portion BT52 and converts the discharging voltage into the charging voltage in accordance with the on/off ratio. As the time during which the switch portion BT52 is on becomes longer in its switching period, the charging voltage is increased. On the other hand, as the time during which the switch portion BT52 is on becomes shorter in its switching period, the charging voltage is decreased. In the case where the insulated DC-DC converter is used, the terminal pair BT01 and the terminal pair BT02 can be insulated from each other inside the transformer BT53.

Figure 23:
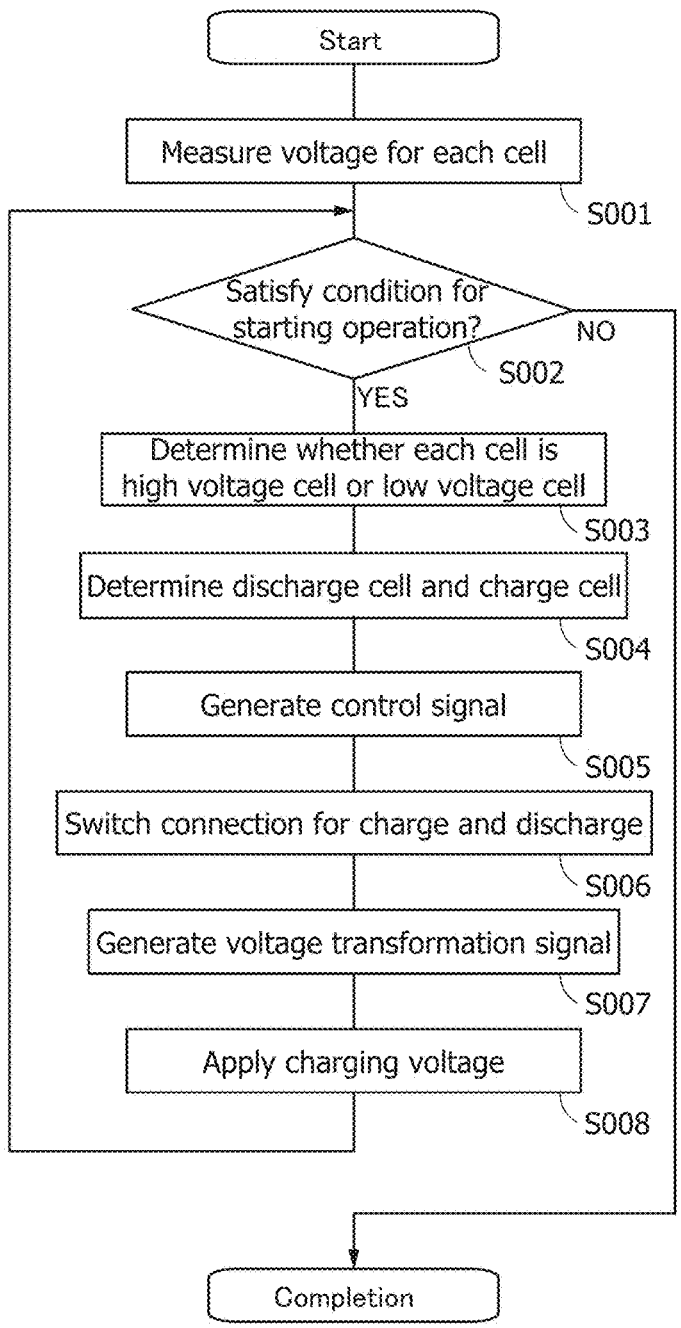
FIG. 23 is a flow chart illustrating one embodiment of the present invention.

A flow of operation of the power storage device BT00 in this embodiment is described with reference to FIG. 23. FIG. 23 is a flow chart illustrating the flow of the operation of the power storage device BT00.

First, the power storage device BT00 obtains a voltage measured for each of the plurality of battery cells BT09 (step S001). Then, the power storage device BT00 determines whether or not the condition for starting the operation of reducing variation in voltages of the plurality of the battery cells BT09 is satisfied (step S002). An example of the starting condition can be that the difference between the maximum value and the minimum value of the voltage measured for each of the plurality of the battery cells BT09 is higher than or equal to the predetermined threshold value. In the case where the starting condition is not satisfied (step S002: NO), the power storage device BT00 does not perform the following operation because voltages of the battery cells BT09 are well balanced. In contrast, in the case where the condition is satisfied (step S002: YES), the power storage device BT00 performs the operation of reducing variation in the voltages of the battery cells BT09. In this operation, the power storage device BT00 determines whether each battery cell BT09 is a high-voltage cell or a low-voltage cell on the basis of the measured voltage of each cell (step S003). Then, the power storage device BT00 determines a discharge battery cell group and a charge battery cell group on the basis of the determination result (step S004). In addition, the power storage device BT00 generates the control signal S1 for setting the determined discharge battery cell group as the connection destination of the terminal pair BT01, and the control signal S2 for setting the determined charge battery cell group as the connection determination of the terminal pair BT02 (step S005). The power storage device BT00 outputs the generated control signals S1 and S2 to the switching circuit BT04 and the switching circuit BT05, respectively. Then, the switching circuit BT04 connects the terminal pair BT01 and the discharge battery cell group, and the switching circuit BT05 connects the terminal pair BT02 and the discharge battery cell group (step S006). The power storage device BT00 generates the voltage transformation signal S3 based on the number of the battery cells BT09 included in the discharge battery cell group and the number of the battery cells BT09 included in the charge battery cell group (step S007). Then, the power storage device BT00 converts the discharging voltage applied to the terminal pair BT01 into a charging voltage based on the voltage transformation signal S3 and applies the charging voltage to the terminal pair BT02 (step S008). In this way, electric charge of the discharge battery cell group is transferred to the charge battery cell group.

Although the plurality of steps are shown in order in the flow chart of FIG. 23, the order of performing the steps is not limited to the order.

According to the above embodiment, when electric charge is transferred from the discharge battery cell group to the charge battery cell group, a structure where an electric charge from the discharge battery cell group is temporarily stored, and the stored electric charge is sent to the charge battery cell group is unnecessary, unlike in the a capacitor type circuit. Accordingly, the charge transfer efficiency per unit time can be increased. In addition, the switching circuit BT04 and the switching circuit BT05 determine which battery cell in the discharge battery cell group and the charge battery cell group to be connected to the voltage transformer circuit.

Furthermore, the voltage transformer circuit BT07 converts the discharging voltage applied to the terminal pair BT01 into the charging voltage based on the number of the battery cells BT09 included in the discharge battery cell group and the number of the battery cells BT09 included in the charge battery cell group, and applies the charging voltage to the terminal pair BT02. Thus, even when any battery cell BT09 is selected as the discharge battery cell group and the charge battery cell group, an electric charge can be transferred without any problems.

Furthermore, the use of OS transistors as the transistor BT10 and the transistor BT13 can reduce the amount of electric charge leaking from the battery cells BT09 which do not belong to the charge battery cell group or the discharge battery cell group. Accordingly, a decrease in capacity of the battery cells BT09 which do not contribute to charging or discharging can be suppressed. In addition, the variation in characteristics of the OS transistor due to heat is smaller than that of an Si transistor. Accordingly, even when the temperature of the battery cells BT09 is increased, an operation such as turning on or off the transistors in response to the control signals S1 and S2 can be performed normally.

This embodiment can be implemented in appropriate combination with any of the other embodiments and examples.

Embodiment 4

<<Other Structure Example of Secondary Battery>>

Figure 28A:
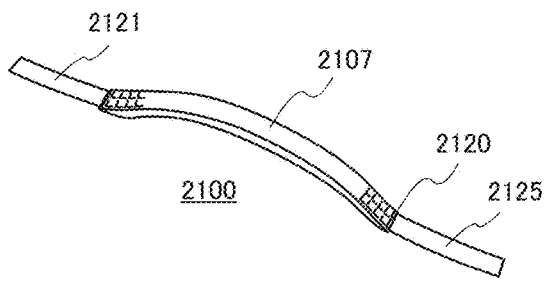
FIGS. 28A to 28C illustrate a perspective view, a top view, and a cross-sectional view of an example of the structure of a secondary battery.
Figure 28B:
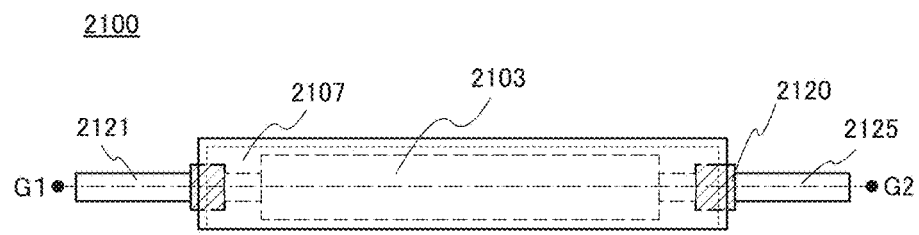
Figure 28C:
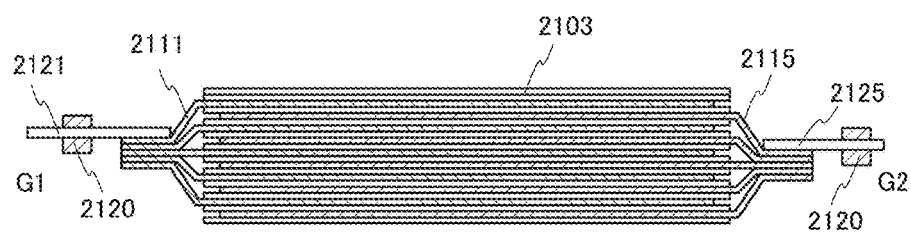

FIGS. 28A to 28C illustrate a secondary battery 2100 of one embodiment of the present invention. Three sides of the exterior body 2107 in the secondary battery are sealed. Furthermore, the secondary battery 2100 includes a positive electrode lead 2121, a negative electrode lead 2125, a positive electrode 2111, a negative electrode 2115, and a separator 2103. Note that although each electrode is shown as a single layer for simplicity, at least one of the electrodes include two or more current collectors and the current collectors overlap with each other in a region where active materials are not formed.

Here, some steps in the fabricating method of the secondary battery 2100 illustrated in FIGS. 28A to 28C will be described with reference to FIGS. 29A to 29D.

First, the negative electrode 2115 is positioned over the separator 2103 (FIG. 29A) such that a negative electrode active material layer in the negative electrode 2115 overlaps with the separator 2103.

Then, the separator 2103 is folded such that part of the separator 2103 is positioned over the negative electrode 2113. Next, the positive electrode 2111 is positioned over the separator 2103 (FIG. 29B) such that a positive electrode active material layer included in the positive electrode 2111 overlaps with the separator 2103 and the negative electrode active material layer. In the case where an electrode in which an active material layer is formed on one surface of a current collector is used, the positive electrode active material layer of the positive electrode 2111 and the negative electrode active material layer of the negative electrode 2115 are positioned so as to face each other with the separator 2103 therebetween.

Figure 29A:
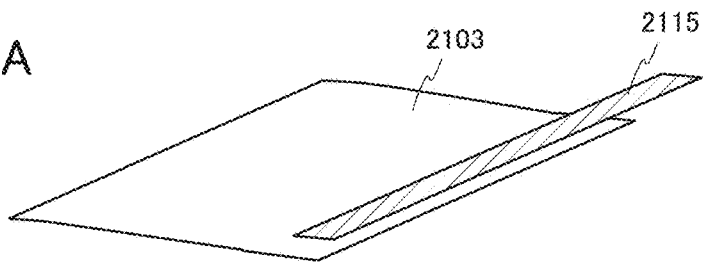
FIGS. 29A to 29D illustrate an example of a fabricating method of a secondary battery.
Figure 29B:
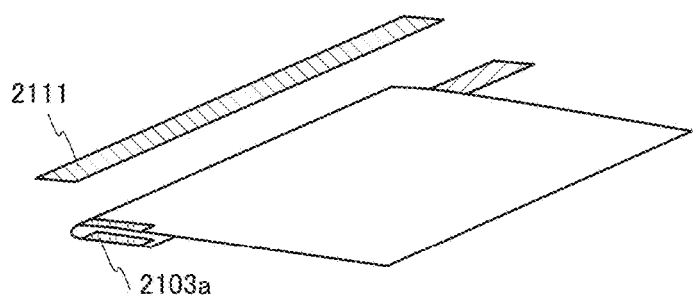

In the case where the separator 2103 is formed using a material that can be thermally welded, such as polypropylene, a region where the separator 2103 overlap with itself is thermally welded and then another electrode is positioned so as to overlap with the separator 2103, whereby the slippage of the electrode in the manufacturing process can be minimized. Specifically, a region which does not overlap with the negative electrode 2115 and the positive electrode 2111 and in which the separator 2103 overlaps with itself, e.g., a region 2103a in FIG. 29B, is preferably thermally welded.

Figure 29C:
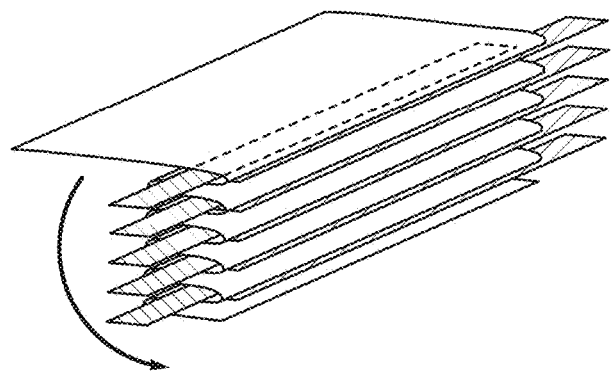

By repeating the above steps, the positive electrode 2111 and the negative electrode 2115 can overlap with each other with the separator 2103 therebetween as illustrated in FIG. 29C.

Note that a plurality of positive electrodes 2111 and a plurality of negative electrodes 2115 may be alternately placed to be sandwiched between portions of the separator 2103 that is repeatedly folded in advance.

Next, as illustrated in FIG. 29C, the plurality of positive electrodes 2111 and the plurality of negative electrodes 2115 are covered with the separator 2103.

Figure 29D:
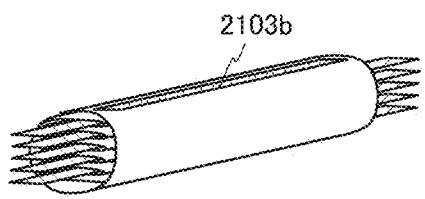

Then, as illustrated in FIG. 29D, a region where the separator 2103 overlaps with itself, e.g., a region 2103b in FIG. 29D, is thermally welded, whereby the plurality of positive electrodes 2111 and the plurality of negative electrodes 2115 are covered with and bundled in the separator 2103.

Note that the plurality of positive electrodes 2111, the plurality of negative electrodes 2115, and the separator 2103 may be bundled using a binding material.

Since the positive electrodes 2111 and the negative electrodes 2115 are stacked through the above steps, one separator 2103 has a region sandwiched between the plurality of positive electrodes 2111 and the plurality of negative electrodes 2115 and a region positioned so as to cover the plurality of positive electrodes 2111 and the plurality of negative electrodes 2115.

In other words, the separator 2103 included in the secondary battery 2100 in FIGS. 28A to 28C is a single separator which is partly folded. Between the folded parts of the separator 2103, the positive electrodes 2111 and the negative electrodes 2115 are sandwiched.

The description in Embodiment 1 can be referred to for structures of the secondary battery 2100 other than bonding regions of the exterior body 2107, the shapes of the positive electrodes 2111, the negative electrodes 2115, the separator 2103, and the exterior body 2107, and the positions and shapes of the positive electrode lead 2121 and the negative electrode lead 2125. The fabricating method described in Embodiment 1 can be referred to for the steps other than the steps of stacking the positive electrodes 2111 and the negative electrodes 2115 in the fabricating method of the secondary battery 2100.

FIGS. 30A, 30B, 30C1, 30C2, and 30D illustrate a secondary battery 2200, which is different from the secondary battery illustrated in FIGS. 28A to 28C. FIG. 30A is a perspective view of the secondary battery 2200, and FIG. 30B is a top view thereof. FIG. 30C1 is a cross-sectional view of a first electrode assembly 2130, and FIG. 30C2 is a cross-sectional view of a second electrode assembly 2131. FIG. 30D is a cross-sectional view taken along dashed-dotted line H1-H2 in FIG. 30B. In FIG. 30D, the first electrode assembly 2130, the second electrode assembly 2131, and the separator 2103 are selectively illustrated for simplicity. Note that although each electrode is shown as a single layer for simplicity, at least one of the electrodes includes two or more current collectors and the current collectors in contact with each other on surfaces where no active material is formed.

The secondary battery 2200 illustrated in FIGS. 30A, 30B, 30C1, 30C2, and 30D is different from the secondary battery 2100 illustrated in FIGS. 28A to 28C in the positions of the positive electrodes 2111, the negative electrodes 2115, and the separator 2103.

As illustrated in FIG. 30D, the secondary battery 2200 includes a plurality of first electrode assemblies 2130 and a plurality of second electrode assemblies 2131.

As illustrated in FIG. 30C1, in each of the first electrode assemblies 2130, a positive electrode 2111a including positive electrode active material layers on both surfaces of a positive electrode current collector, the separator 2103, a negative electrode 2115a including negative electrode active material layers on both surfaces of a negative electrode current collector, the separator 2103, and the positive electrode 2111a including the positive electrode active material layers on both surfaces of the positive electrode current collector are stacked in this order. As illustrated in FIG. 30C2, in each of the second electrode assemblies 2131, the negative electrode 2115a including the negative electrode active material layers on both surfaces of the negative electrode current collector, the separator 2103, the positive electrode 2111a including the positive electrode active material layers on both surfaces of the positive electrode current collector, the separator 2103, and the negative electrode 2115a including the negative electrode active material layers on both surfaces of the negative electrode current collector are stacked in this order.

As illustrated in FIG. 30D, the plurality of first electrode assemblies 2130 and the plurality of second electrode assemblies 2131 are covered with the wound separator 2103.

Here, some steps in a fabricating method of the secondary battery 2200 illustrated in FIGS. 30A, 30B, 30C1, 30C2, and 30D will be described with reference to FIGS. 31A to 31D.

Figure 31A:
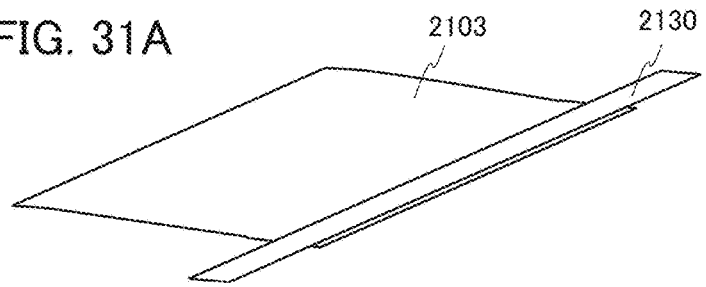
FIGS. 31A to 31D illustrate an example of a fabricating method of a secondary battery.

First, the first electrode assembly 2130 is positioned over the separator 2103 (FIG. 31A).

Figure 31B:
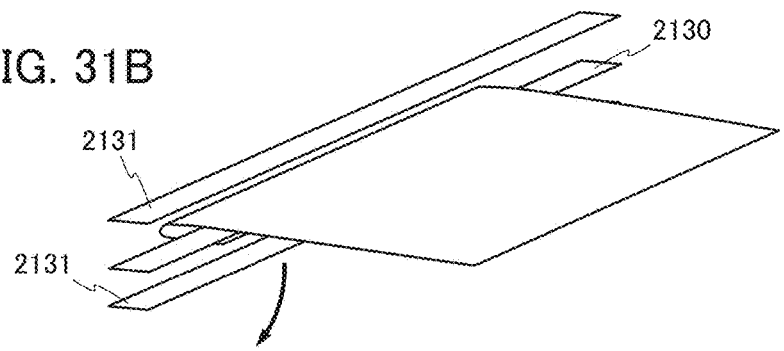

Then, the separator 2103 is folded such that part of the separator 2103 is positioned over the first electrode assembly 2130. Next, two second electrode assemblies 2131 are positioned over and under the first electrode assembly 2130 with the separator 2103 therebetween (FIG. 31B).

Figure 31C:
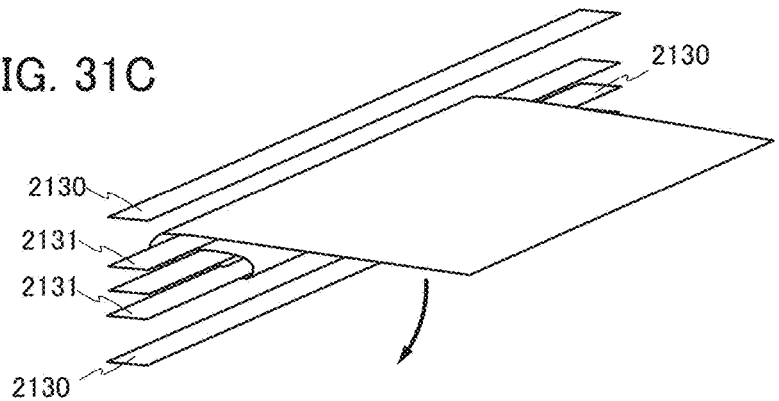

Then, the separator 2103 is wound so as to cover the two second electrode assemblies 2131. Next, two first electrode assemblies 2130 are positioned over and under the two second electrode assemblies 2131 with the separator 2103 therebetween (FIG. 31C).

Figure 31D:
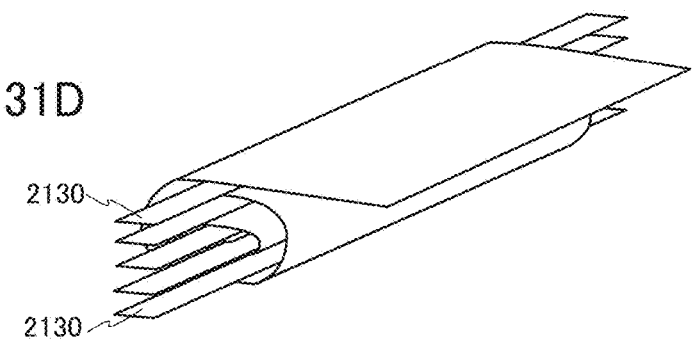
Figure 32A:
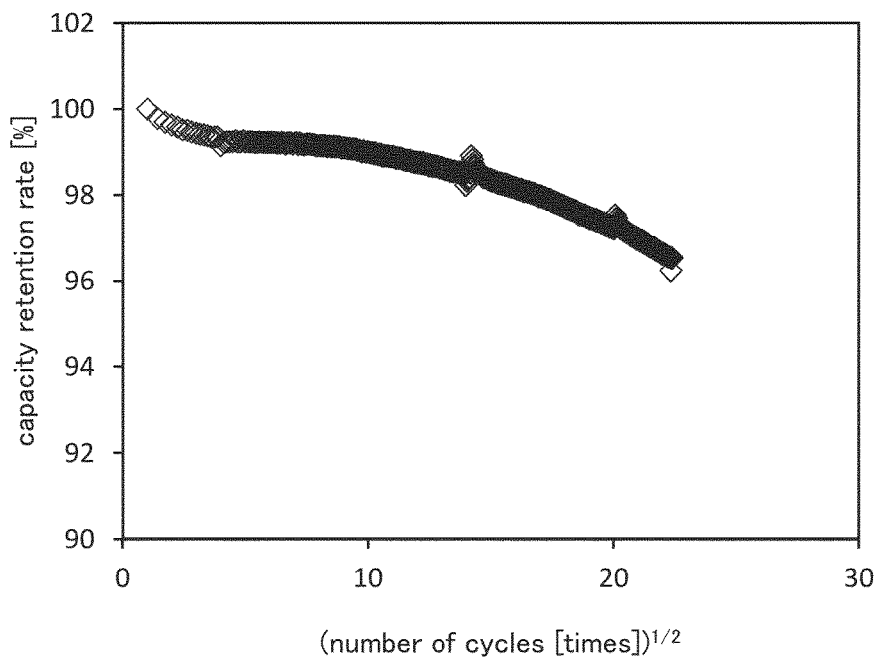
FIGS. 32A and 32B each show a relationship between the capacity retention rate of a secondary battery (%) and the square root of the number of cycles.
Figure 32B:
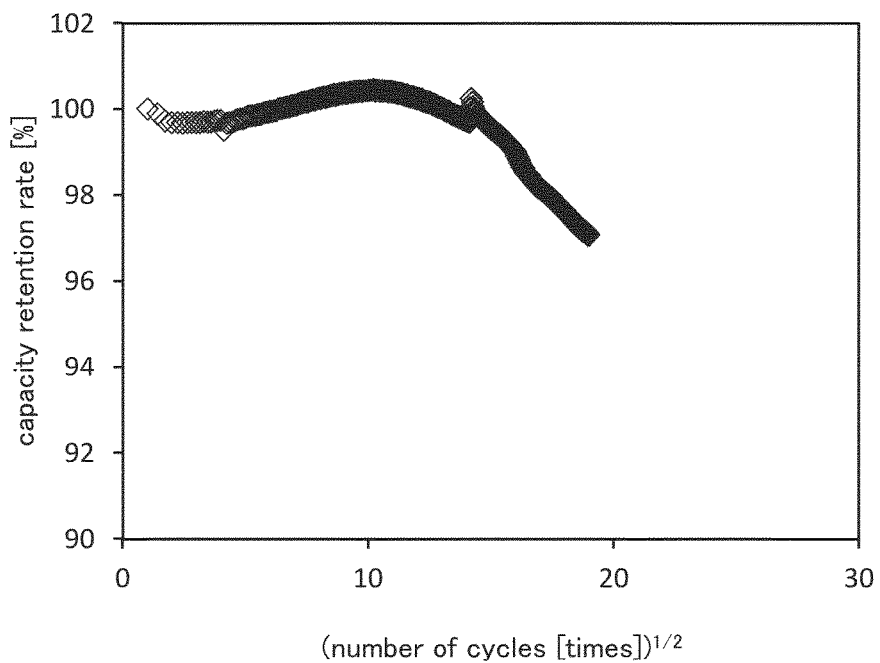

Then, the separator 2103 is wound so as to cover the two first electrode assemblies 2130 (FIG. 31D).

Since the plurality of first electrode assemblies 2130 and the plurality of second electrode assemblies 2131 are stacked through the above steps, the electrode assemblies are positioned between portions of the separator 2103 that is spirally wound.

It is preferable that the positive electrode 2111a of the first electrode assembly 2130 that is positioned on the outermost side include no positive electrode active material layer on the outer side.

In the example illustrated in FIGS. 31C1 and 31C2, the electrode assembly includes three electrodes and two separators; however, one embodiment of the present invention is not limited to this example. The electrode assembly may include four or more electrodes and three or more separators. As the number of electrodes is increased, the capacity of the secondary battery 2200 can be further improved. Note that the electrode assembly may include two electrodes and one separator. In the case where the number of electrodes is small, the secondary battery 2200 can have higher resistance to bending. In the example illustrated in FIG. 31D, the secondary battery 2200 includes three first electrode assemblies 2130 and two second electrode assemblies 2131; however, one embodiment of the present invention is not limited to this example. The secondary battery 2200 may include more electrode assemblies. As the number of electrode assemblies is increased, the capacity of the secondary battery 2200 can be further improved. The secondary battery 2200 may include a smaller number of electrode assemblies. In the case where the number of electrode assemblies is small, the secondary battery 2200 can have higher resistance to bending.

The description of FIGS. 28A to 28C can be referred to for structures other than the positions of the positive electrodes 2111, the negative electrodes 2115, and the separator 2103 of the secondary battery 2200.

This embodiment can be implemented in appropriate combinations with any of the other embodiments.

Example 1

In this example, a lithium-ion secondary battery of one embodiment of the present invention was fabricated on the basis of Embodiment 1, and subjected to a cycle test together with secondary batteries for comparison.

<Structure of Secondary Battery>

The structure of the fabricated secondary battery will be described.

[Formation of Positive Electrode]

First, a positive electrode slurry containing graphene as a conductive additive was formed. Lithium iron phosphate ($LiFePO_4$) was used as a positive electrode active material, and polyvinylidene fluoride (PVDF) was used as a binder. Lithium iron phosphate, graphene oxide, and polyvinylidene fluoride were mixed at a weight ratio of 94.2:0.8:5.0. Then, N-methyl pyrrolidone (NMP) was added as a dispersion medium to adjust the viscosity, and mixing was performed. Thus, the positive electrode slurry was formed.

The positive electrode slurry formed by the above method was applied to a positive electrode current collector (20-µm-thick aluminum) using a micro bar coater.

Subsequently, the slurry provided on the current collector was dried in a drying chamber of the coater. The drying was performed at 65° C. in an air atmosphere for 15 minutes, and then performed at 75° C. in an air atmosphere for 15 minutes.

Subsequently, graphene oxide was reduced by reaction in a solvent containing a reducer. The reduction treatment was performed at 60° C. for one hour. Ascorbic acid was used as the reducer. As the solvent, NMP was used. The concentration of the reducer was 13.5 g/L.

After that, cleaning with ethanol was performed, and drying was performed at 170° C. for 10 hours. The drying was performed in a vacuum atmosphere. Note that this step also serves as thermal reduction of graphene oxide.

Subsequently, the positive electrode active material layer was pressed by a roll press method so as to be consolidated.

A positive electrode A used for a secondary battery 1 was formed in the above manner.

[Formation of Negative Electrode]

A negative electrode slurry was formed with the use of a negative electrode active material, a conductive additive, a binder, and a dispersion medium. As the negative electrode active material, artificial graphite (MCMB) with a grain diameter of 10 μm was used. As the conductive additive, vapor-grown carbon fiber VGCF (registered trademark)-H was used. As the binder, sodium carboxymethyl cellulose (CMC-Na) and styrene butadiene rubber (SBR) were used. Water was used as the dispersion medium of the slurry. The negative electrode slurry was obtained in such a manner that the artificial graphite, VGCF (registered trademark)-H, CMC-Na, and SBR were mixed in water so that the weight ratio thereof was 96:1:1:2.

The negative electrode slurry formed by the above method was applied to a negative electrode current collector (18-μm-thick rolled copper foil) using a micro bar coater.

Subsequently, the slurry applied to the current collector was dried in a drying chamber of the coater. The drying was performed at 50° C. in an air atmosphere for 120 seconds and further performed at 80° C. in an air atmosphere for 120 seconds.

A negative electrode A used for the secondary battery 1 was formed in the above manner.

[Electrolyte Solution]

For the electrolyte solution, EC and DEC were mixed at a volume ratio of 1:1 so as to be a solvent, and LiTFSA as lithium salt was dissolved at a concentration of 1 mol/L. Then, 1 wt % of VC was added as an additive, and the obtained solution was used as an electrolyte solution A.

[Assembly of Secondary Battery and Aging Step]

A laminated secondary battery was fabricated using the formed positive electrode A, the formed negative electrode A, and the formed electrolyte solution A. An aluminum film covered with a heat sealing resin was used as the exterior body. For the separator, 25-μm-thick polypropylene (PP) was used. Note that the secondary battery was fabricated so that the proportion of positive electrode capacity to negative electrode capacity was in a range of greater than or equal to 49% and less than or equal to 51%. That is, the negative electrode capacity was approximately twice the positive electrode capacity.

Next, the fabricated secondary battery was subjected to aging. First, the secondary battery was charged to 3.2 V at a rate of 0.01 C at 25° C., and then a gas generated in the secondary battery was released outside the exterior body in a glove box. After that, the battery was resealed and then charged at 25° C. The charging was performed by CCCV (Constant Current Constant Voltage), specifically, in such a manner that a voltage was applied at a constant current of 0.1 C until the voltage increased and reached 4.0 V and then a constant voltage of 4.0 V was maintained until the current value reached 0.01 C. After that, the battery was kept at 40° C. for 24 hours, and further kept at 80° C. for 48 hours as a high-temperature annealing step. Then, the battery was discharged at 25° C. with the lower limit set to 2 V. After that, the battery was charged and discharged at a rate of 0.2 C three times with a voltage ranging from 2.0 V to 4.0 V at 25° C.

Through the above steps, the lithium-ion secondary battery of one embodiment of the present invention was fabricated. Note that the secondary battery was referred to as the secondary battery 1 and a plurality of secondary batteries were fabricated by changing only temperature of the high-temperature annealing step. A secondary battery fabricated by performing the high-temperature annealing step at 90° C. for 48 hours was a secondary battery 2 and a secondary battery fabricated by performing the high-temperature annealing step at 100° C. for 48 hours was a secondary battery 3. Furthermore, for comparison, a secondary battery was fabricated by performing the high-temperature annealing step at 60° C. for 48 hours as a comparative secondary battery 1, a secondary battery was fabricated by performing the high-temperature annealing step at 110° C. for 48 hours as a comparative secondary battery 2, and a secondary battery was fabricated by performing the high-temperature annealing step at 120° C. for 48 hours as a comparative secondary battery 3.

[Charge-Discharge Cycle Test]

Figure 24:
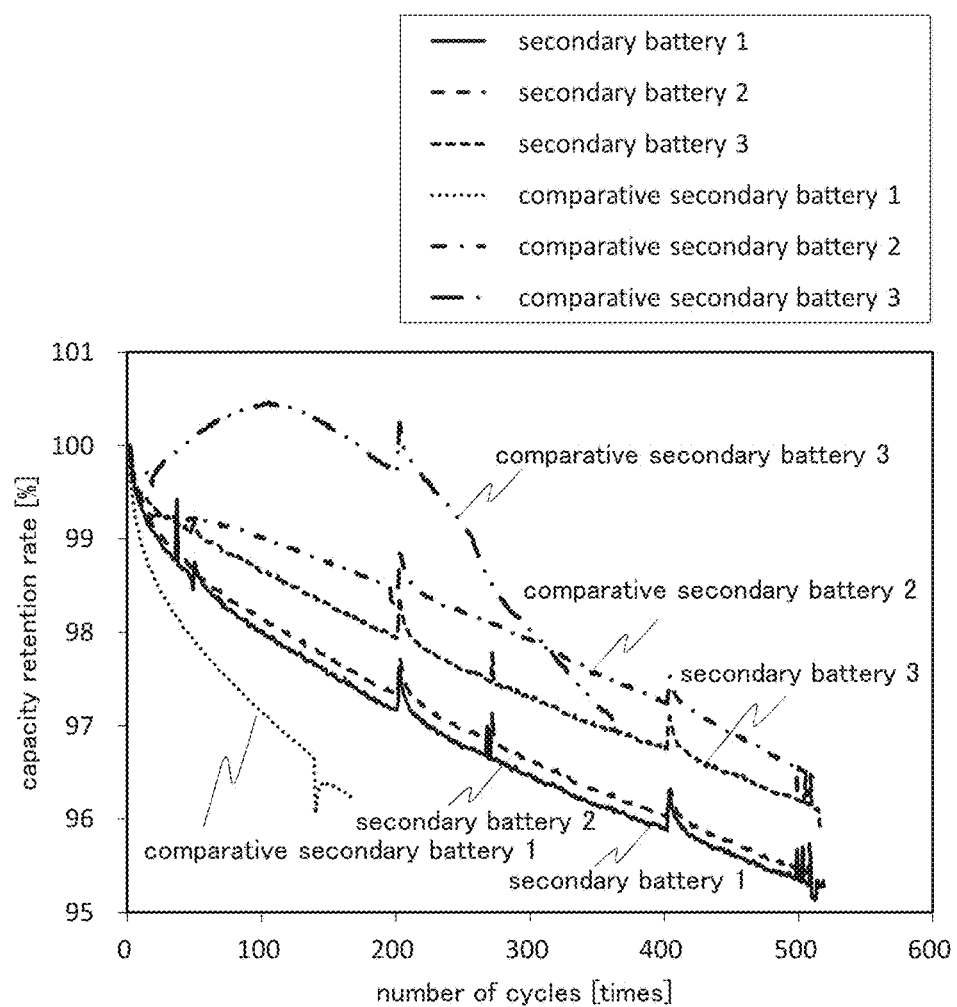
FIG. 24 shows changes of the capacity retention rates of secondary batteries.
Figure 25A:
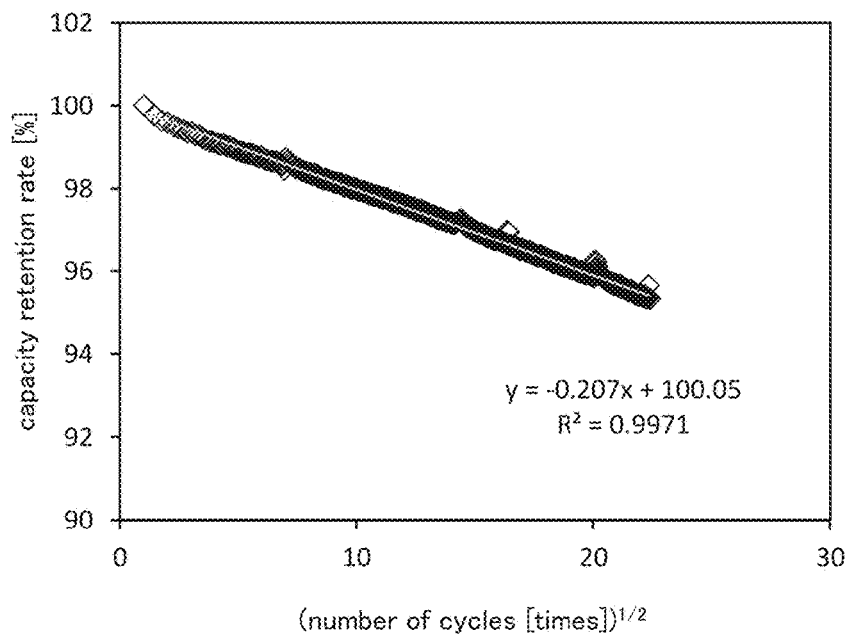
FIGS. 25A and 25B each show a relationship between the capacity retention rate of a secondary battery (%) and the square root of the number of cycles.
Figure 25B:
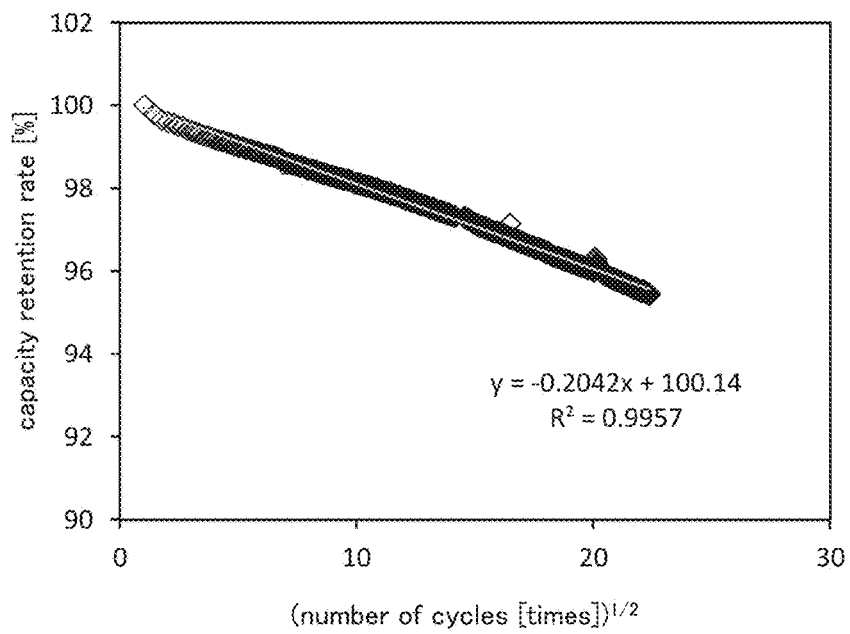
Figure 26A:
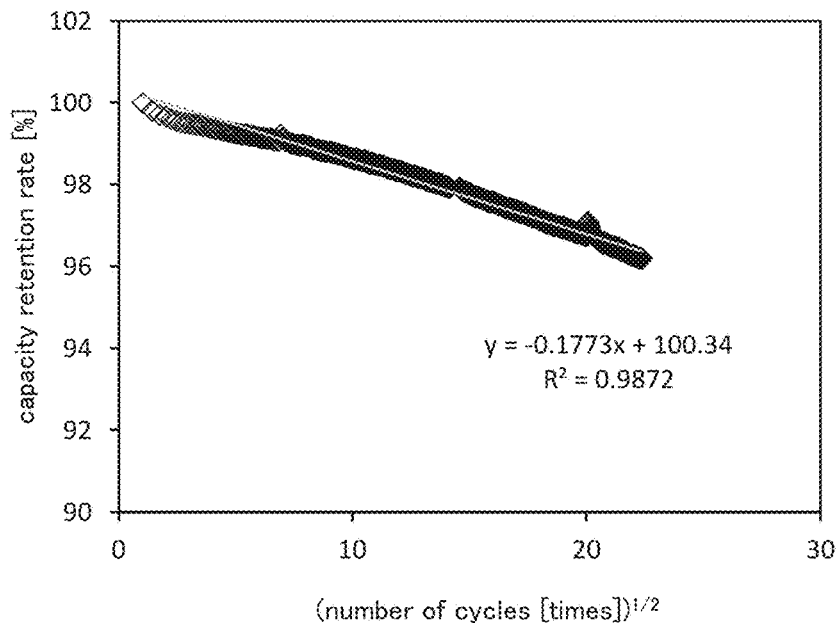
FIGS. 26A and 26B each show a relationship between the capacity retention rate of a secondary battery (%) and the square root of the number of cycles.
Figure 26B:
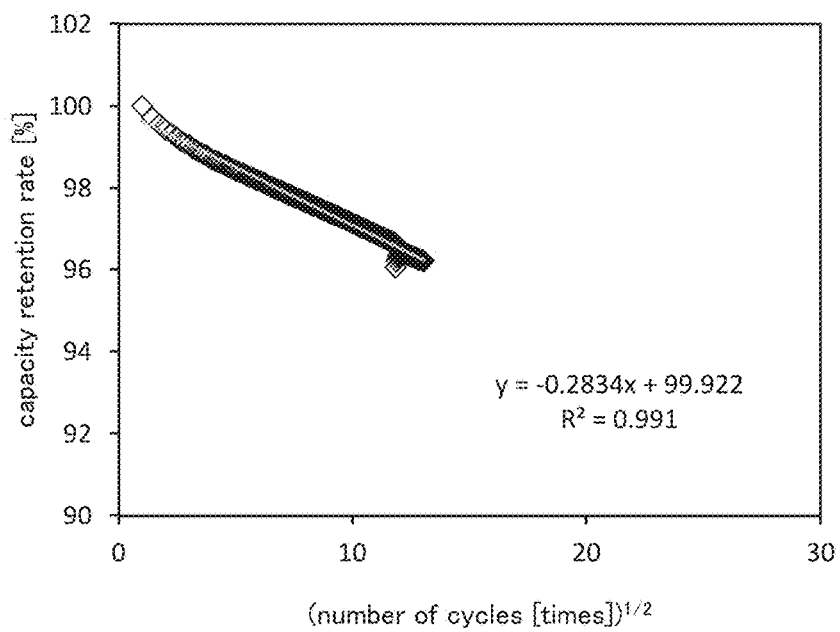

Next, the fabricated secondary batteries 1 to 3 and the fabricated comparative secondary batteries 1 to 3 were subjected to a charge-discharge cycle test. The test was performed at 60° C. at charging and discharging rates of 0.5 C. FIG. 24 shows changes in the capacity retention rates of the fabricated secondary batteries 1 to 3 and the fabricated comparative secondary batteries 1 to 3 in the case of repeating charging and discharging. Note that the lateral axis represents the number of cycles (times) and the vertical axis represents the capacity retention rate (%) of the secondary battery that shows the proportion of the discharge capacity with respect to the discharge capacity in the first cycle. As the capacity retention rate becomes higher, deterioration is reduced and the secondary battery can be used for a long time with a capacity close to the initial capacity.

In the comparative secondary batteries 2 and 3, deterioration of the capacity retention rate proceeded at an accelerated pace as compared to the other secondary batteries. This is probably because any of the components of the secondary batteries could not withstand the above annealing temperatures. Therefore, annealing is preferably performed at a temperature lower than or equal to 100° C.

As shown in FIG. 24, a decrease in capacity retention rate with repeated cycle is large in the comparative secondary batteries 1 to 3, whereas it is relatively small in the secondary batteries 1 to 3 and the capacity thereof is kept relatively high after some cycles. That is, the secondary batteries 1 to 3 have favorable cycle characteristics compared with the comparative secondary batteries 1 to 3.

Furthermore, as for the cycle characteristics (changes in the capacity retention rates) in FIG. 24, graphs were produced in which the vertical axis represents the capacity retention rate (%) and the lateral axis represents the square root of the number of cycles (times) for detailed examination of ease of deterioration of each secondary battery. FIGS. 25A and 25B, FIGS. 26A and 26B, and FIGS. 32A and 32B are graphs of the secondary batteries 1 to 3 and the comparative secondary batteries 1 to 3. As shown in the graphs, each secondary battery deteriorates proportional to the square root of the number of cycles. Data in each graph can be approximated by a straight line, and as the negative slope of the line becomes steeper, the secondary battery becomes more likely to deteriorate. The slopes of approximate lines of the data in the graphs are shown in Table 1.

Note that, in the comparative secondary batteries 2 and 3, deterioration of the capacity retention rate proceeded at an accelerated pace as described above. The deterioration is not proportional to the square root of the number of cycles (times) and cannot be approximated by a straight line; therefore, it is noted in Table 1 that the slopes of approximate lines of the data of the comparative secondary batteries 2 and 3 cannot be calculated.

TABLE 1

| | Annealing temperature [° C.] | Slope of approximate line [%/times$^{1/2}$] |
|---|---|---|
| Comparative secondary battery 1 | 60 | −0.283 |
| Secondary battery 1 | 80 | −0.207 |
| Secondary battery 2 | 90 | −0.204 |
| Secondary battery 3 | 100 | −0.177 |
| Comparative secondary battery 2 | 110 | cannot be calculated |
| Comparative secondary battery 3 | 120 | cannot be calculated |

As shown in Table 1, the downward slopes of the approximate lines of the lithium-ion secondary batteries of one embodiment of the present invention are gentle and the approximate line of the comparative battery 1 is steep. The deterioration proceeds at a rate of the square of the slope, so that the reduction in capacity is smaller in the lithium-ion secondary batteries 1 to 3 of one embodiment of the present invention than in the comparative secondary battery 1. That is, when annealing in the aging step is performed at a temperature higher than or equal to 80° C. in a step for fabricating the secondary battery, a secondary battery with less deterioration can be fabricated.

[Analysis of Coating Film]

Next, an XPS analysis was performed on a film formed on a surface of the negative electrode active material. First, the conditions of the XPS analysis will be described. The apparatus used for the XPS analysis was Quantera SXM manufactured by PHYSICAL ELECTRONICS, INC. Monochromatic Al Kα ray (1486.6 eV) was used for an X-ray source. A detection area was set to 100 μmφ and an extraction angle was set to 45°. Thus, the detection depth might be approximately 4 to 5 nm.

Measurement objects were surfaces of negative electrodes extracted from disassembled secondary batteries fabricated using the fabricating methods in this example. Negative electrodes extracted from secondary batteries fabricated by methods similar to those for the secondary batteries 1 to 3 were Samples 1 to 3, respectively, and negative electrodes extracted from secondary batteries fabricated by methods similar to those for the comparative secondary batteries 1 to 3 were Comparative Samples 1 to 3, respectively.

A peak of each element shifts in a photoelectron energy spectrum, which is obtained by XPS analysis, depending on the chemical state of the element. Therefore, data of the bonding state of each element can be obtained by analyzing a waveform of the spectrum. For example, the existing proportion of Li sorted by the state can be calculated by analyzing a coating film on the surface of each sample with a focus on Li.

Figure 27:
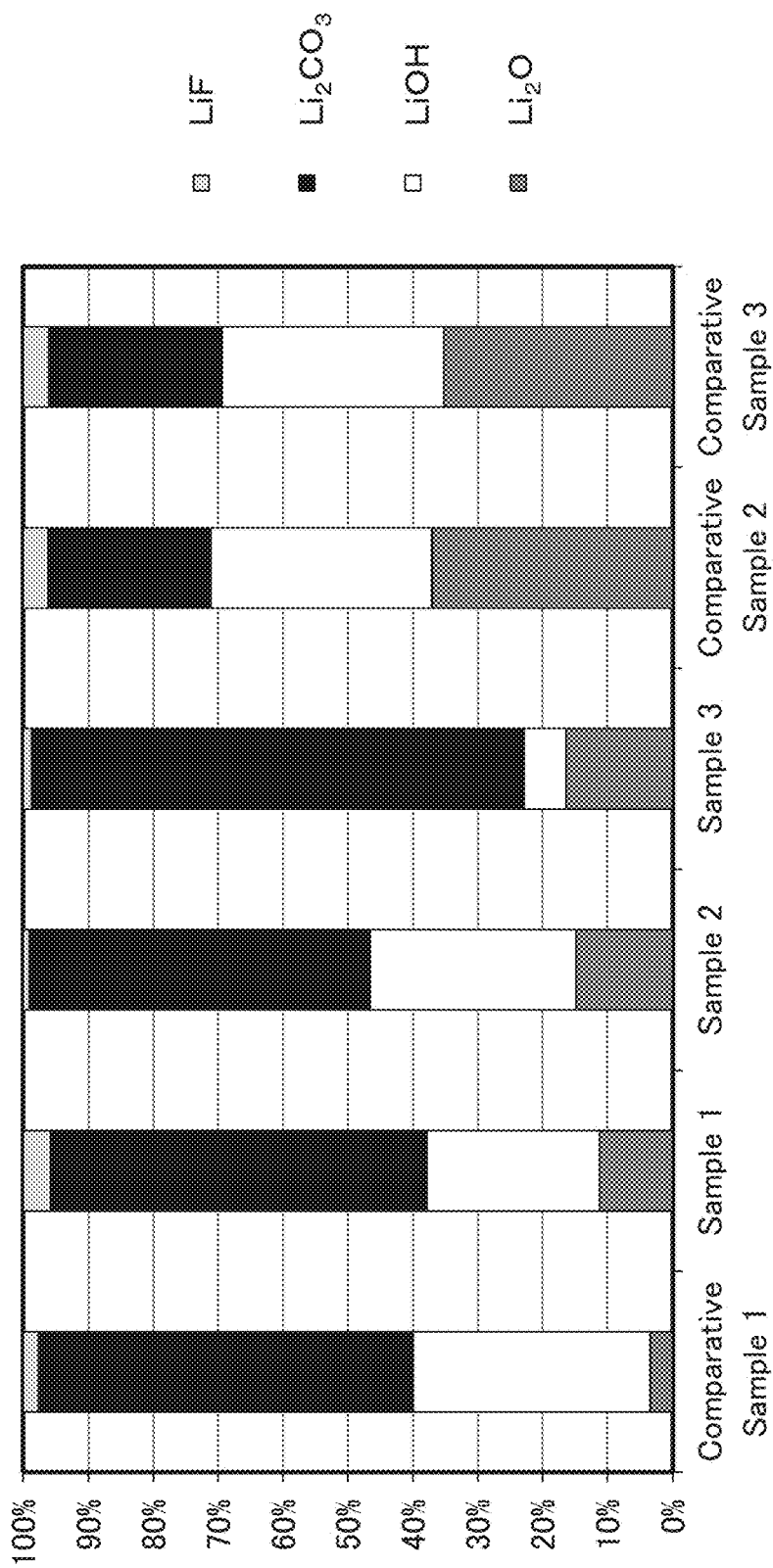
FIG. 27 shows compositions of coating films on surfaces of negative electrodes.

In the XPS analysis, C, O, and F were detected from the coating film on the surface of each sample and the energy loss peak of Li as a metal state was not detected. Thus, Li in the coating film of each sample was divided into $Li_2O$, LiOH, $Li_2CO_3$, and LiF. FIG. 27 and Table 2 show the existing proportion of Li sorted by the state in the coating film of each sample obtained from the results of a series of the XPS analyses. As understandable from FIG. 27, the coating films in the lithium-ion secondary batteries of one embodiment of the present invention include a relatively large amount of $Li_2O$ and the coating film of the Comparative Sample 1 includes relatively less $Li_2O$. To suppress deterioration of the lithium-ion secondary battery, the proportion of $Li_2O$ in the coating film is preferably greater than or equal to 4% and less than or equal to 20%, further preferably greater than or equal to 10% and less than or equal to 18%, still further preferably greater than or equal to 12% and less than or equal to 16%.

TABLE 2

| | Annealing temperature [° C.] | Existing proportion of Li sorted by the state [%] | | | |
|---|---|---|---|---|---|
| | | $Li_2O$ | LiOH | $Li_2CO_3$ | LiF |
| Comparative secondary battery 1 | 60 | 3.5 | 36.5 | 57.7 | 2.3 |
| Secondary battery 1 | 80 | 11.2 | 26.6 | 58.0 | 4.2 |
| Secondary battery 2 | 90 | 14.9 | 31.8 | 52.4 | 0.9 |
| Secondary battery 3 | 100 | 16.4 | 6.5 | 75.8 | 1.3 |
| Comparative secondary battery 2 | 110 | 37.1 | 34.0 | 25.1 | 3.8 |
| Comparative secondary battery 3 | 120 | 35.2 | 34.2 | 26.6 | 4.0 |

Accordingly, a negative electrode coating film of a secondary battery including LiTFSA and vinylene carbonate (VC) in the electrolyte solution changes in quality in the high-temperature annealing process in the manufacturing process of the secondary battery. This example suggests that a change in the quality of the coating film contributes to the suppression of a decrease in capacity retention rate.

This application is based on Japanese Patent Application serial no. 2015-222748 filed with Japan Patent Office on Nov. 13, 2015, the entire contents of which are hereby incorporated by reference.

What is claimed is:
1. A lithium-ion secondary battery comprising:
   a positive electrode;
   a negative electrode; and
   an electrolyte solution,
   wherein the negative electrode comprises a negative electrode active material layer,
   wherein the electrolyte solution comprises at least one of lithium bis(trifluoromethanesulfonyl)amide and lithium bis(fluorosulfonyl)amide and comprises vinylene carbonate,
   wherein a coating film is on a surface of the negative electrode active material layer,
   wherein the coating film comprises lithium oxide, lithium hydroxide, lithium carbonate, and lithium fluoride, and
   wherein a proportion of lithium oxide in the coating film is greater than or equal to 4% and less than or equal to 20%.

2. The lithium-ion secondary battery according to claim 1,
wherein the negative electrode further comprises a negative electrode current collector,
wherein the negative electrode current collector comprises copper, and
wherein the negative electrode active material layer comprises graphite particles.

3. The lithium-ion secondary battery according to claim 1, wherein the electrolyte solution further comprises ethylene carbonate and diethyl carbonate.

4. The lithium-ion secondary battery according to claim 1,
wherein a capacity retention rate of the lithium-ion secondary battery as a function of the square root of the number of cycles can be represented as a straight line having a slope less than or equal to −0.21, and
wherein the lithium-ion secondary battery has been submitted to an annealing performed at a temperature higher than or equal to 60° C.

5. An electronic device comprising:
the lithium-ion secondary battery according to claim 1;
a switch; and
a display portion.

6. A lithium-ion secondary battery comprising:
a positive electrode;
a negative electrode; and
an electrolyte solution,
wherein the positive electrode comprises a positive electrode current collector and a positive electrode active material layer,
wherein the positive electrode current collector comprises aluminum,
wherein the positive electrode active material layer comprises a graphene compound or lithium iron phosphate,
wherein the negative electrode comprises a negative electrode active material layer,
wherein the electrolyte solution comprises at least one of lithium bis(trifluoromethanesulfonyl)amide and lithium bis(fluorosulfonyl)amide and comprises vinylene carbonate,
wherein a coating film is on a surface of the negative electrode active material layer,
wherein the coating film comprises lithium oxide, lithium hydroxide, lithium carbonate, and lithium fluoride, and
wherein a proportion of lithium oxide in the coating film is greater than or equal to 4% and less than or equal to 20%.

7. The lithium-ion secondary battery according to claim 6,
wherein the negative electrode further comprises a negative electrode current collector,
wherein the negative electrode current collector comprises copper, and
wherein the negative electrode active material layer comprises graphite particles.

8. The lithium-ion secondary battery according to claim 6, wherein the electrolyte solution further comprises ethylene carbonate and diethyl carbonate.

9. The lithium-ion secondary battery according to claim 6,
wherein a capacity retention rate of the lithium-ion secondary battery as a function of the square root of the number of cycles can be represented as a straight line having a slope less than or equal to −0.21, and
wherein the lithium-ion secondary battery has been submitted to an annealing performed at a temperature higher than or equal to 60° C.

10. An electronic device comprising:
the lithium-ion secondary battery according to claim 6;
a switch; and
a display portion.

11. A fabricating method of a lithium-ion secondary battery comprising:
a first step of enclosing a negative electrode comprising a negative electrode active material layer, a positive electrode, and an electrolyte solution in an exterior body; and
a second step of annealing the exterior body enclosing the positive electrode, the negative electrode, and the electrolyte solution for 24 hours or longer after the first step,
wherein the annealing in the second step is performed at a temperature higher than or equal to 80° C. and lower than or equal to 100° C.,
wherein the electrolyte solution comprises at least one of lithium bis(trifluoromethanesulfonyl)amide and lithium bis(fluorosulfonyl)amide and comprises vinylene carbonate,
wherein the positive electrode comprises a positive electrode current collector comprising aluminum,
wherein the positive electrode comprises a positive electrode active material layer comprising a graphene compound, and
wherein a coating film is on a surface of the negative electrode active material layer.

12. The fabricating method of a lithium-ion secondary battery, according to claim 11,
wherein the negative electrode comprises a negative electrode current collector comprising copper, and
wherein the negative electrode active material layer comprises graphite particles.

13. The fabricating method of a lithium-ion secondary battery, according to claim 11,
wherein the coating film changes in quality in the second step.

14. The fabricating method of a lithium-ion secondary battery, according to claim 11, further comprising a third step of connecting the positive electrode and the negative electrode to a device and performing charging and discharging,
wherein the third step is performed between the first step and the second step, and
wherein the coating film is formed in the third step.

15. The fabricating method of a lithium-ion secondary battery, according to claim 11, wherein the coating film comprises lithium oxide, lithium hydroxide, lithium carbonate, and lithium fluoride.

* * * * *